(12) United States Patent
Sasagawa et al.

(10) Patent No.: US 10,050,062 B2
(45) Date of Patent: Aug. 14, 2018

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Shinya Sasagawa, Kanagawa (JP); Hidekazu Miyairi, Kanagawa (JP); Shunpei Yamazaki, Tokyo (JP); Motomu Kurata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 11 days.

(21) Appl. No.: 15/234,155

(22) Filed: Aug. 11, 2016

(65) Prior Publication Data
US 2016/0351589 A1    Dec. 1, 2016

Related U.S. Application Data

(62) Division of application No. 14/488,936, filed on Sep. 17, 2014, now Pat. No. 9,419,018.

(30) Foreign Application Priority Data

May 30, 2014 (JP) .................................. 2014-112744

(51) Int. Cl.
*H01L 27/12* (2006.01)
*H01L 29/786* (2006.01)
(Continued)

(52) U.S. Cl.
CPC ........ *H01L 27/124* (2013.01); *H01L 27/0922* (2013.01); *H01L 27/1052* (2013.01);
(Continued)

(58) Field of Classification Search
CPC ...................... H01L 27/0922; H01L 29/78648
See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

CN    102687400 A    9/2012
CN    103003934 A    3/2013
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Moazzam Hossain
*Assistant Examiner* — Farun Lu
(74) *Attorney, Agent, or Firm* — Fish & Richardson P.C.

(57) ABSTRACT

A semiconductor device that occupies a small area and has a high degree of integration is provided. The semiconductor device includes a first insulating layer, a conductive layer, and a second insulating layer. The conductive layer is between the first insulating layer and the second insulating layer. The first insulating layer, the conductive layer, and the second insulating layer overlap with each other in a region. A contact plug penetrates the first insulating layer, the conductive layer, and the second insulating layer. In a depth direction from the second insulating layer to the first insulating layer, a diameter of the contact plug changes to a smaller value at an interface between the second insulating layer and the conductive layer.

26 Claims, 50 Drawing Sheets

(51) Int. Cl.
  *H01L 27/092* (2006.01)
  *H01L 27/105* (2006.01)
  *H01L 21/822* (2006.01)
  *H01L 27/112* (2006.01)

(52) U.S. Cl.
  CPC ........ *H01L 27/127* (2013.01); *H01L 27/1207* (2013.01); *H01L 27/1214* (2013.01); *H01L 27/1218* (2013.01); *H01L 27/1225* (2013.01); *H01L 27/1251* (2013.01); *H01L 27/1259* (2013.01); *H01L 29/7869* (2013.01); *H01L 29/78618* (2013.01); *H01L 29/78648* (2013.01); *H01L 29/78651* (2013.01); *H01L 29/78696* (2013.01); *H01L 21/8221* (2013.01); *H01L 27/1128* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,183,630 B2 | 5/2012 | Batude et al. |
| 8,207,756 B2 | 6/2012 | Shionoiri et al. |
| 8,461,586 B2 | 6/2013 | Yamazaki et al. |
| 8,570,070 B2 | 10/2013 | Shionoiri et al. |
| 8,847,326 B2 | 9/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0207089 A1 | 10/2004 | Masuda |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0237875 A1 | 10/2008 | Yamazaki et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0050941 A1* | 2/2009 | Yamazaki ........ H01L 21/76254 257/255 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0294822 A1 | 12/2009 | Batude et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0089417 A1 | 4/2011 | Yamazaki et al. |
| 2011/0101351 A1 | 5/2011 | Yamazaki |
| 2011/0102018 A1 | 5/2011 | Shionoiri et al. |
| 2011/0114945 A1 | 5/2011 | Yamazaki et al. |
| 2011/0176355 A1 | 7/2011 | Furutani et al. |
| 2011/0176357 A1* | 7/2011 | Koyama ............... G11C 11/412 365/149 |
| 2012/0012837 A1 | 1/2012 | Yamazaki et al. |
| 2012/0032730 A1 | 2/2012 | Koyama |
| 2012/0061841 A1* | 3/2012 | Yamaguchi ......... H01L 21/8221 257/761 |
| 2012/0112257 A1* | 5/2012 | Kato .................. H01L 27/0688 257/296 |
| 2013/0069132 A1 | 3/2013 | Atsumi et al. |
| 2013/0147518 A1 | 6/2013 | Shionoiri et al. |
| 2014/0326992 A1 | 11/2014 | Hondo et al. |
| 2014/0332800 A1 | 11/2014 | Hanaoka |
| 2015/0348909 A1 | 12/2015 | Yamazaki et al. |
| 2015/0349127 A1 | 12/2015 | Kurata et al. |

FOREIGN PATENT DOCUMENTS

| | | |
|---|---|---|
| CN | 103022012 A | 4/2013 |
| EP | 1737044 | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |

(56) References Cited

FOREIGN PATENT DOCUMENTS

| | | |
|---|---|---|
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-091423 A | 3/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-302530 A | 12/2009 |
| JP | 2011-120222 A | 6/2011 |
| JP | 2012-039101 A | 2/2012 |
| JP | 2012-257187 A | 12/2012 |
| JP | 2013-102133 A | 5/2013 |
| JP | 2013-207771 A | 10/2013 |
| KR | 2012-0112412 A | 10/2012 |
| KR | 2013-0031794 A | 3/2013 |
| KR | 2013-0043162 A | 4/2013 |
| TW | 201134099 | 10/2011 |
| TW | 201205781 | 2/2012 |
| TW | 201330231 | 7/2013 |
| WO | WO-2004/114391 | 12/2004 |
| WO | WO-2011/052383 | 5/2011 |
| WO | WO-2012/008304 | 1/2012 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1797-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YBFE2O4, and YB2FE3O7 Types of Structures for Compounds in the In2O3 and SC2O3—A2O3—BO Systems [A; Fe; Ga; or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m =7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B. (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 IN. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996. vol. 68, No. 25, pp. 3650-3652.
Sakata.J et al., "Development of 4.0-IN. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
International Search Report (Application No. PCT/JP2014/074164) dated Dec. 16, 2014.
Written Opinion (Application No. PCT/JP2014/074164) dated Dec. 16, 2014.

\* cited by examiner

H1　120　173　107　H2

I1　120　173　108　I2

J1　120　173　109　J2

K1　120　173　110　K2

L1　120　173　111　L2

M1　120　173　112　M2

FIG. 44A
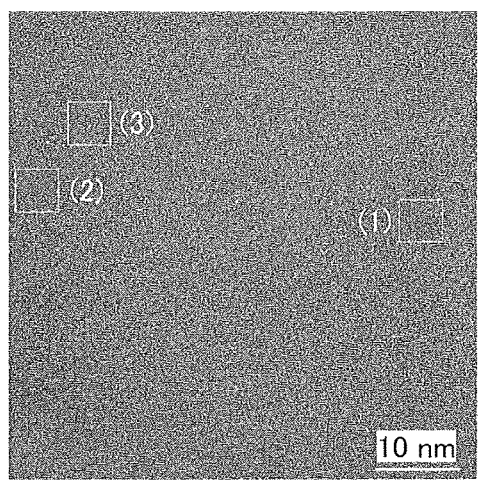
FIG. 44B     FIG. 44C     FIG. 44D
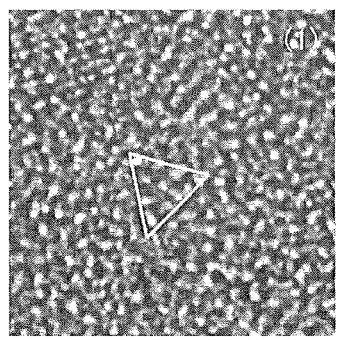 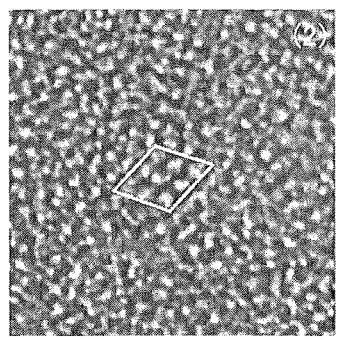 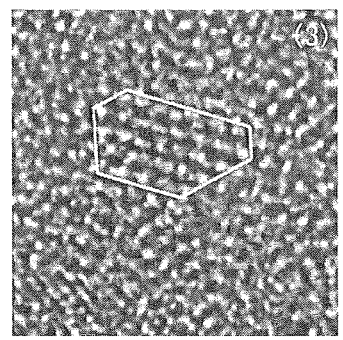

out-of-plane method
CAAC-OS signal derived from substrate in-plane method $\phi$ scan
CAAC-OS in-plane method $\phi$ scan
single crystal OS

SEMICONDUCTOR DEVICE AND METHOD FOR MANUFACTURING THE SAME

CROSS-REFERENCE TO RELATED APPLICATIONS

This application is a divisional of U.S. application Ser. No. 14/488,936, filed Sep. 17, 2014, now allowed, which claims the benefit of a foreign priority application filed in Japan as Serial No. 2014-112744 on May 30, 2014, both of which are incorporated by reference.

TECHNICAL FIELD

One embodiment of the present invention relates to a semiconductor device including an oxide semiconductor.

Note that one embodiment of the present invention is not limited to the above technical field. The technical field of one embodiment of the present invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique by which transistors are formed using semiconductor thin films formed over a substrate having an insulating surface has been attracting attention. The transistor is used in a wide range of electronic devices such as an integrated circuit (IC) or an image display device (also simply referred to as a display device). As semiconductor thin films that can be used for the transistors, silicon-based semiconductor materials have been widely known, but oxide semiconductors have been attracting attention as alternative materials.

It is known that a transistor including an oxide semiconductor has an extremely low leakage current in an off state. For example, a low-power-consumption CPU utilizing such a low leakage current of a transistor including an oxide semiconductor is disclosed in Patent Document 1.

REFERENCE

Patent Document

[Patent Document 1] Japanese Published Patent Application No. 2012-257187

DISCLOSURE OF INVENTION

An object of one embodiment of the present invention is to provide a semiconductor device that occupies a small area. Another object is to provide a highly integrated semiconductor device. Another object is to provide a semiconductor device which can operate at high speed. Another object is to provide a semiconductor device with low power consumption. Another object is to provide a semiconductor device with high productivity. Another object is to provide a semiconductor device with high manufacturing yield. Another object is to provide a novel semiconductor device. Another object is to provide a manufacturing method of the semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to a semiconductor device including a transistor formed using an oxide semiconductor and a transistor formed using silicon.

One embodiment of the present invention is a semiconductor device including a first insulating layer, a conductive layer, a second insulating layer, and a contact plug. The conductive layer is between the first insulating layer and the second insulating layer. The first insulating layer, the conductive layer, and the second insulating layer overlap with each other in a region. The contact plug penetrates the first insulating layer, the conductive layer, and the second insulating layer. In a depth direction from the second insulating layer to the first insulating layer, a diameter of the contact plug changes to a smaller value at an interface between the second insulating layer and the conductive layer.

Another embodiment of the present invention is a semiconductor device including a first transistor, a second transistor, and a contact plug. The first transistor includes an active region in a silicon substrate. The second transistor includes an oxide semiconductor in an active layer. The first transistor and the second transistor overlap with each other in a region. A first insulating layer is between the first transistor and the second transistor. A second insulating layer is over the second transistor. One of a source electrode and a drain electrode of the first transistor is electrically connected to one of a source electrode and a drain electrode of the second transistor through the contact plug. The contact plug penetrates the first insulating layer, the one of the source electrode and the drain electrode of the second transistor, and the second insulating layer. In a depth direction from the second insulating layer to the first insulating layer, a diameter of the contact plug changes to a smaller value at an interface between the second insulating layer and the one of the source electrode and the drain electrode of the second transistor.

The first transistor and the second transistor can form a CMOS circuit.

The oxide semiconductor preferably contains In, Zn, and M (M is Al, Ti, Ga, Sn, Y, Zr, La, Ce, Nd, or Hf).

The contact plug can penetrate an oxide semiconductor layer of the second transistor.

Another embodiment of the present invention is a method for manufacturing a semiconductor device including the steps of forming a first insulating layer; forming a conductive film over the first insulating layer; selectively etching the conductive film using a first mask to form a conductive layer and an opening penetrating the conductive layer in a thickness direction; forming a second insulating layer covering the conductive layer and the opening; selectively etching the second insulating layer using a second mask to form a hole with a diameter larger than that of the opening, thereby exposing the opening; and selectively etching the first insulating layer using the conductive layer as a mask.

According to one embodiment of the present invention, a semiconductor device that occupies a small area can be provided. A highly integrated semiconductor device can be provided. A semiconductor device which can operate at high speed can be provided. A semiconductor device with low power consumption can be provided. A semiconductor device with high productivity can be provided. A semiconductor device with high manufacturing yield can be provided. A novel semiconductor device can be provided. A manufacturing method of the semiconductor device can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF DRAWINGS

FIGS. 44A to 44D are Cs-corrected high-resolution TEM images of a plane of a CAAC-OS.

BEST MODE FOR CARRYING OUT THE INVENTION

Figure 1A:
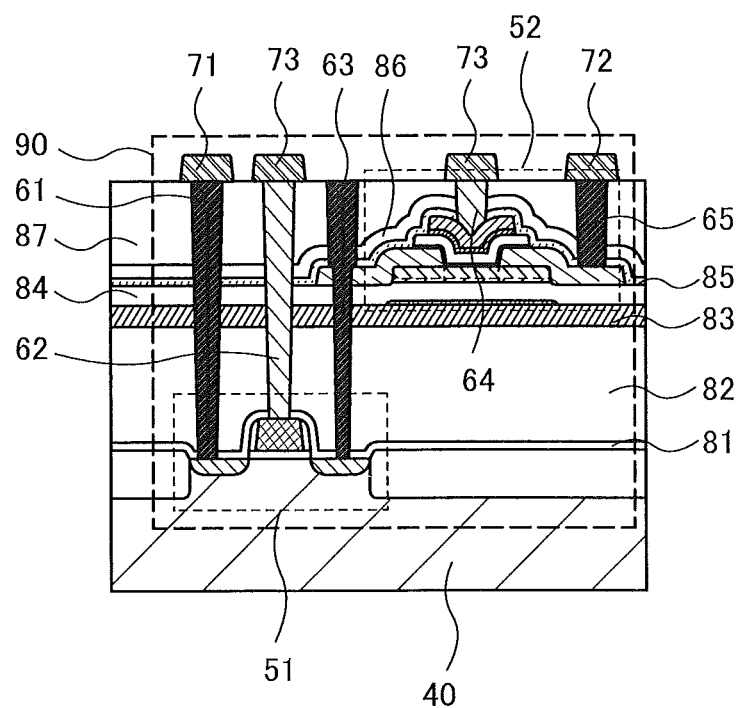
FIGS. 1A and 1B are a cross-sectional view and a circuit diagram illustrating a semiconductor device.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not construed as being limited to the description of the embodiments below. Note that in the structures of the present invention described below, the same portions or portions having similar functions are denoted by the same reference numerals in different drawings, and the description thereof is not repeated in some cases. It is also to be noted that the same components are denoted by different hatching patterns in different drawings, or the hatching patterns are omitted in some cases.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or texts, another connection relation is included in the drawings or the texts.

Here, X and Y each denote an object (e.g., a device, an element, a circuit, a wiring, an electrode, a terminal, a conductive film, or a layer).

For example, in the case where X and Y are directly connected, X and Y are connected without an element that enables electrical connection between X and Y (e.g., a switch, a transistor, a capacitor, an inductor, a resistor, a diode, a display element, a light-emitting element, or a load) interposed between X and Y.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and X and Y are electrically connected.

Note that in this specification and the like, an explicit description "X and Y are connected" means that X and Y are electrically connected (i.e., the case where X and Y are connected with another element or circuit provided therebetween), X and Y are functionally connected (i.e., the case where X and Y are functionally connected with another circuit provided therebetween), and X and Y are directly connected (i.e., the case where X and Y are connected without another element or circuit provided therebetween). That is, in this specification and the like, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that one embodiment of the present invention is not limited to these expressions which are just examples. Here, each of X, Y, Z1, and Z2 denotes an object (e.g., a device, an element, a circuit, a wiring, an electrode, a terminal, a conductive film, a layer, or the like).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that the terms "film" and "layer" can be interchanged with each other depending on the case or circumstances. For example, the term "conductive layer" can be changed into the teen "conductive film" in some cases. Also, the term "insulating film" can be changed into the term "insulating layer" in some cases.

Embodiment 1

In this embodiment, a semiconductor device of one embodiment of the present invention is described with reference to drawings.

Figure 1B:
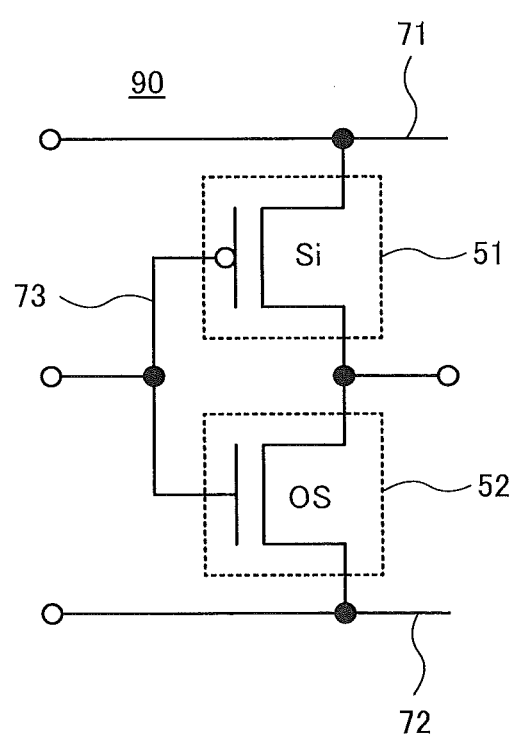

FIG. 1A is a cross-sectional view illustrating a structure of a semiconductor device of one embodiment of the present invention. The semiconductor device in FIG. 1A includes a transistor 51 including an active region in a silicon substrate 40 and a transistor 52 including an oxide semiconductor layer as an active layer. When the transistor 51 is a p-channel transistor and the transistor 52 is an n-channel transistor, a CMOS circuit can be formed. The transistors 51 and 52 in FIG. 1A form an inverter circuit 90 (see FIG. 1B).

The basic structure of the transistor 51 includes an active region where a channel is formed, a source region, a drain region, a gate insulating film, and a gate electrode. The basic structure of the transistor 52 includes an active layer where a channel is formed, a source electrode, a drain electrode, a gate insulating film, and a gate electrode. As shown in FIG. 1A, the above components of the transistor 51 and the above components of the transistor 52 partly overlap with each other, resulting in a reduction in the area occupied by the circuit.

Formation of the inverter circuit 90 does not require a process for forming an n-channel transistor including an active region in the silicon substrate 40; therefore, steps of forming a p-type well, an n-type impurity region, and the like can be omitted and the number of steps can be drastically reduced.

An insulating layer 81, an insulating layer 82, an insulating layer 83, and an insulating layer 84 are provided over the transistor 51. Here, the insulating layers 81 to 84 are collectively referred to as a first insulating layer for convenience in description.

The transistor 52 is provided over the first insulating layer, and an insulating layer 85, an insulating layer 86, and an insulating layer 87 are provided over the transistor 52. Here, the insulating layers 85 to 87 are collectively referred to as a second insulating layer for convenience in description.

Note that insulating layers included in the first insulating layer and the second insulating layer are not limited to the above ones. Part of the insulating layers may be omitted, or another insulating layer may be added.

One of the source region and the drain region of the transistor 51 is electrically connected to a contact plug 61 penetrating the first insulating layer and the second insulating layer. The contact plug 61 is electrically connected to a wiring 71 over the second insulating layer.

The gate electrode of the transistor 51 is electrically connected to a contact plug 62 penetrating the first insulating layer and the second insulating layer. The contact plug 62 is electrically connected to a wiring 73 over the second insulating layer.

The other of the source region and the drain region of the transistor 51 is electrically connected to a contact plug 63 penetrating the first insulating layer, one of the source electrode and the drain electrode of the transistor 52, and the second insulating layer. Here, the other of the source region and the drain region of the transistor 51 and the one of the source electrode and the drain electrode of the transistor 52 are electrically connected to each other through the contact plug 63.

The gate electrode of the transistor 52 is electrically connected to a contact plug 64 penetrating the second insulating layer. The contact plug 64 is electrically connected to the wiring 73 over the second insulating layer. That is, the gate electrode of the transistor 51 and the gate electrode of the transistor 52 are electrically connected to each other through the contact plug 62, the wiring 73, and the contact plug 64.

Note that in FIG. 1A, the contact plugs 62 and 64 are hatched differently from other contact plugs to show that their positions in the depth direction of the drawing are different from those of other contact plugs.

The other of the source electrode and the drain electrode of the transistor 52 is electrically connected to a contact plug 65 penetrating the second insulating layer. The contact plug 65 is electrically connected to a wiring 72 over the second insulating layer.

In the semiconductor device of one embodiment of the present invention, a contact plug is formed after formation of a plurality of transistors overlapping with each other in a region, and electrical connection between the plurality of transistors and connection between the contact plug and a wiring or the like are established. With such a structure, the process can be simplified. Moreover, since wiring connection can be freely performed after formation of the transistors, a semiconductor device with a different function can be formed by changing part of the process; thus, design cost and manufacturing cost can be reduced.

Here, a contact plug is formed in the following manner: first, a contact hole is faulted, and then a conductor is embedded in the contact hole by a chemical vapor deposition (CVD) method. In this process, it is preferable to form a contact hole with a high aspect ratio to reduce the area occupied by the circuit; however, it is difficult to form a contact hole with a high aspect ratio penetrating a plurality of layers.

Contact holes for providing the contact plugs 61 and 62 in FIG. 1A are relatively easy to form because they are formed by etching the first insulating layer and the second insulating layer. This is because, for example, an oxide insulating layer, a nitride insulating layer, and the like can be processed under the same etching conditions in many cases even though they are different kinds of layers.

On the other hand, formation of a contact hole for providing the contact plug 63 requires etching of the source electrode or the drain electrode of the transistor 52 (the source electrode or the drain electrode is typically a metal layer) as well as etching of the insulating layer. Since etching conditions differ between an insulating layer and a metal layer, switching of an etching gas or an etchant, for example, is required, leading to a substantial increase in the number of steps. Moreover, a defect might be caused by a deposit, plasma damage, over-etching, or the like in the etching step.

Therefore, in a method used in one embodiment of the present invention, to form a contact hole for providing the contact plug 63 without increasing the number of steps or causing a defect, an opening is formed in advance in one of the source electrode and the drain electrode of the transistor 52.

FIGS. 2A to 2D illustrate a process for forming the contact plug 63. Note that the transistor 51 and part of the insulating layers provided over the transistor 51 are not shown. In the drawings, cross-sectional views are on the left side and top views are on the right side.

Figure 2A:
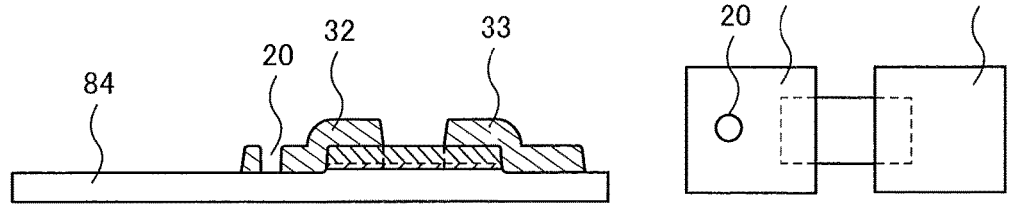
FIGS. 2A to 2D are cross-sectional views illustrating a method for forming a contact plug.

First, two layers of an oxide semiconductor layer with a three-layer structure are formed over the insulating layer 84, and a source electrode layer 32 and a drain electrode layer 33 are formed in contact with the oxide semiconductor layer (see FIG. 2A). Here, an opening 20 is provided in the source electrode layer 32. The opening 20 can be formed in the step of forming the source electrode layer 32 and the drain electrode layer 33 by patterning.

Figure 3A:
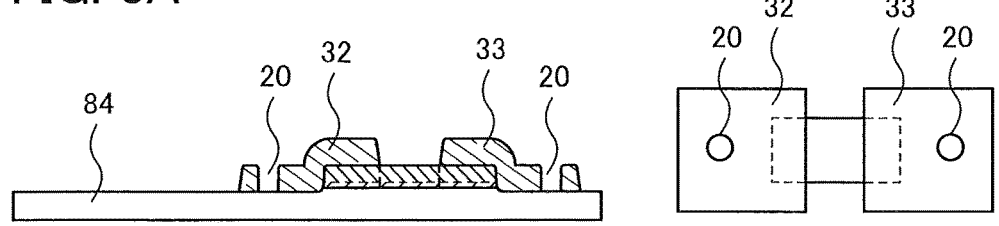
FIGS. 3A and 3B each illustrate an example of a method for forming a contact plug.

As shown in FIG. 3A, the opening 20 may be provided also in the drain electrode layer 33. In the case of not using the opening 20 provided in the drain electrode layer 33, the drain electrode layer 33 is connected to a contact plug or the like in a region not including the opening in a later step. Note that the terms "source" and "drain" are replaced with each other depending on the operation of the transistor; accordingly, the terms "source electrode layer 32" and "drain electrode layer 33" can be replaced with each other.

Next, the other one layer of the oxide semiconductor layer, a gate insulating film, and a gate electrode layer are formed; thus, the basic structure of the transistor 52 is completed. Then, the second insulating layer is provided over the transistor 52. At this stage, part of the second insulating layer is formed in the opening 20. Furthermore, a resist mask 35 for forming a plurality of contact holes is formed over the second insulating layer (see FIG. 2B).

Figure 2B:
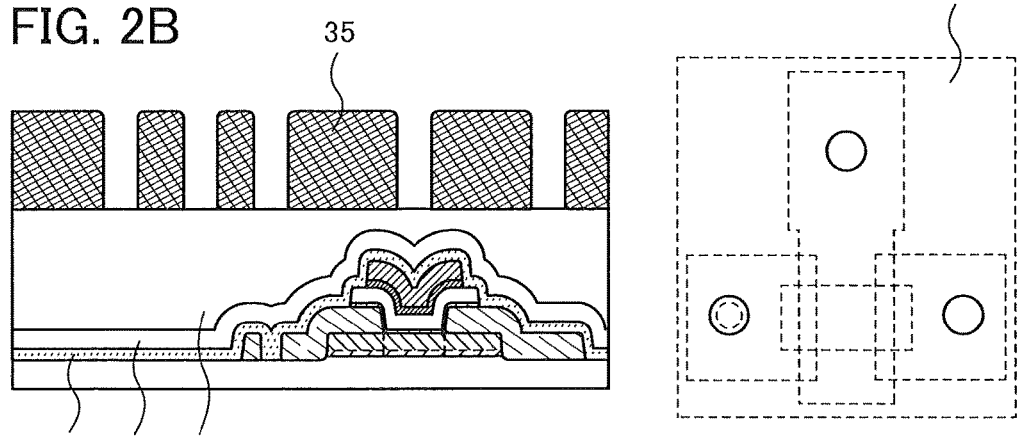
Figure 2C:
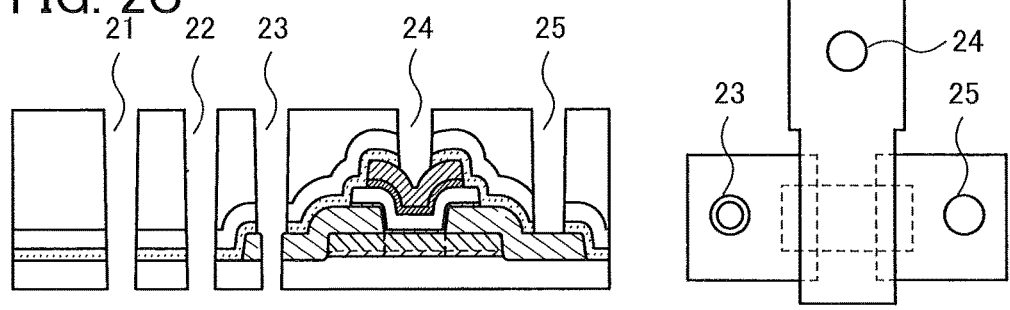

Then, an etching step is performed, whereby contact holes 21 to 25 are faulted (see FIG. 2C). Here, since the opening 20 is provided in the source electrode layer 32, it is possible to perform the etching step easily without changing the etching conditions from those for an insulating layer to those for a metal layer.

To prevent misalignment between the contact hole 23 and the opening 20 in the etching step, the diameter of the contact hole 23 in the second insulating layer is preferably made larger than the diameter of the opening 20. In that case, in the depth direction from the second insulating layer to the first insulating layer, the diameter of the contact hole 23 changes to a smaller value at the interface between the source electrode layer 32 of the transistor 52 and the second insulating layer.

Figure 3B:
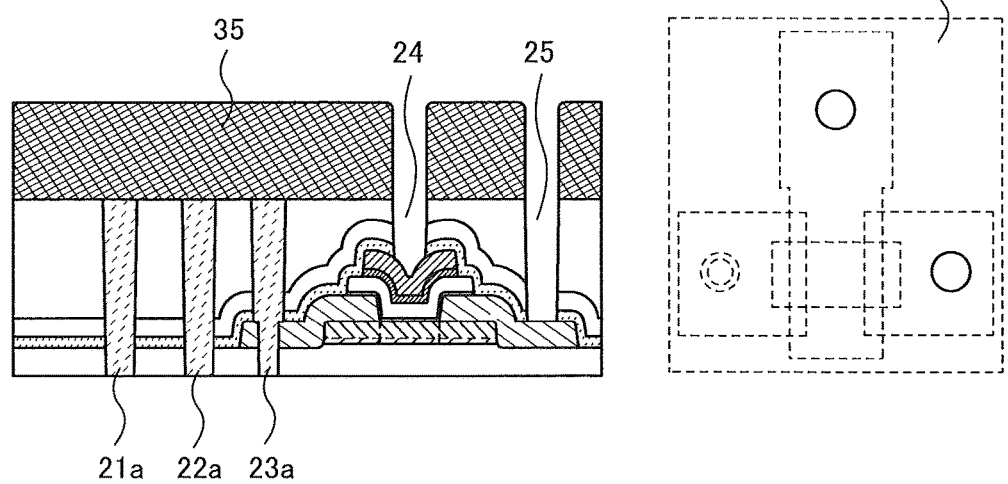

FIG. 2B illustrates an example of a resist mask for forming all the contact holes at the same time; however, it is also possible to sequentially form contact holes with different depths. For example, as shown in FIG. 3B, it is possible to form relatively deep contact holes first, temporarily fill the contact holes with an organic resin, and then form relatively shallow contact holes. It is also possible to form relatively shallow contact holes first and then form relatively deep contact holes.

Figure 2D:
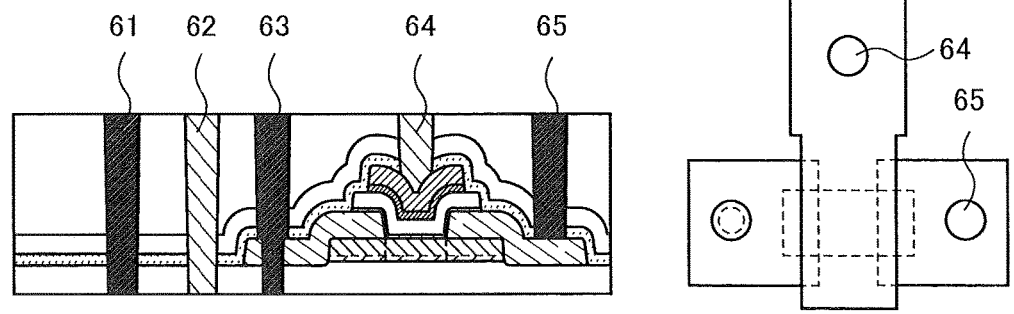

Then, the above contact holes are filled with a conductive layer, whereby the contact plugs 61 to 65 are formed (see FIG. 2D). The diameter of the contact plug 63 changes at the interface between the source electrode layer 32 of the transistor 52 and the second insulating layer in accordance with the shape of the contact hole 23.

Figure 40A:
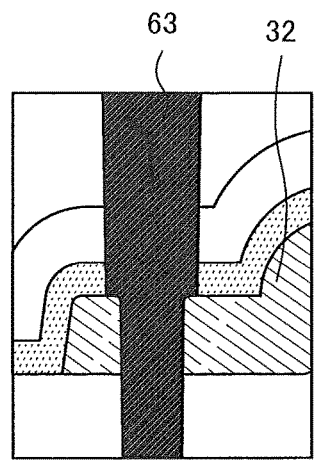
FIGS. 40A to 40F are enlarged cross-sectional views of semiconductor devices.

FIGS. 40A to 40F are enlarged views of a region in the vicinity of the interface between the source electrode layer 32 of the transistor 52 and the second insulating layer in FIG. 1A. FIG. 40A is an enlarged view of FIG. 2D; one embodiment of the present invention is not limited thereto. Adjusting etching conditions makes it possible to vary the shapes of the opening 20 and components around it.

Figure 40B:
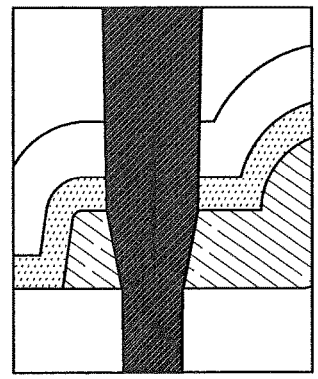
Figure 40C:
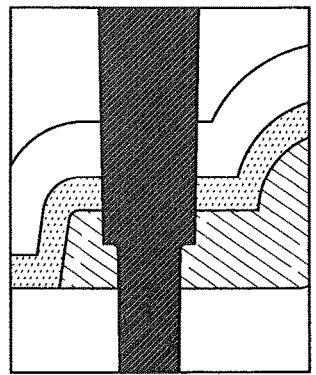
Figure 40D:
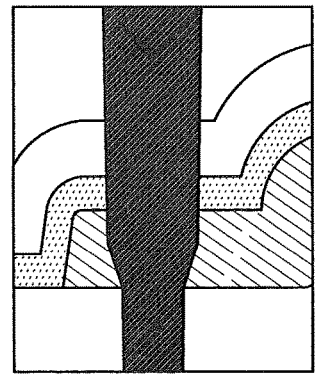
Figure 40E:
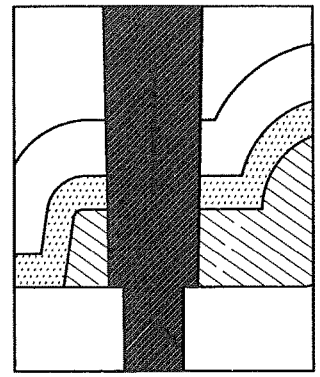
Figure 40F:
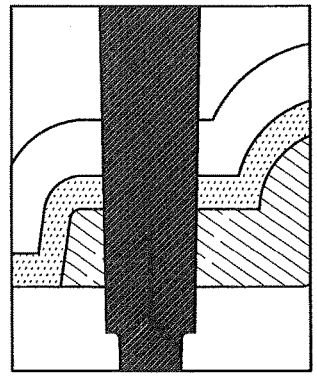

For example, as in FIG. 40B, an angle of a sidewall of the contact plug 63 in the opening 20 may be different from that of the sidewall of the contact plug 63 in the other portion. Alternatively, as in FIG. 40C, the diameter of the contact plug 63 may change in the source electrode layer 32. Alternatively, as in FIG. 40D, the angle of the sidewall of the contact plug 63 may change in the source electrode layer 32. Alternatively, as in FIG. 40E, the diameter of the contact plug 63 may change at the interface between the source electrode layer 32 and the first insulating layer. Alternatively, as in FIG. 40F, the diameter of the contact plug 63 may change in the first insulating layer.

Note that a sidewall of a contact plug has a slight taper angle; accordingly, it can be said that the diameter of a contact plug continuously changes in the depth direction. A feature of one embodiment of the present invention is that, regardless of this change in diameter, a contact plug has a region where the diameter significantly changes.

The transistor 52 used for a semiconductor device of one embodiment of the present invention may have a structure in which a source electrode and a drain electrode are formed over an oxide semiconductor layer and the source electrode and the drain electrode are not in contact with the insulating layer 84. In such a structure, the insulating layer 84 is not deprived of oxygen by a metal layer forming the source electrode and the drain electrode. Thus, the oxygen can be efficiently supplied to the oxide semiconductor layer, resulting in improved electrical characteristics and reliability of the transistor 52.

Figure 4:
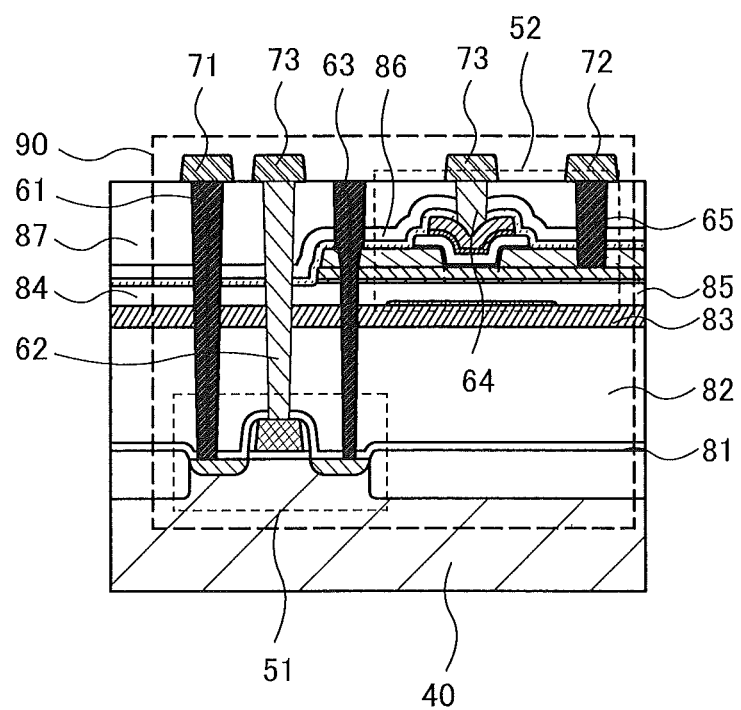
FIG. 4 is a cross-sectional view illustrating a semiconductor device.
Figure 5A:
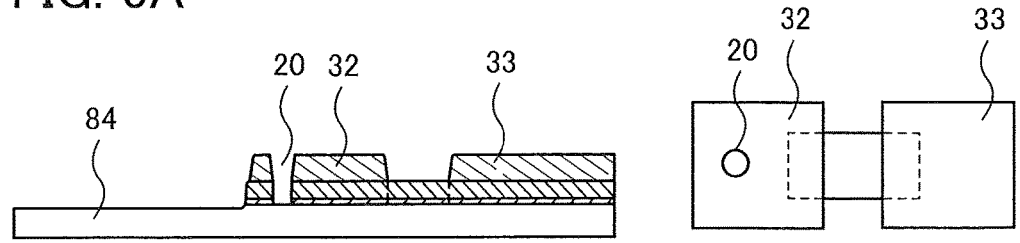
FIGS. 5A to 5D are cross-sectional views illustrating a method for forming a contact plug.
Figure 5B:
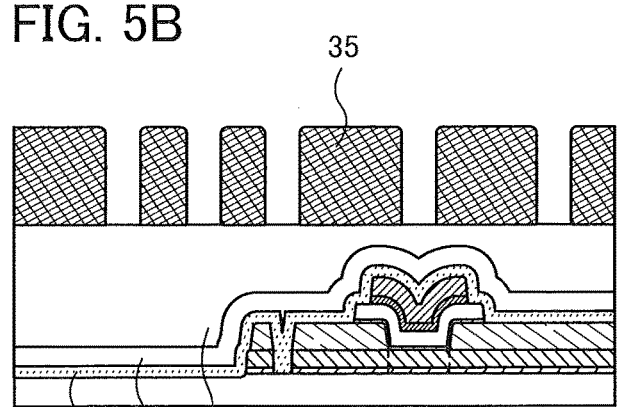
Figure 5B:
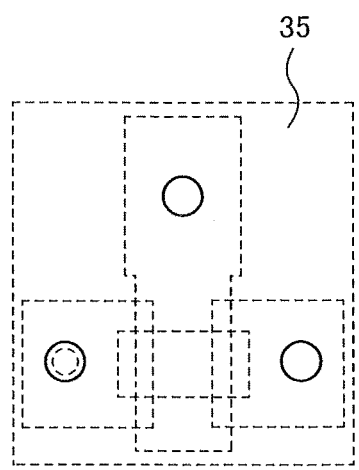
Figure 5C:
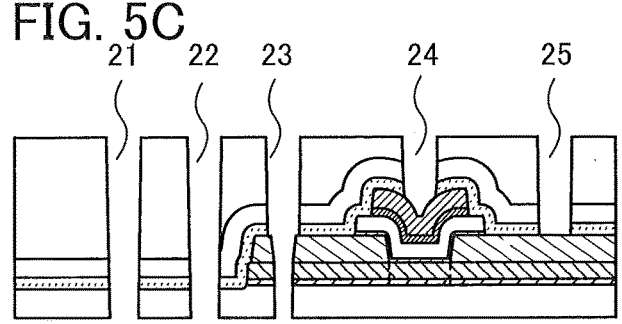
Figure 5C:
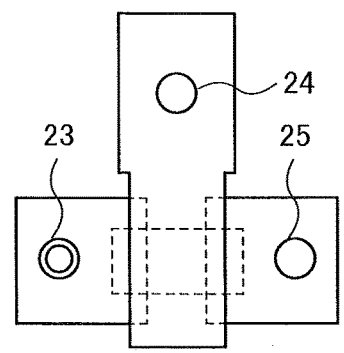
Figure 5D:
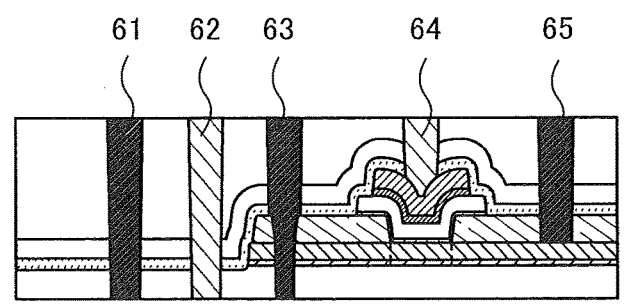
Figure 5D:
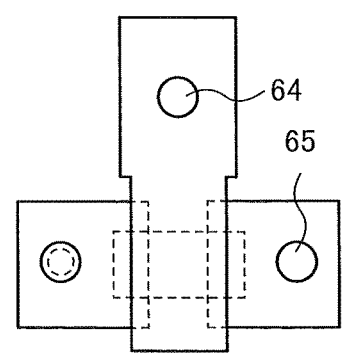

FIG. 4 illustrates a semiconductor device of one embodiment of the present invention including the above structure. Also in this structure, providing an opening in one of the source electrode and the drain electrode of the transistor 52 makes it easy to form a contact hole for providing the contact plug 63.

In this case, the oxide semiconductor layer is also etched at the time of forming the contact hole for providing the contact plug 63. The oxide semiconductor layer has etching conditions different from those of an insulating layer in some cases; therefore, an opening may be provided also in the oxide semiconductor layer.

FIGS. 5A to 5D illustrate a process for forming the contact plug 63, in which an opening is provided also in the oxide semiconductor layer. Description of the process is omitted because the process is the same as that in FIGS. 2A to 2D except that an opening is provided also in the oxide semiconductor layer.

Figure 41A:
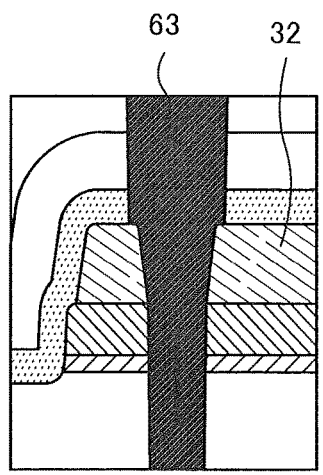
FIGS. 41A to 41F are enlarged cross-sectional views of semiconductor devices.

FIGS. 41A to 41F are enlarged views of a region in the vicinity of the interface between the source electrode layer 32 of the transistor 52 and the second insulating layer in FIG. 4. FIG. 41A is an enlarged view of FIG. 5D; one embodiment of the present invention is not limited thereto. Adjusting etching conditions makes it possible to vary the shapes of the opening 20 and components around it.

Figure 41B:
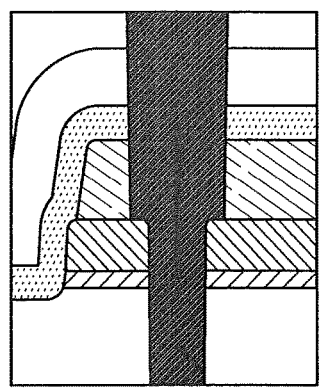
Figure 41C:
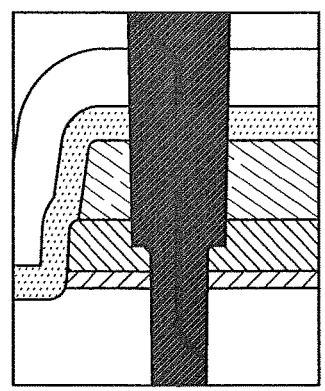
Figure 41D:
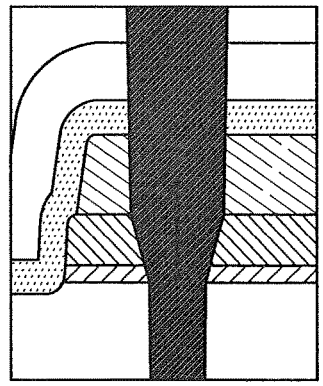
Figure 41E:
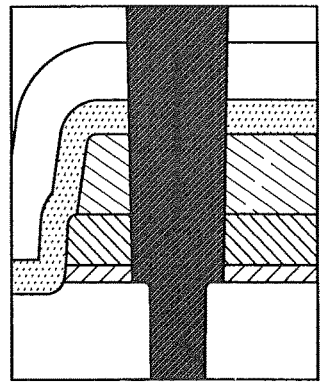
Figure 41F:
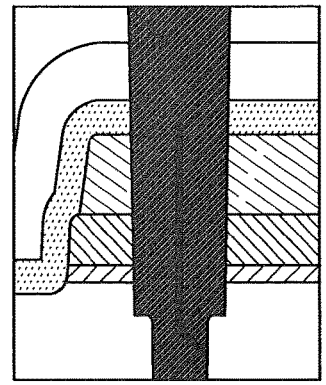

For example, as in FIG. 41B, the diameter of the contact plug 63 may change at the interface between the source electrode layer 32 and the oxide semiconductor layer. Alternatively, as in FIG. 41C, the diameter of the contact plug 63 may change in the oxide semiconductor layer. Alternatively, as in FIG. 41D, an angle of a sidewall of the contact plug 63 in the opening 20 in the oxide semiconductor layer may be different from that of the sidewall of the contact plug 63 in the other portion. Alternatively, as in FIG. 41E, the diameter of the contact plug 63 may change at the interface between the oxide semiconductor layer and the first insulating layer. Alternatively, as in FIG. 41F, the diameter of the contact plug 63 may change in the first insulating layer. Alternatively, any of the shapes of the contact plug 63 in FIGS. 40A to 40F and FIGS. 41A to 41F may be combined.

Figure 6A:
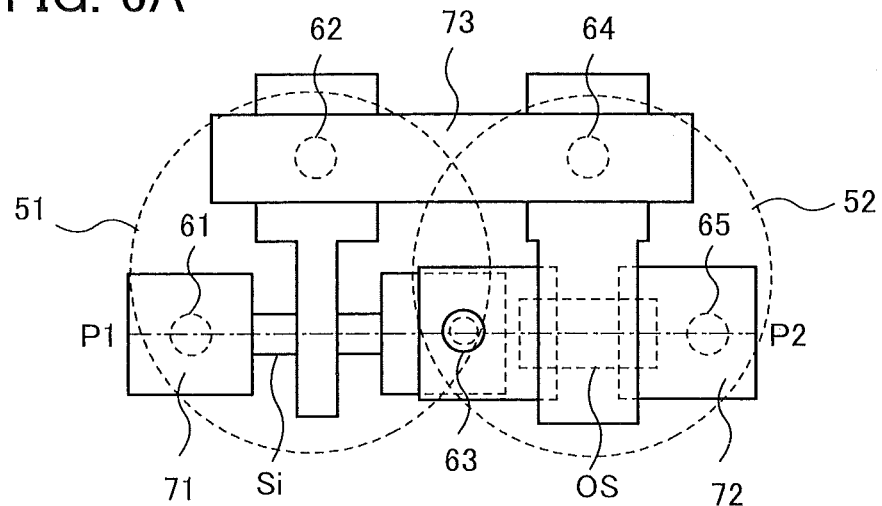
FIGS. 6A and 6B are top views illustrating semiconductor devices.
Figure 6B:
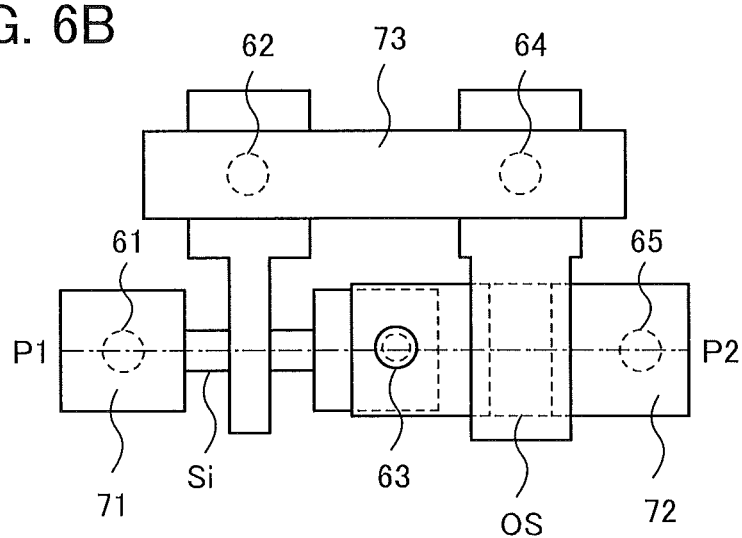

FIGS. 6A and 6B are each a top view of the semiconductor device of one embodiment of the present invention. FIG. 6A is a top view of the semiconductor device in FIG. 1A, and FIG. 6B is a top view of the semiconductor device in FIG. 4. Note that FIG. 1A and FIG. 4 correspond to cross-sections along P1-P2 in FIGS. 6A and 6B, respectively. In the drawings, "OS" represents an active layer formed using an oxide semiconductor, and "Si" represents an active region made of silicon.

Figure 7A:
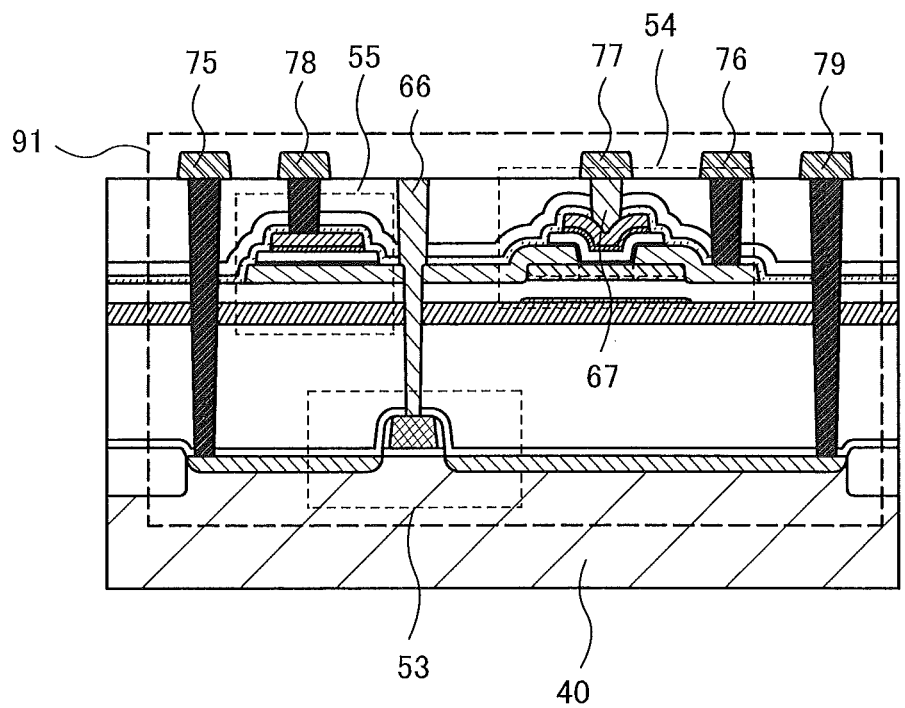
FIGS. 7A and 7B are a cross-sectional view and a circuit diagram illustrating a semiconductor device.

FIG. 7A illustrates another embodiment of the present invention. The semiconductor device in FIG. 7A includes a transistor 53 including an active region in the silicon substrate 40, a transistor 54 including an oxide semiconductor layer as an active layer, and a capacitor 55. The connection configuration of the transistors 53 and 54 and the capacitor 55 in FIG. 7A forms a circuit 91 shown in a circuit diagram in FIG. 7B. The semiconductor device in FIG. 7A can have the same structure as that in FIG. 1A except for the provision of the capacitor 55 and the connection configuration of the components.

Here, a contact plug 66 is used to electrically connect a gate electrode layer of the transistor 53, one of a source electrode layer and a drain electrode layer of the transistor 54, and one electrode layer of the capacitor 55 to each other. The contact plug 66 is provided using an opening provided in the one of the source electrode layer and the drain electrode layer of the transistor 54 (the one electrode layer of the capacitor 55). Accordingly, like the contact plug 63 in FIG. 1A, in the depth direction from the second insulating layer to the first insulating layer, the diameter of the contact plug 66 changes to a smaller value at the interface between the one of the source electrode layer and the drain electrode layer of the transistor 54 and the second insulating layer.

Note that in FIG. 7A, the contact plugs 66 and 67 are hatched differently from other contact plugs to show that their positions in the depth direction of the drawing are different from those of other contact plugs.

Figure 8:
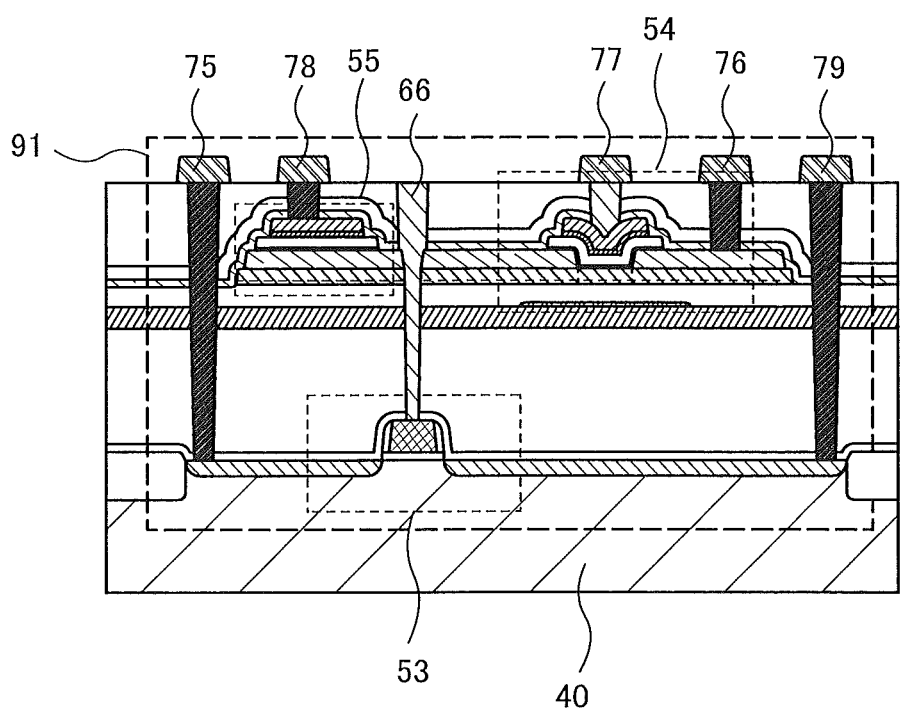
FIG. 8 is a cross-sectional view illustrating a semiconductor device.
Figure 9A:
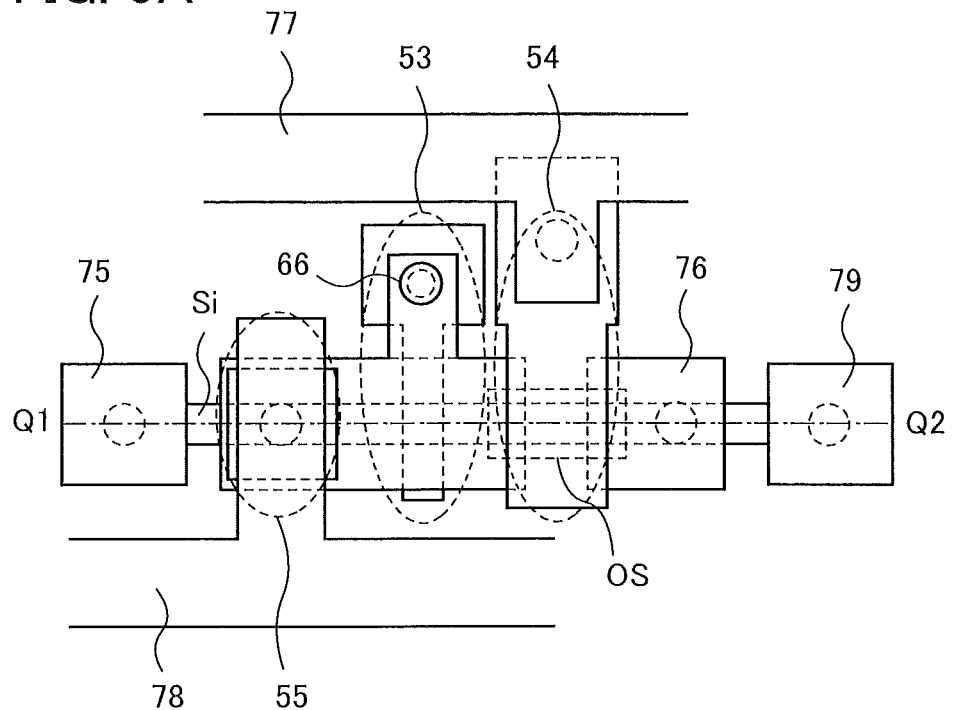
FIGS. 9A and 9B are top views illustrating semiconductor devices.
Figure 9B:
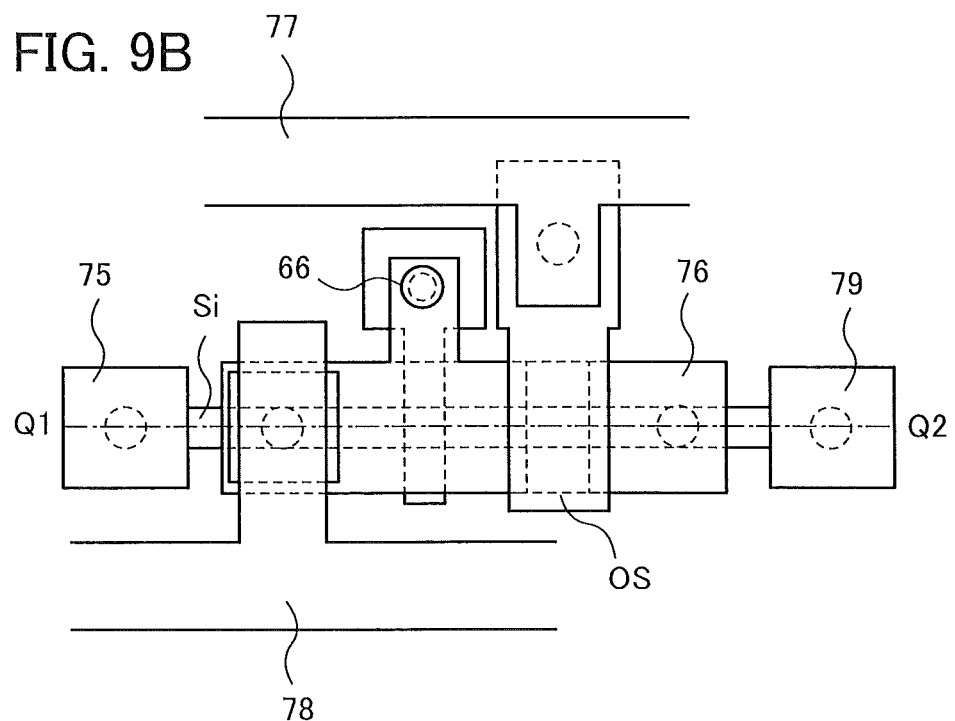

FIG. 8 illustrates the case where the structure of the transistor 52 shown in FIG. 4 is applied to the transistor 54. FIG. 9A is an example of a top view of the semiconductor device in FIG. 7A. FIG. 9B is an example of a top view of the semiconductor device in FIG. 8. Note that FIG. 7A and FIG. 8 correspond to cross-sections along Q1-Q2 in FIGS. 9A and 9B, respectively.

Figure 7B:
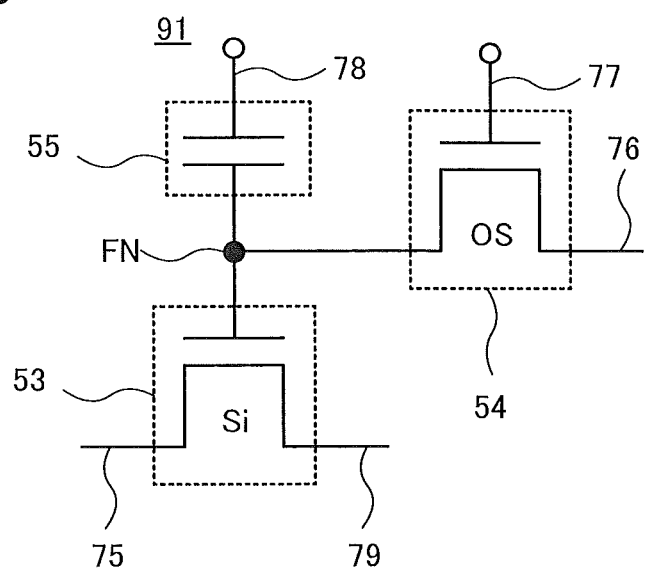

The circuit 91 shown in FIG. 7B is an example of a semiconductor device (memory circuit) that can hold stored data even when power is not supplied and that has no limitation on the number of times of writing.

The transistor 54 formed using an oxide semiconductor enables charge to be held for a long time owing to its characteristics of a significantly low off-state current. For example, in the case where the voltage between the source and the drain is set to approximately 0.1 V, 5 V, or 10 V, the off-state current standardized on the channel width of the transistor can be as low as several yoctoamperes per micrometer to several zeptoamperes per micrometer. On the other hand, a transistor including a material other than an oxide semiconductor, such as crystalline silicon, can operate at high speed easily. Thus, the use of both the transistors enables fabrication of a memory device that has a high capability of holding data and that operates at high speed.

The semiconductor device in FIG. 7B utilizes a feature that the potential of a gate electrode of the transistor 53 can be held, and thus enables writing, storing, and reading of data as follows.

Writing and holding of data will be described. First, the potential of a wiring 77 is set to a potential at which the transistor 54 is turned on, so that the transistor 54 is turned on.

By the above operation, the potential of a wiring 76 is supplied to the gate electrode of the transistor 53 and the capacitor 55. In other words, a predetermined charge is supplied to a node FN (data writing). Here, one of two kinds of charges providing different potential levels (hereinafter referred to as a low-level charge and a high-level charge) is supplied.

After that, the potential of the wiring 77 is set to a potential at which the transistor 54 is turned off, so that the transistor 54 is turned off. Thus, the charge supplied to the node FN is held (data holding). Since the off-state current of the transistor 54 is extremely low, the charge in the node FN is held for a long time.

Next, reading of data will be described. An appropriate potential (reading potential) is supplied to a wiring 78 while a predetermined potential (constant potential) is supplied to a wiring 75, whereby the potential of a wiring 79 varies depending on the amount of charge held in the node FN.

In general, when the transistor 53 is an n-channel transistor, an apparent threshold voltage $V_{th\_H}$ in the case where a high-level charge is supplied to the gate electrode (node FN) of the transistor 53 is lower than an apparent threshold voltage $V_{th\_L}$ in the case where a low-level charge is supplied to the gate electrode (node FN) of the transistor 53.

Here, an apparent threshold voltage refers to the potential of the wiring 78 which is needed to turn on the transistor 53. Thus, the potential of the wiring 78 is set to a potential $V_0$ that is between $V_{th\_H}$ and $V_{th\_L}$, whereby charge supplied to the gate electrode (node FN) of the transistor 53 can be determined.

For example, in the case where the high-level charge is supplied in writing, when the potential of the wiring 78 is set to $V_0$ ($>V_{th\_H}$), the transistor 53 is turned on. In the case where the low-level charge is supplied in writing, even when the potential of the wiring 78 is set to $V_0$ ($<V_{th\_L}$), the transistor 53 remains off. Therefore, the held data can be read by determining the potential of the wiring 79.

Note that in the case where memory cells are arrayed to be used, it is necessary that only data of a desired memory cell be able to be read. The wirings 78 of memory cells from which data is not read are supplied with a potential at which the transistor 53 is turned off regardless of the potential supplied to the gate electrode, that is, a potential lower than $V_{th\_H}$. Alternatively, the wirings 78 are supplied with a potential at which the transistor 53 is turned on regardless of the potential supplied to the gate electrode, that is, a potential higher than $V_{th\_L}$.

The semiconductor device in FIG. 7B includes a transistor in which a channel formation region is formed using an oxide semiconductor and which has an extremely low off-state current; accordingly, the semiconductor device can hold stored data for an extremely long time. In other words, refresh operation becomes unnecessary or the frequency of the refresh operation can be extremely low, which leads to a sufficient reduction in power consumption. Moreover, stored data can be held for a long time even when power is not supplied (note that a potential is preferably fixed). Note that power may be supplied while the stored data is held.

In the above driving method, a high voltage is not needed to write data to the node FN, and a problem such as deterioration of the transistor 53 does not occur. For example, unlike in a conventional nonvolatile memory, it is not necessary to inject and extract electrons into and from a floating gate by application of a high voltage, and thus a problem such as deterioration of a gate insulating film of the transistor 53 does not occur. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

Components of the semiconductor device of one embodiment of the present invention will be described. Although components of the semiconductor device in FIG. 1A are described below, the description applies also to other semiconductor devices in this embodiment.

The silicon substrate 40 is not limited to a bulk silicon substrate and may be an SOI substrate. Furthermore, the silicon substrate 40 can be replaced with a substrate made of germanium, silicon germanium, silicon carbide, gallium arsenide, aluminum gallium arsenide, indium phosphide, gallium nitride, or an organic semiconductor.

Note that the transistor 51 can be a transistor of various types without being limited to a planar type transistor. For example, the transistor 51 can be a fin-type transistor, a tri-gate transistor, or the like.

The insulating layer 81 can function as a protective film, and typically, a silicon nitride film or an aluminum oxide film can be used as the insulating layer 81. The insulating layers 82 and 87 can function as planarization films, and typically, a silicon oxide film, a silicon oxynitride film, or the like can be used as each of the insulating layers 82 and 87.

The insulating layer 83 can function as a hydrogen-blocking film. Hydrogen in an insulating layer provided in the vicinity of the active region of the transistor 51 terminates dangling bonds of silicon; accordingly, the reliability of the transistor 51 can be improved. Meanwhile, hydrogen in an insulating layer provided in the vicinity of the oxide semiconductor layer, which is the active layer, of the transistor 52 provided in an upper portion becomes a factor of generating carriers in the oxide semiconductor; thus, the reliability of the transistor 52 might be decreased. Therefore, in the case where the transistor using an oxide semiconductor is provided over the transistor using a silicon-based semiconductor material, it is preferable that the insulating layer 83 having a function of preventing diffusion of hydrogen be provided between the transistors. The insulating layer 83 makes hydrogen remain in the lower portion, thereby improving the reliability of the transistor 51. In addition, since the insulating layer 83 suppresses diffusion of hydrogen from the lower portion to the upper portion, the reliability of the transistor 52 also can be improved.

The insulating layer 83 can be, for example, formed using silicon nitride, aluminum oxide, aluminum oxynitride, gallium oxide, gallium oxynitride, yttrium oxide, yttrium oxynitride, hafnium oxide, hafnium oxynitride, or yttria-stabilized zirconia (YSZ). Note that the insulating layer 85 can also be formed using any of these materials.

The insulating layer 84 functions as a supply source of oxygen to the oxide semiconductor layer of the transistor 52. For this reason, the insulating layer 84 preferably contains oxygen, and preferably contains oxygen more than that in the stoichiometric composition. The insulating layer 84 can also function as a gate insulating film on the back gate side of the transistor 52. For this reason, the insulating layer 84 is preferably a film in which defects are less likely to be generated at the interface with the oxide semiconductor layer.

As the insulating layer 84, typically, a silicon oxide film or a silicon oxynitride film can be used. Alternatively, a stack of the insulating layer and a silicon nitride film or a silicon nitride oxide film may be used. Note that the insulating layer 86 can also be formed using any of these materials.

The contact plugs 61 to 65 can be typically formed using a metal material. Specifically, tungsten can be used. It is also possible to provide titanium nitride on the sidewall of the contact plug and tungsten surrounded by the sidewall. Note that chemical mechanical polishing (CMP) treatment may be used for planarization of top surfaces of the insulating layer and the contact plugs.

In this embodiment, structures of an inverter circuit and a memory circuit are described as examples of one embodiment of the present invention; however, one embodiment of the present invention can be applied to other circuits. Moreover, one embodiment of the present invention is not limited to the example where two transistors overlap with each other and can be applied to a structure in which three or more components (e.g., transistors) are electrically connected to each other.

This embodiment shows an example where a transistor including silicon in an active region and a transistor including an oxide semiconductor in an active layer are stacked. Without being limited thereto, one embodiment of the present invention can also be applied to a structure in which a plurality of transistors including silicon are stacked or a structure in which a plurality of transistors including an oxide semiconductor are stacked.

One embodiment of the present invention can also be applied to electrical connection between wirings overlapping with each other.

Figure 42:
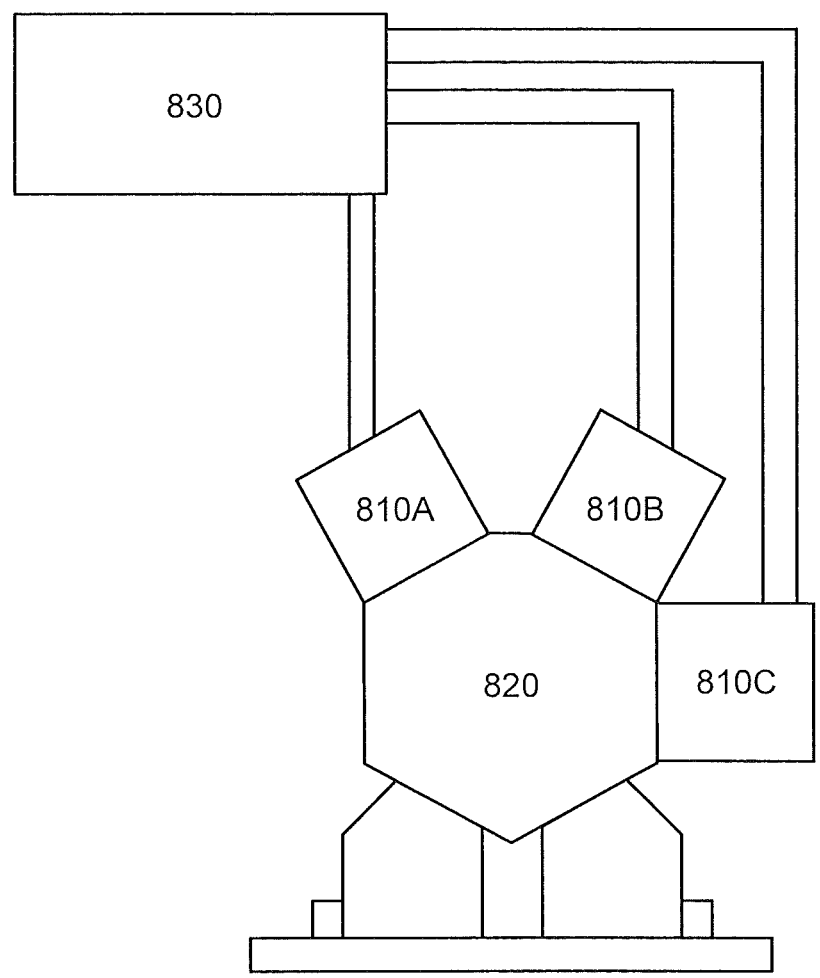
FIG. 42 illustrates an etching apparatus.

FIG. 42 illustrates an example of an etching apparatus for etching a multilayer film including a plurality of kinds of films. The etching apparatus in FIG. 42 includes etching chambers 810A, 810B, and 810C, a transfer chamber 820 intended for temporary standby of a substrate at the time of transferring the substrate to each etching chamber, and a gas supply system 830 that supplies an etching gas or the like to each etching chamber. The etching apparatus also includes power supply systems, pump systems, gas abatement systems, and the like, which are not shown.

To form a minute opening in a multilayer film including a plurality of kinds of films, it is preferable to use a parallel-plate etching apparatus, particularly an etching apparatus with a high-density plasma generation source or the like. Alternatively, it is preferable to provide the etching apparatus with a gas supply system that allows an optimal etching gas to be selected as appropriate for the etching of each layer, particularly a gas supply system that allows a plurality of gases to be used in combination.

For example, formation of a minute opening in a multilayer film including a plurality of kinds of films may be performed in one etching chamber. In this method, an optimal etching gas may be used for the etching of each layer. An etching apparatus with three etching chambers as shown in FIG. 42 can process a plurality of substrates concurrently and therefore can improve the production efficiency.

In the case where etching of a multilayer film including a plurality of kinds of films is performed in one etching chamber, the gas in the etching chamber is switched to an optimal gas in accordance with the kind of a film to be etched. Therefore, various etching products are deposited on the etching chamber wall in some cases. The deposited etching products peel off the etching chamber wall as particles in some cases. Attachment of the particles on a substrate might cause an etching defect.

One of methods for preventing generation of such particles is to etch different kinds of films in different etching chambers. An example of etching a multilayer film including a plurality of kinds of films using the etching apparatus in FIG. 42 is described below. Here, a stack in which a first insulating film, a second insulating film, a third insulating film, an oxide semiconductor film, a conductive film, a fourth insulating film, an organic resin film, and a photoresist are formed in this order over a substrate is to be etched. Note that the photoresist has been exposed to light and developed to have a predetermined shape.

First, the substrate is placed in the etching chamber 810A, and the organic resin film and the fourth insulating film are etched. Next, the substrate is transferred from the etching chamber 810A to the etching chamber 810B via the transfer chamber 820, and the conductive film is etched. Then, the substrate is transferred from the etching chamber 810B to the etching chamber 810A via the transfer chamber 820, and the oxide semiconductor film, the third insulating film, and the second insulating film are etched. Then, the substrate is transferred from the etching chamber 810A to the etching chamber 810C via the transfer chamber 820, and ashing is performed to remove the products generated in the previous etching. After that, the substrate is transferred from the etching chamber 810C to the etching chamber 810A via the transfer chamber 820, and the first insulating film is etched. Then, the substrate is transferred from the etching chamber 810A to the etching chamber 810C via the transfer chamber 820, and aching is performed to remove the photoresist and the organic resin film.

In accordance with the above example, by repeating the above steps, it is possible to form a minute opening in a multilayer film including even more films.

In the above example, a plurality of etching chambers are used for etching of a multilayer film including a plurality of kinds of films. In this case, the substrate is transferred in vacuum and is not exposed to the air; therefore, stable etching can be performed. Furthermore, in each etching chamber, the etching gas is not switched in accordance with the kind of a film. Therefore, process time is shortened, resulting in higher production efficiency.

This embodiment can be implemented in appropriate combination with any of the structures described in the other embodiments.

Embodiment 2

In this embodiment, a transistor including an oxide semiconductor that can be used in one embodiment of the present invention is described with reference to drawings. In the drawings in this embodiment, some components are enlarged, reduced in size, or omitted for easy understanding.

Figure 10A:
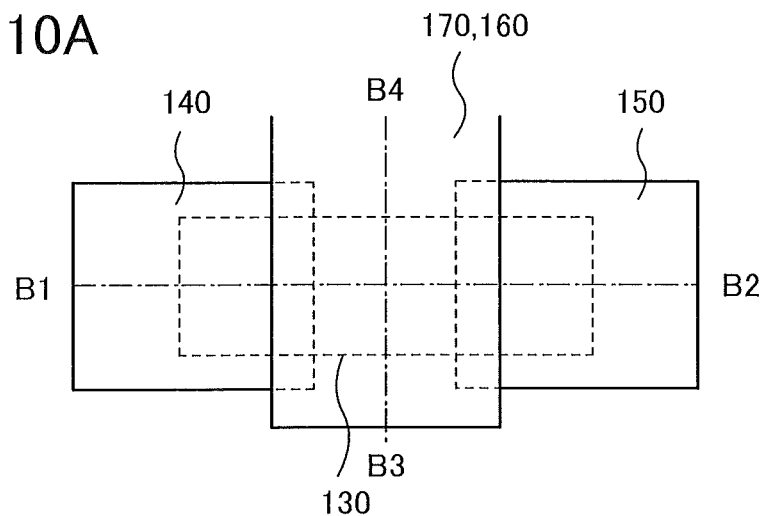
FIGS. 10A and 10B are a top view and a cross-sectional view illustrating a transistor.
Figure 10B:
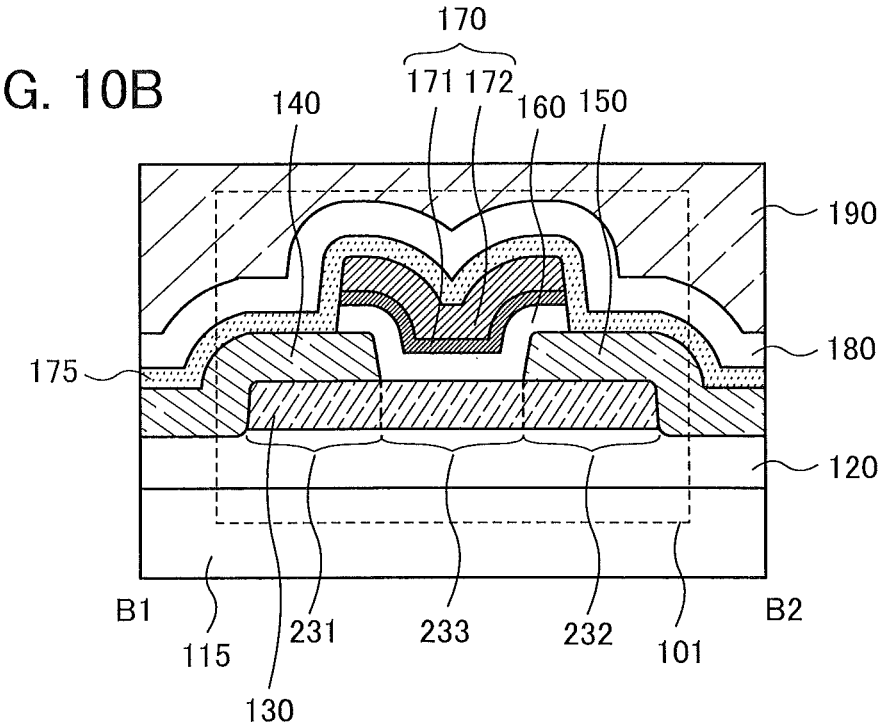
Figure 16A:
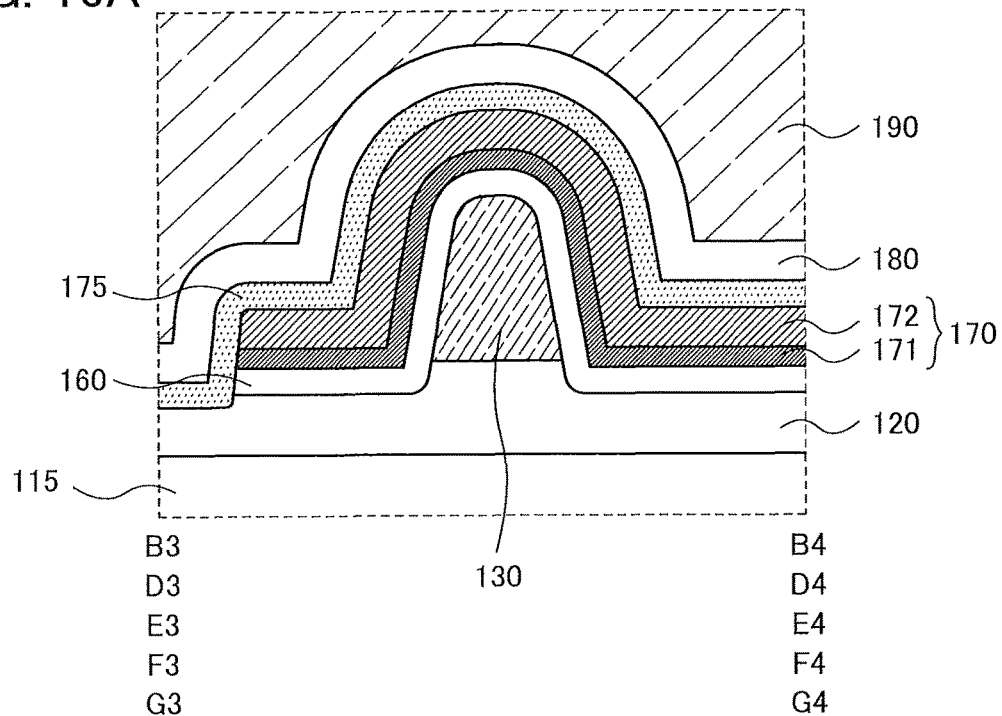
FIGS. 16A and 16B are cross-sectional views of transistors in the channel width direction.

FIGS. 10A and 10B are a top view and a cross-sectional view illustrating a transistor 101 of one embodiment of the present invention. FIG. 10A is a top view, and a cross section in the direction of a dashed-dotted line B1-B2 in FIG. 10A is illustrated in FIG. 10B. A cross section in the direction of a dashed-dotted line B3-B4 in FIG. 10A is illustrated in FIG. 16A. In some cases, the direction of the dashed-dotted line B1-B2 is referred to as a channel length direction, and the direction of the dashed-dotted line B3-B4 is referred to as a channel width direction.

The transistor 101 includes an insulating layer 120 in contact with a substrate 115; an oxide semiconductor layer 130 in contact with the insulating layer 120; a conductive layer 140 and a conductive layer 150 electrically connected to the oxide semiconductor layer 130; an insulating layer 160 in contact with the oxide semiconductor layer 130, the conductive layer 140, and the conductive layer 150; a conductive layer 170 in contact with the insulating layer 160; an insulating layer 175 in contact with the conductive layer 140, the conductive layer 150, the insulating layer 160, and the conductive layer 170; and an insulating layer 180 in contact with the insulating layer 175. The transistor 101 may also include, for example, an insulating layer 190 (planarization film) in contact with the insulating layer 180 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 10B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layer 140 and the conductive layer 150, for example, the resistance of the region 231 and the region 232 can be reduced.

Specifically, since the oxide semiconductor layer 130 is in contact with the conductive layer 140 and the conductive layer 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the region 231 and the region 232 to n-type regions with low resistance.

Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification. In addition, the term "electrode layer" can be replaced with the term "wiring".

The conductive layer 170 includes two layers, a conductive layer 171 and a conductive layer 172, in the drawing, but also may be a single layer or a stack of three or more layers. The same applies to other transistors described in this embodiment.

Each of the conductive layers 140 and 150 is a single layer in the drawing, but also may be a stack of two or more layers. The same applies to other transistors described in this embodiment.

Figure 11A:
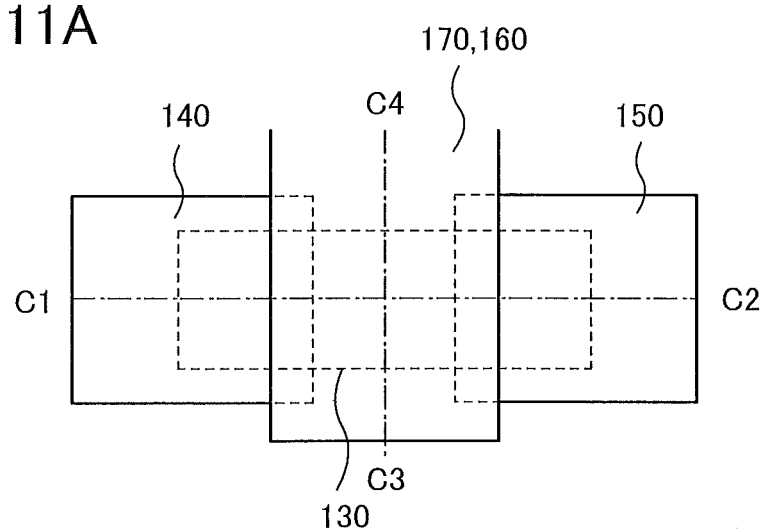
FIGS. 11A and 11B are a top view and a cross-sectional view illustrating a transistor.
Figure 11B:
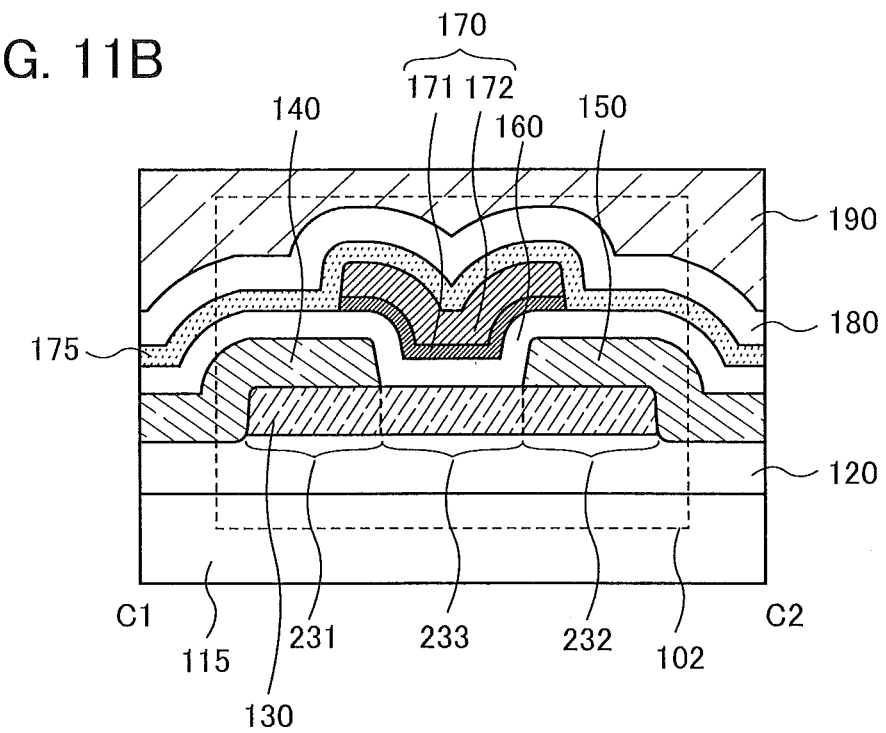
Figure 16B:
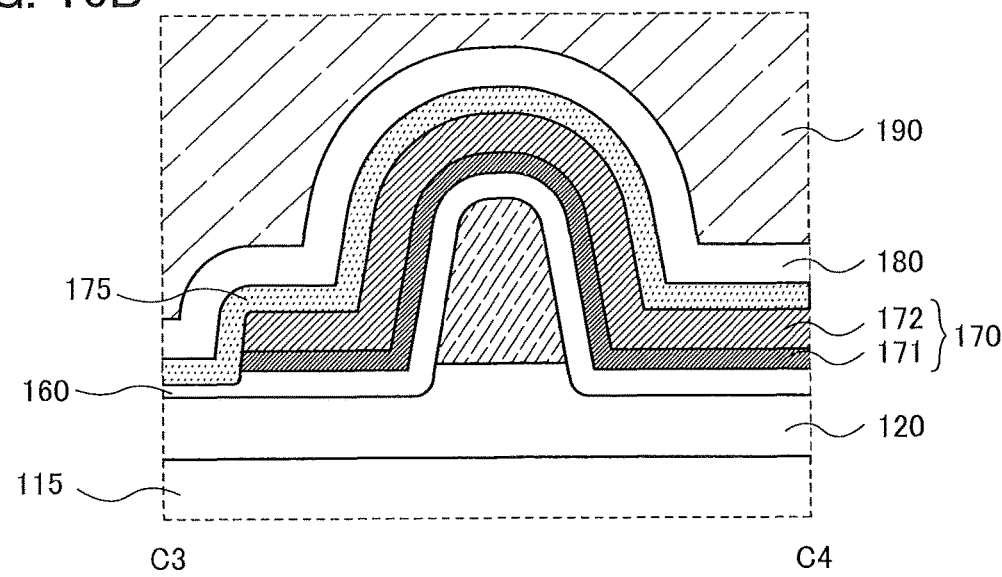
Figure 17A:
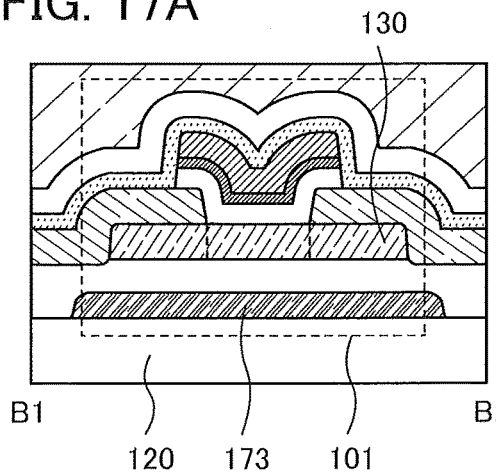
FIGS. 17A to 17F are each a cross-sectional view of a transistor in the channel length direction.
Figure 17B:
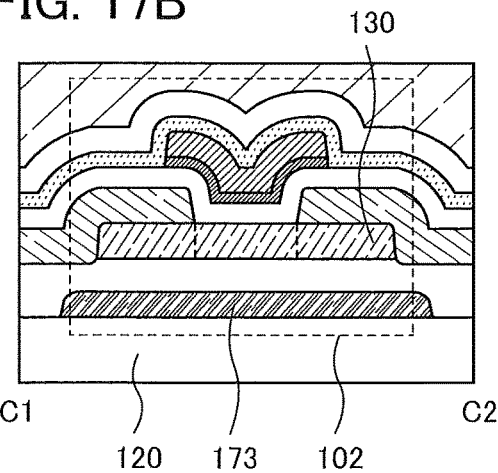
Figure 17C:
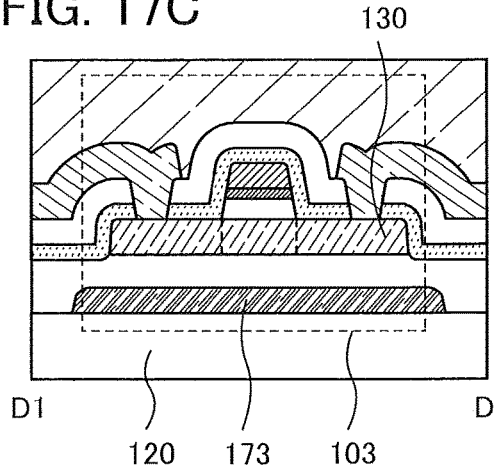
Figure 17D:
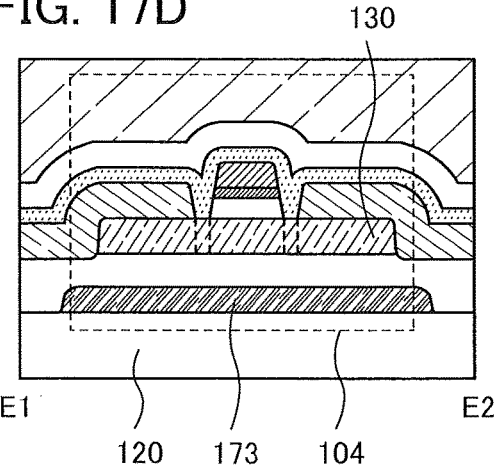
Figure 17E:
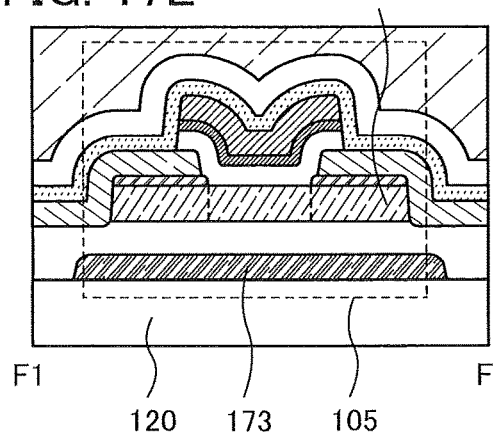
Figure 17F:
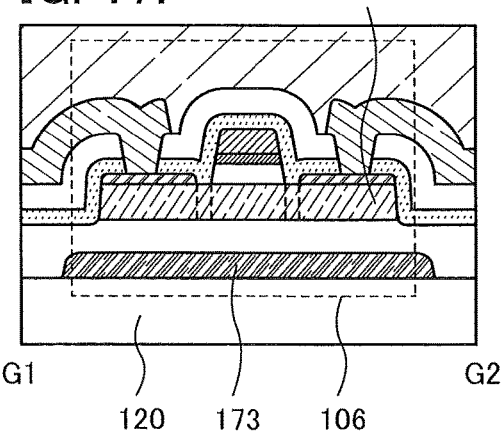

The transistor of one embodiment of the present invention may have a structure illustrated in FIGS. 11A and 11B. FIG. 11A is a top view of a transistor 102. A cross section in the direction of a dashed-dotted line C1-C2 in FIG. 11A is illustrated in FIG. 11B. A cross section in the direction of a dashed-dotted line C3-C4 in FIG. 11A is illustrated in FIG. 16B. In some cases, the direction of the dashed-dotted line C1-C2 is referred to as a channel length direction, and the direction of the dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layer 140 and the conductive layer 150 are covered with the insulating layer 160 and accordingly the resistance between the conductive layer 170 and the conductive layers 140 and 150 is high; therefore, the transistor 102 has a feature of low gate leakage current.

The transistor 101 and the transistor 102 each have a top-gate structure including a region where the conductive layer 170 overlaps with each of the conductive layers 140 and 150. To reduce parasitic capacitance, the width of the region in the channel length direction is preferably greater than or equal to 3 nm and less than 300 nm. Meanwhile, since an offset region is not formed in the oxide semiconductor layer 130, a transistor with high on-state current can be easily be formed.

Figure 12A:
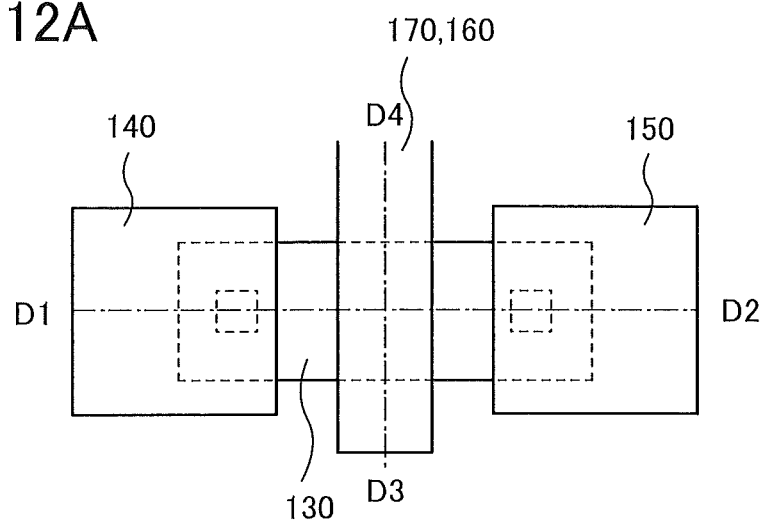
FIGS. 12A and 12B are a top view and a cross-sectional view illustrating a transistor.
Figure 12B:
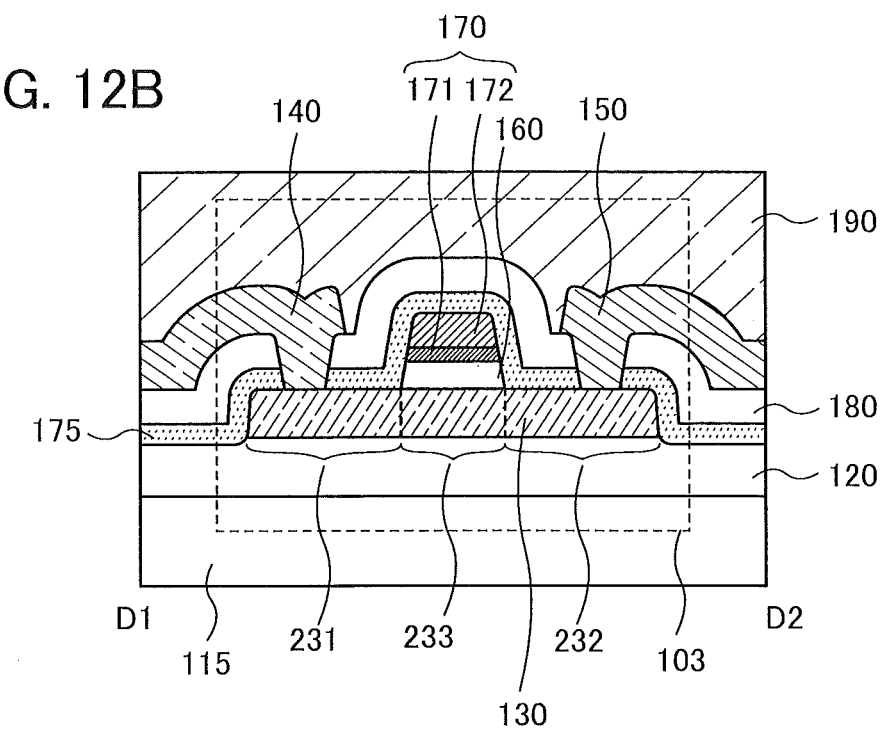

The transistor of one embodiment of the present invention may have a structure illustrated in FIGS. 12A and 12B. FIG. 12A is a top view of a transistor 103. A cross section in the direction of a dashed-dotted line D1-D2 in FIG. 12A is illustrated in FIG. 12B. A cross section in the direction of a dashed-dotted line D3-D4 in FIG. 12A is illustrated in FIG. 16A. In some cases, the direction of the dashed-dotted line D1-D2 is referred to as a channel length direction, and the direction of the dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layer 140 and the conductive layer 150 electrically connected to the oxide semiconductor layer 130 through openings provided in the insulating layer 175 and the insulating layer 180. The transistor 103 may also include, for example, the insulating layer 190 (planarization film) in contact with the insulating layer 180, the conductive layer 140, and the conductive layer 150 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 12B can function as a source region, a drain region, and a channel formation region, respectively. The region 231 and the region 232 are in contact with the insulating layer 175. When an insulating material containing hydrogen is used for the insulating layer 175, for example, the resistance of the region 231 and the region 232 can be reduced.

Specifically, interaction between an oxygen vacancy generated in the region 231 and the region 232 by the steps up to the formation of the insulating layer 175 and hydrogen that diffuses into the region 231 and the region 232 from the insulating layer 175 changes the region 231 and the region 232 to n-type regions with low resistance. As the insulating material containing hydrogen, for example, silicon nitride, aluminum nitride, or the like can be used.

Figure 13A:
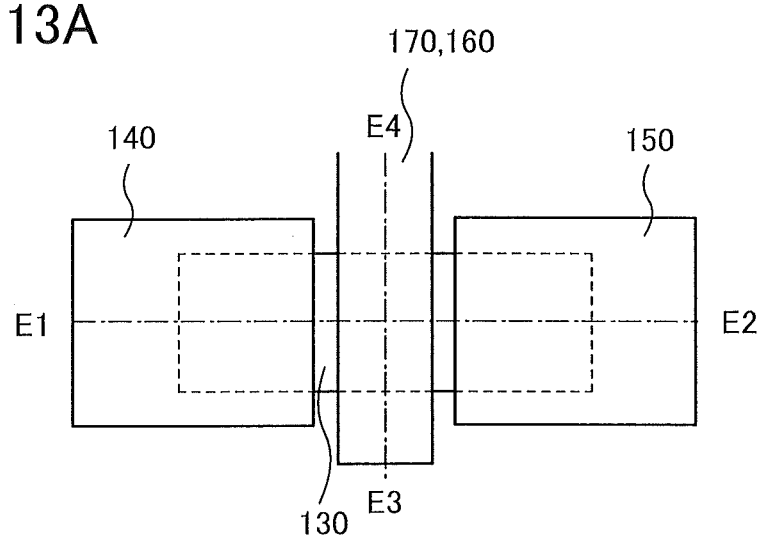
FIGS. 13A and 13B are a top view and a cross-sectional view illustrating a transistor.
Figure 13B:
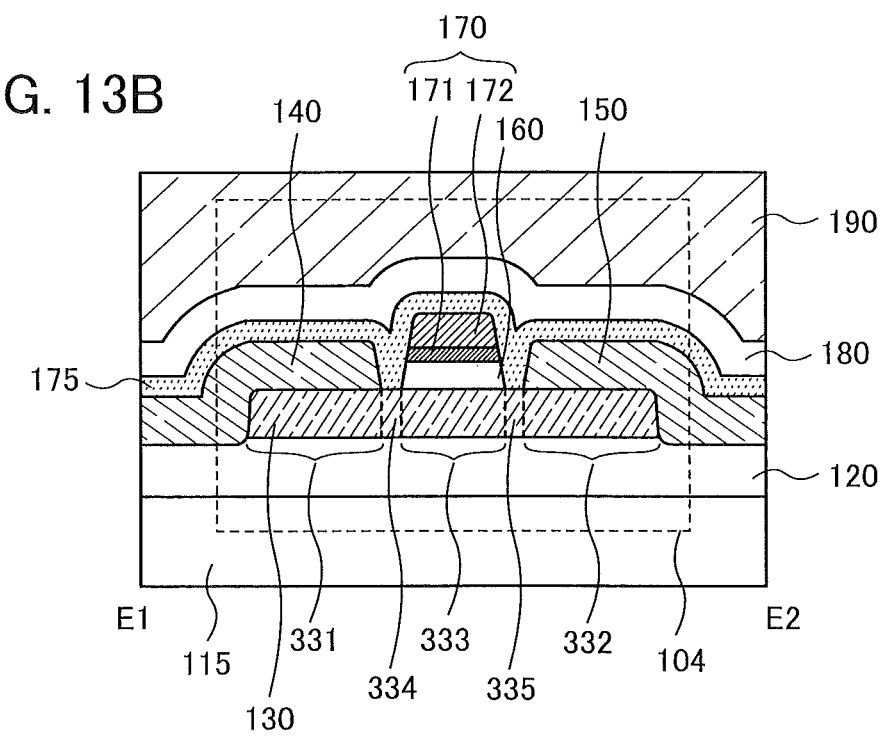

The transistor of one embodiment of the present invention may have a structure illustrated in FIGS. 13A and 13B. FIG. 13A is a top view of a transistor 104. A cross section in the direction of a dashed-dotted line E1-E2 in FIG. 13A is illustrated in FIG. 13B. A cross section in the direction of a dashed-dotted line E3-E4 in FIG. 13A is illustrated in FIG. 16A. In some cases, the direction of the dashed-dotted line E1-E2 is referred to as a channel length direction, and the direction of the dashed-dotted line E3-E4 is referred to as a channel width direction.

The transistor 104 has the same structure as the transistor 103 except that the conductive layer 140 and the conductive layer 150 in contact with the oxide semiconductor layer 130 cover end portions thereof.

In FIG. 13B, a region 331 and a region 334 can function as a source region, a region 332 and a region 335 can function as a drain region, and a region 333 can function as a channel formation region. The resistance of the region 331 and the region 332 can be reduced in a manner similar to that of the region 231 and the region 232 in the transistor 101. The resistance of the region 334 and the region 335 can be reduced in a manner similar to that of the region 231 and the region 232 in the transistor 103. In the case where the width of the region 334 and the region 335 in the channel length direction is less than or equal to 100 nm, preferably less than or equal to 50 nm, a gate electric field contributes to preventing a significant decrease in on-state current; therefore, a reduction in resistance of the region 334 and the region 335 as described above is not necessarily performed.

The transistor 103 and the transistor 104 each have a self-aligned structure not including a region where the conductive layer 170 overlaps with each of the conductive layers 140 and 150. A transistor with a self-aligned structure, which has extremely small parasitic capacitance between a gate electrode layer and source and drain electrode layers, is suitable for applications that require high-speed operation.

Figure 14A:
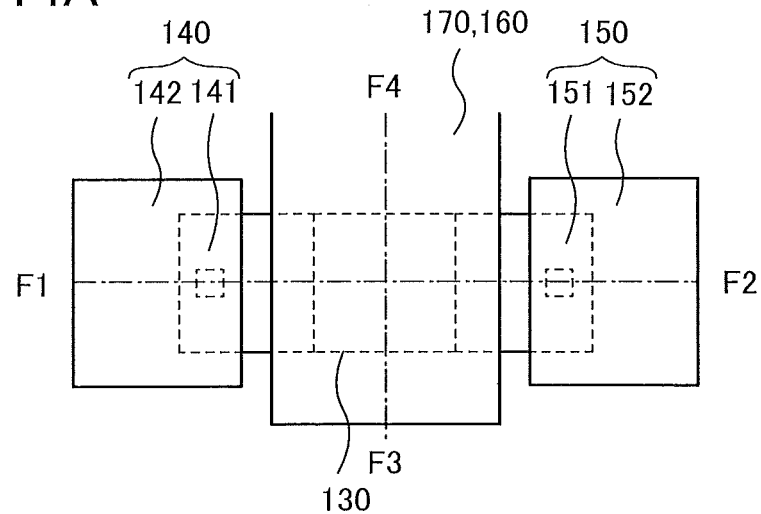
FIGS. 14A and 14B are a top view and a cross-sectional view illustrating a transistor.
Figure 14B:
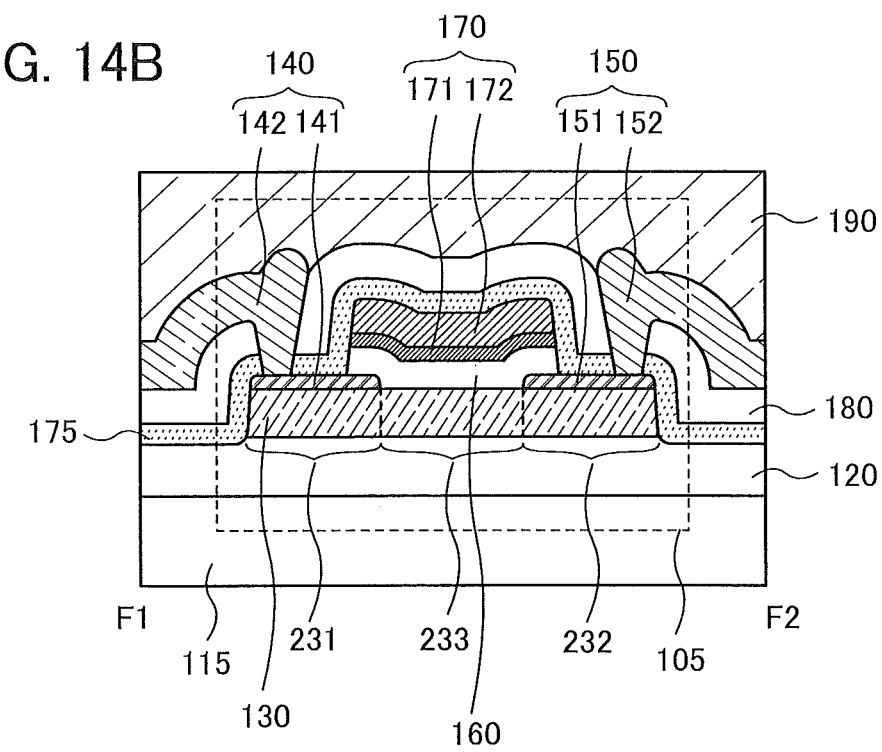

The transistor of one embodiment of the present invention may have a structure illustrated in FIGS. 14A and 14B. FIG. 14A is a top view of a transistor 105. A cross section in the direction of a dashed-dotted line F1-F2 in FIG. 14A is illustrated in FIG. 14B. A cross section in the direction of a dashed-dotted line F3-F4 in FIG. 14A is illustrated in FIG. 16A. In some cases, the direction of the dashed-dotted line F1-F2 is referred to as a channel length direction, and the direction of the dashed-dotted line F3-F4 is referred to as a channel width direction.

The transistor 105 includes the insulating layer 120 in contact with the substrate 115; the oxide semiconductor layer 130 in contact with the insulating layer 120; a conductive layer 141 and a conductive layer 151 electrically connected to the oxide semiconductor layer 130; the insulating layer 160 in contact with the oxide semiconductor layer 130, the conductive layer 141, and the conductive layer 151; the conductive layer 170 in contact with the insulating layer 160; the insulating layer 175 in contact with the oxide semiconductor layer 130, the conductive layer 141, the conductive layer 151, the insulating layer 160, and the conductive layer 170; the insulating layer 180 in contact with the insulating layer 175; and a conductive layer 142 and a conductive layer 152 electrically connected to the conductive layer 141 and the conductive layer 151, respectively, through openings provided in the insulating layer 175 and the insulating layer 180. The transistor 105 may also include, for example, the insulating layer 190 (planarization film) in contact with the insulating layer 180, the conductive layer 142, and the conductive layer 152 as necessary.

Here, the conductive layer 141 and the conductive layer 151 are in contact with the top surface of the oxide semiconductor layer 130 and are not in contact with side surfaces of the oxide semiconductor layer 130.

The transistor 105 has the same structure as the transistor 101 except that the conductive layer 141 and the conductive layer 151 are provided and that the conductive layer 142 and the conductive layer 152 electrically connected to the conductive layer 141 and the conductive layer 151, respectively, through the openings provided in the insulating layer 175 and the insulating layer 180 are provided. The conductive layer 140 (the conductive layer 141 and the conductive layer 142) can function as a source electrode layer, and the conductive layer 150 (the conductive layer 151 and the conductive layer 152) can function as a drain electrode layer.

Figure 15A:
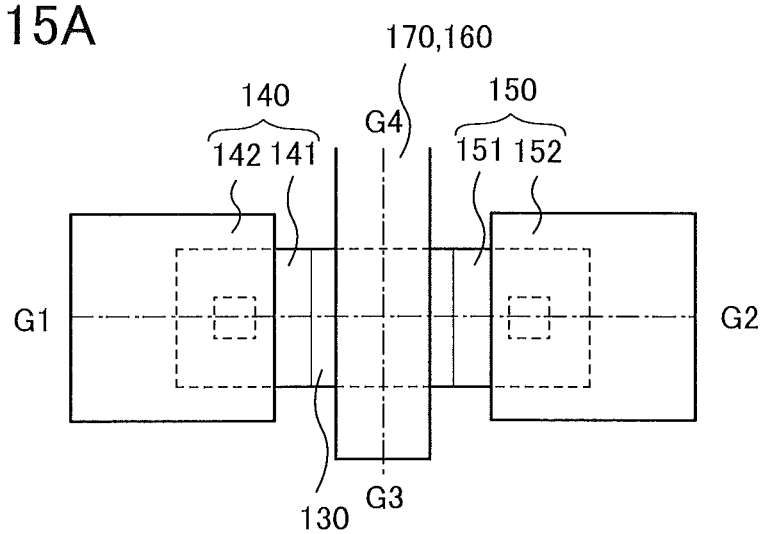
FIGS. 15A and 15B are a top view and a cross-sectional view illustrating a transistor.
Figure 15B:
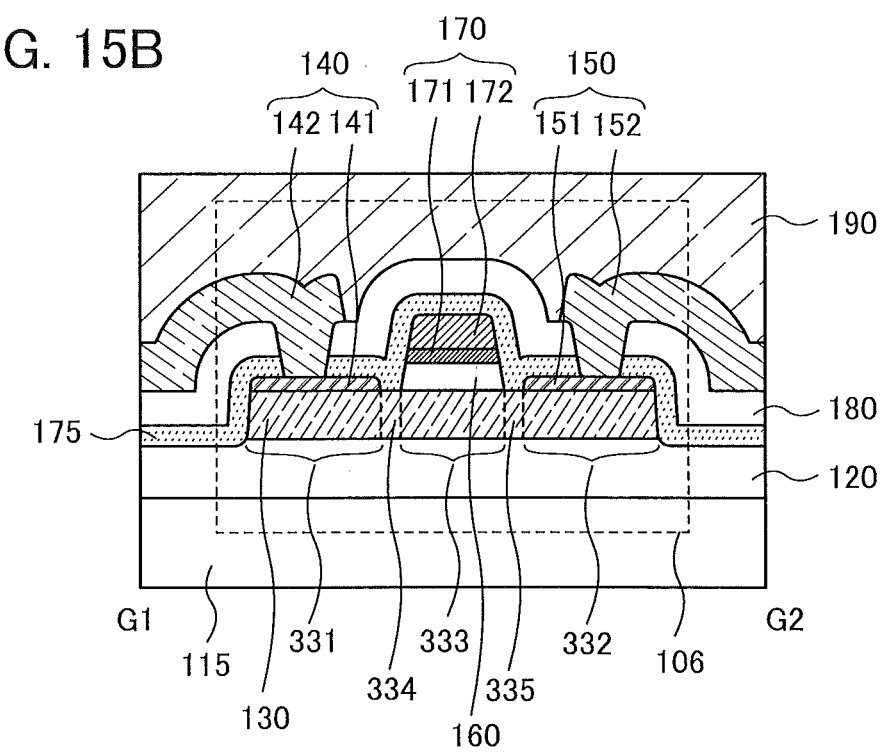

The transistor of one embodiment of the present invention may have a structure illustrated in FIGS. 15A and 15B. FIG. 15A is a top view of a transistor 106. A cross section in the direction of a dashed-dotted line G1-G2 in FIG. 15A is illustrated in FIG. 15B. A cross section in the direction of a dashed-dotted line G3-G4 in FIG. 15A is illustrated in FIG. 16A. In some cases, the direction of the dashed-dotted line G1-G2 is referred to as a channel length direction, and the direction of the dashed-dotted line G3-G4 is referred to as a channel width direction.

The transistor 106 includes the insulating layer 120 in contact with the substrate 115; the oxide semiconductor layer 130 in contact with the insulating layer 120; the conductive layer 141 and the conductive layer 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layer 141, the conductive layer 151, the insulating layer 160, and the conductive layer 170; the insulating layer 180 in contact with the insulating layer 175; and the conductive layer 142 and the conductive layer 152 electrically connected to the conductive layer 141 and the conductive layer 151, respectively, through openings provided in the insulating layer 175 and the insulating layer 180. The transistor 106 may also include, for example, the insulating layer 190 (planarization film) in contact with the insulating layer 180, the conductive layer 142, and the conductive layer 152 as necessary.

Here, the conductive layer 141 and the conductive layer 151 are in contact with the top surface of the oxide semiconductor layer 130 and are not in contact with side surfaces of the oxide semiconductor layer 130.

The transistor 106 has the same structure as the transistor 103 except that the conductive layer 141 and the conductive layer 151 are provided. The conductive layer 140 (the conductive layer 141 and the conductive layer 142) can function as a source electrode layer, and the conductive layer 150 (the conductive layer 151 and the conductive layer 152) can function as a drain electrode layer.

In the structures of the transistor 105 and the transistor 106, the conductive layer 140 and the conductive layer 150 are not in contact with the insulating layer 120. These structures make the insulating layer 120 less likely to be deprived of oxygen by the conductive layer 140 and the conductive layer 150 and facilitate oxygen supply from the insulating layer 120 to the oxide semiconductor layer 130.

Note that an impurity for forming an oxygen vacancy to increase conductivity may be added to the region 231 and the region 232 in the transistor 103 and the region 334 and the region 335 in the transistor 104 and the transistor 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, an ion implantation method, an ion doping method, a plasma immersion ion implantation method, or the like can be used.

When the above element is added as an impurity element to the oxide semiconductor layer, a bond between a metal element and oxygen in the oxide semiconductor layer is cut, whereby an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Accordingly, the oxide conductor has a light-transmitting property. Here, an oxide conductor refers to an oxide semiconductor having become a conductor.

The oxide conductor is a degenerate semiconductor and it is suggested that the conduction band edge equals to or substantially equals to the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 18A:
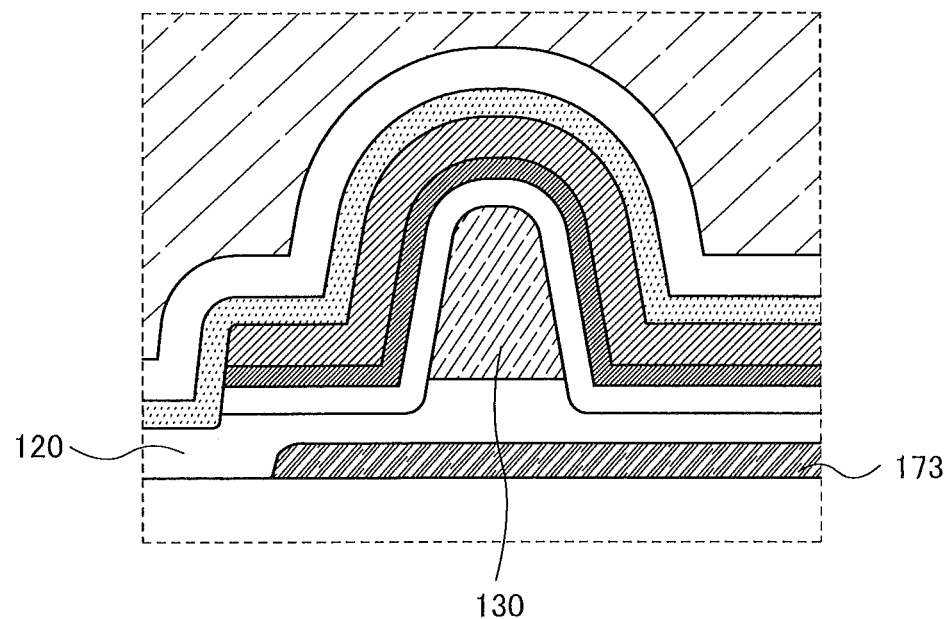
FIGS. 18A and 18B are cross-sectional views of transistors in the channel width direction.
Figure 18B:
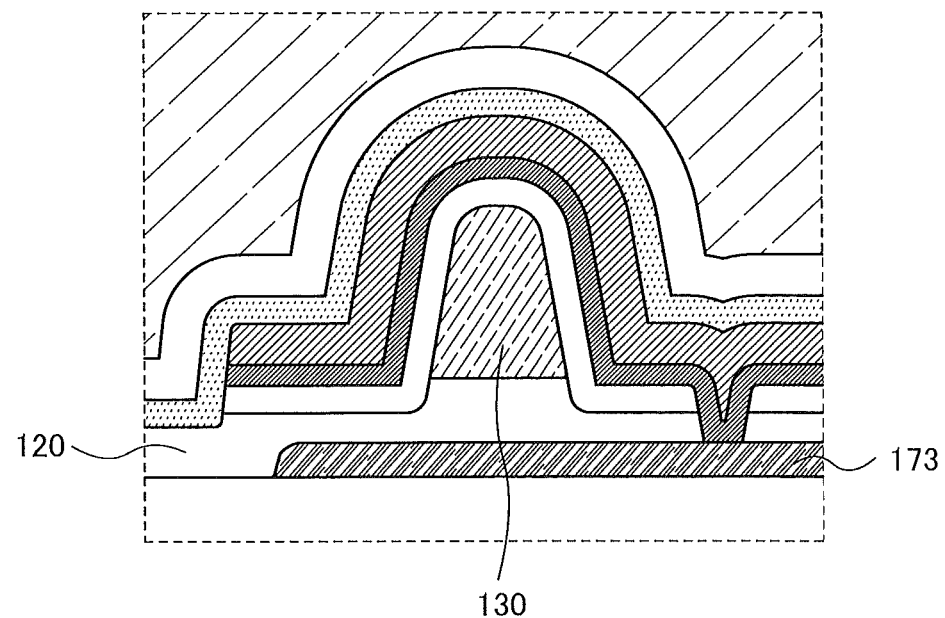

The transistor of one embodiment of the present invention may include a conductive layer 173 between the oxide semiconductor layer 130 and the substrate 115 as illustrated in the cross-sectional views in the channel length direction in FIGS. 17A to 17F and the cross-sectional views in the channel width direction in FIGS. 18A and 18B. When the conductive layer is used as a second gate electrode layer (back gate), the on-state current can be increased or the threshold voltage can be controlled. In the cross-sectional views in FIGS. 17A to 17F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layer 170 and the conductive layer 173 are set to have the same potential, and the transistor is driven as a double-gate transistor. Further, to control the threshold voltage, a fixed potential, which is different from a potential of the conductive layer 170, is supplied to the conductive layer 173. To set the conductive layer 170 and the conductive layer 173 at the same potential, for example, as shown in FIG. 18B, the conductive layer 170 and the conductive layer 173 may be electrically connected to each other through a contact hole.

The transistors 101 to 106 shown in FIGS. 10A and 10B, FIGS. 11A and 11B, FIGS. 12A and 12B, FIGS. 13A and 13B, FIGS. 14A and 14B, and FIGS. 15A and 15B are examples in which the oxide semiconductor layer 130 is a single layer; alternatively, the oxide semiconductor layer 130 may be a stacked layer. The oxide semiconductor layer 130 in the transistors 101 to 106 can be replaced with the oxide semiconductor layer 130 shown in FIGS. 19A to 19C or FIGS. 20A to 20C.

Figure 19A:
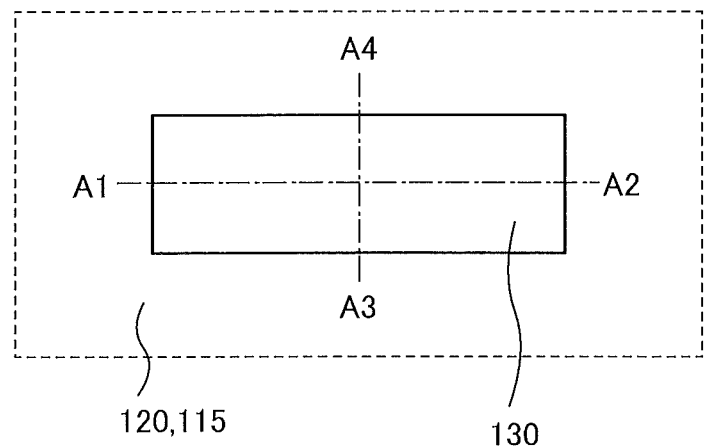
FIGS. 19A to 19C are a top view and cross-sectional views illustrating a semiconductor layer.
Figure 19B:
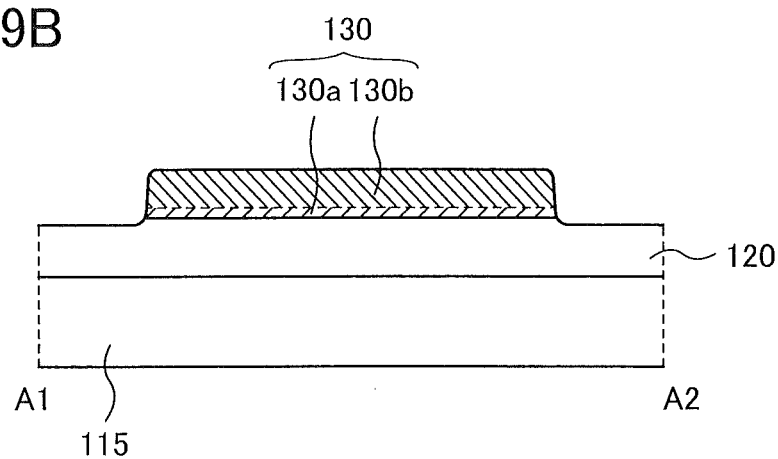
Figure 19C:
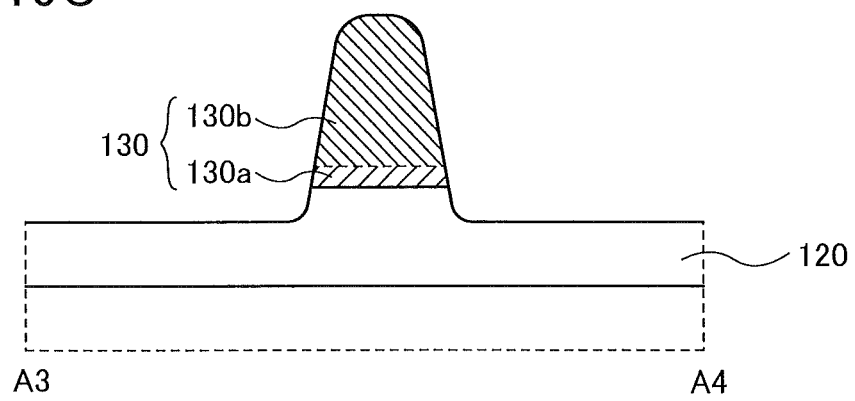

FIGS. 19A to 19C are a top view and cross-sectional views of the oxide semiconductor layer 130 with a two-layer structure. FIG. 19A is the top view. FIG. 19B illustrates a cross section in the direction of a dashed-dotted line A1-A2 in FIG. 19A. FIG. 19C illustrates a cross section in the direction of a dashed-dotted line A3-A4 in FIG. 19A.

Figure 20A:
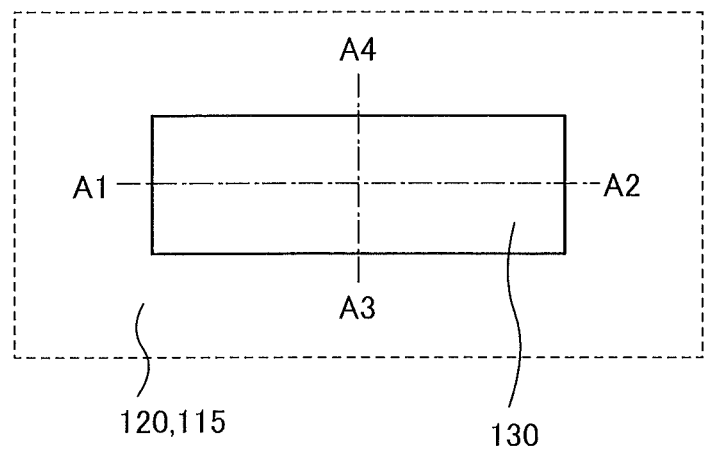
FIGS. 20A to 20C are a top view and cross-sectional views illustrating a semiconductor layer.
Figure 20B:
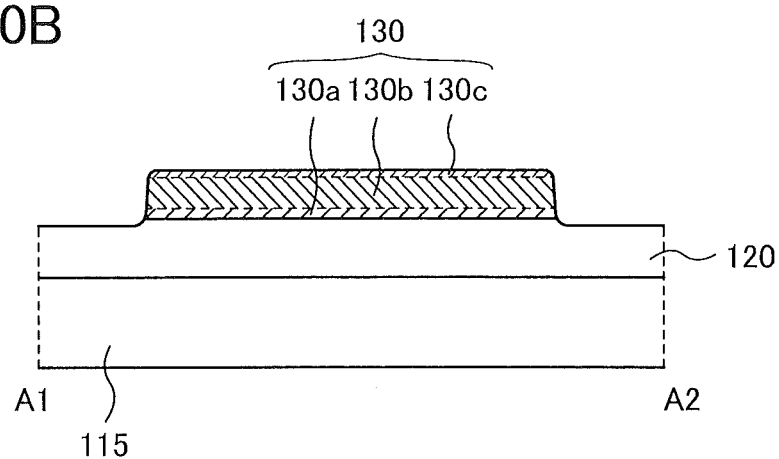
Figure 20C:
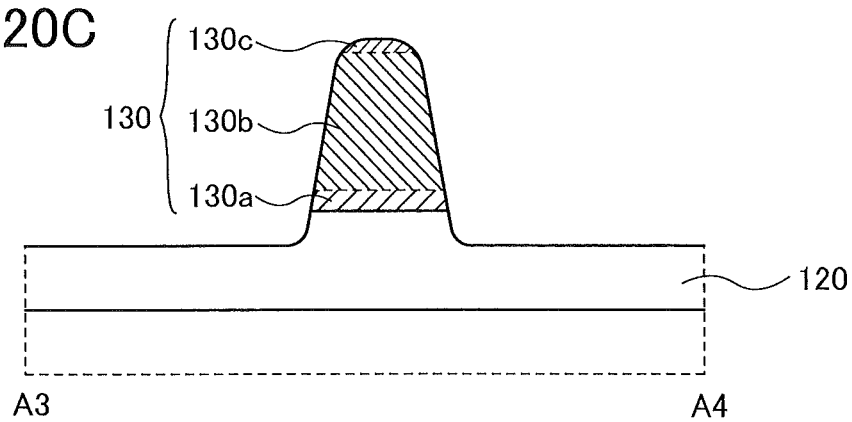

FIGS. 20A to 20C are a top view and cross-sectional views of the oxide semiconductor layer 130 with a three-layer structure. FIG. 20A is the top view. FIG. 20B illustrates a cross section in the direction of a dashed-dotted line A1-A2 in FIG. 20A. FIG. 20C illustrates a cross section in the direction of a dashed-dotted line A3-A4 in FIG. 20A.

Oxide semiconductor layers with different compositions, for example, can be used as an oxide semiconductor layer 130a, an oxide semiconductor layer 130b, and an oxide semiconductor layer 130c.

Figure 21A:
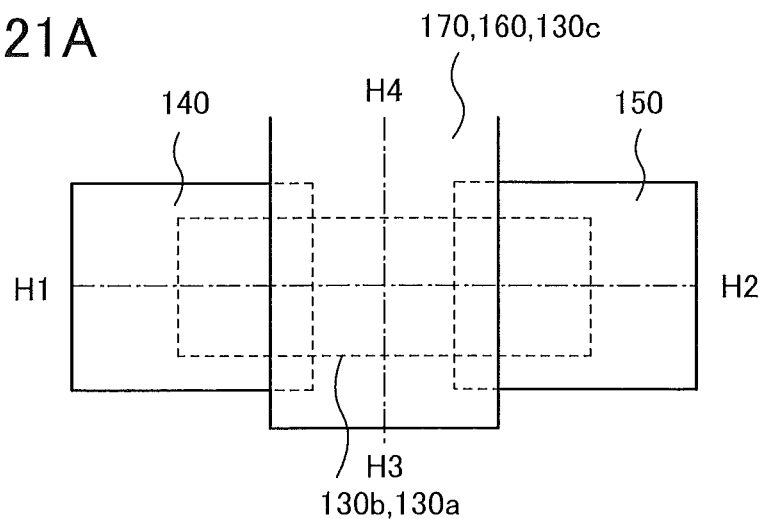
FIGS. 21A and 21B are a top view and a cross-sectional view illustrating a transistor.
Figure 21B:
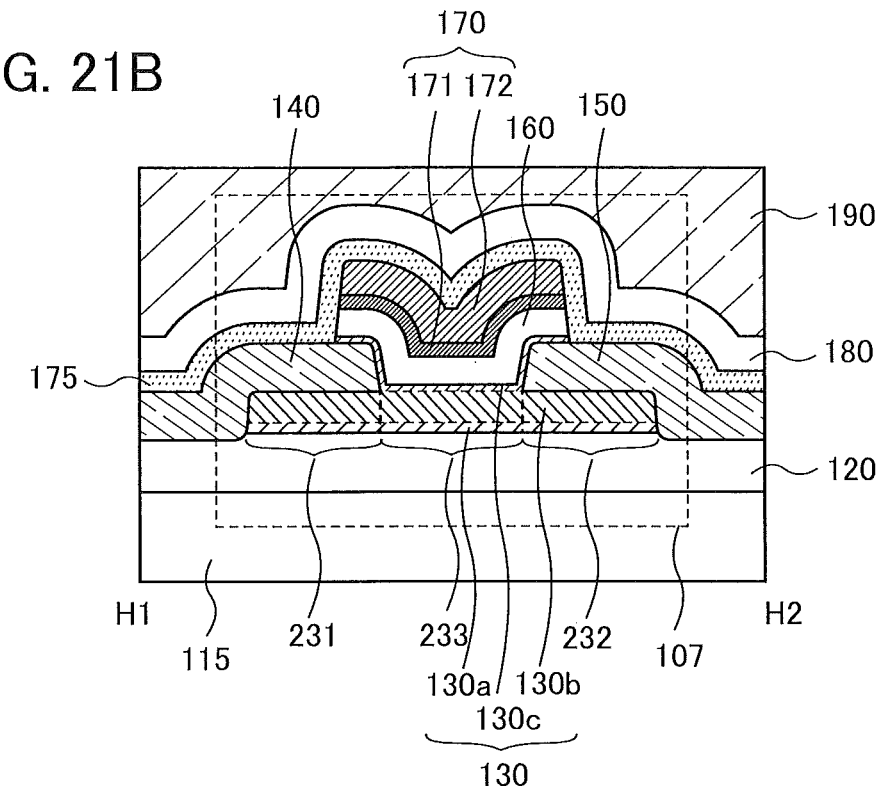
Figure 27A:
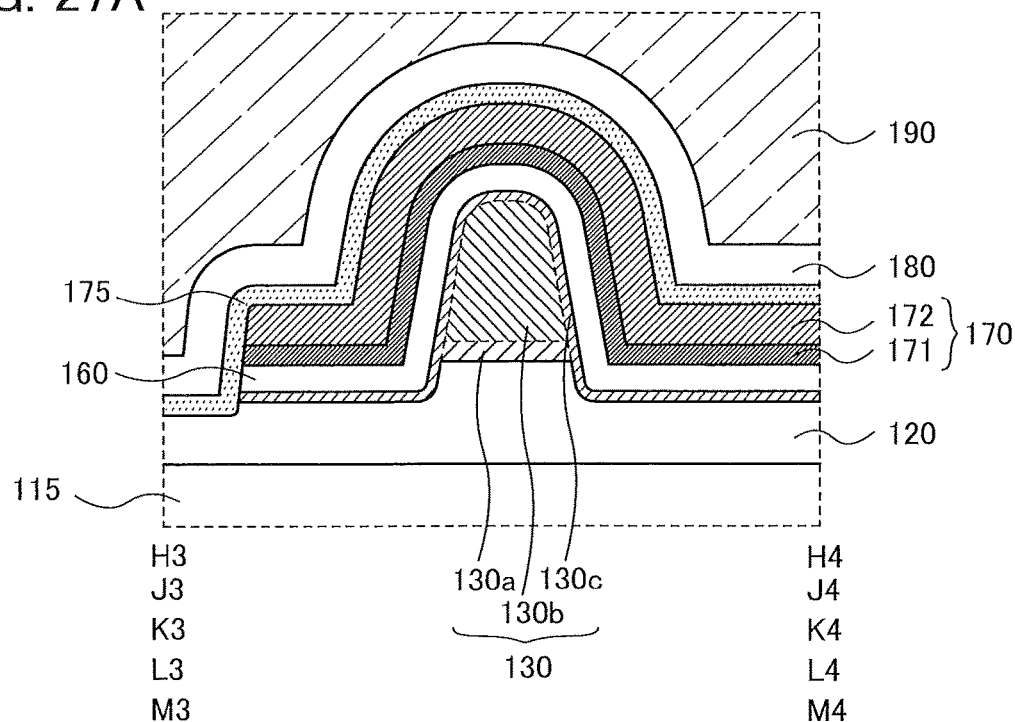
FIGS. 27A and 27B are cross-sectional views of transistors in the channel width direction.

The transistor of one embodiment of the present invention may have a structure illustrated in FIGS. 21A and 21B. FIG. 21A is a top view of a transistor 107. A cross section in the direction of a dashed-dotted line H1-H2 in FIG. 21A is illustrated in FIG. 21B. A cross section in the direction of a dashed-dotted line H3-H4 in FIG. 21A is illustrated in FIG. 27A. In some cases, the direction of the dashed-dotted line H1-H2 is referred to as a channel length direction, and the direction of the dashed-dotted line H3-H4 is referred to as a channel width direction.

The transistor 107 includes the insulating layer 120 in contact with the substrate 115; a stack of the oxide semiconductor layer 130a and the oxide semiconductor layer 130b, in contact with the insulating layer 120; the conductive layer 140 and the conductive layer 150 electrically connected to the stack; the oxide semiconductor layer 130c in contact with the stack, the conductive layer 140, and the conductive layer 150; the insulating layer 160 in contact with the oxide semiconductor layer 130c; the conductive layer 170 in contact with the insulating layer 160; the insulating layer 175 in contact with the conductive layer 140, the conductive layer 150, the oxide semiconductor layer 130c, the insulating layer 160, and the conductive layer 170; and the insulating layer 180 in contact with the insulating layer 175. The transistor 107 may also include, for example, the insulating layer 190 (planarization film) in contact with the insulating layer 180 as necessary.

The transistor 107 has the same structure as the transistor 101 except that the oxide semiconductor layer 130 includes two layers (the oxide semiconductor layer 130a and the oxide semiconductor layer 130b) in the region 231 and the region 232, that the oxide semiconductor layer 130 includes three layers (the oxide semiconductor layer 130a, the oxide semiconductor layer 130b, and the oxide semiconductor layer 130c) in the region 233, and that part of the oxide semiconductor layer (the oxide semiconductor layer 130c) exists between the insulating layer 160 and the conductive layers 140 and 150.

Figure 22A:
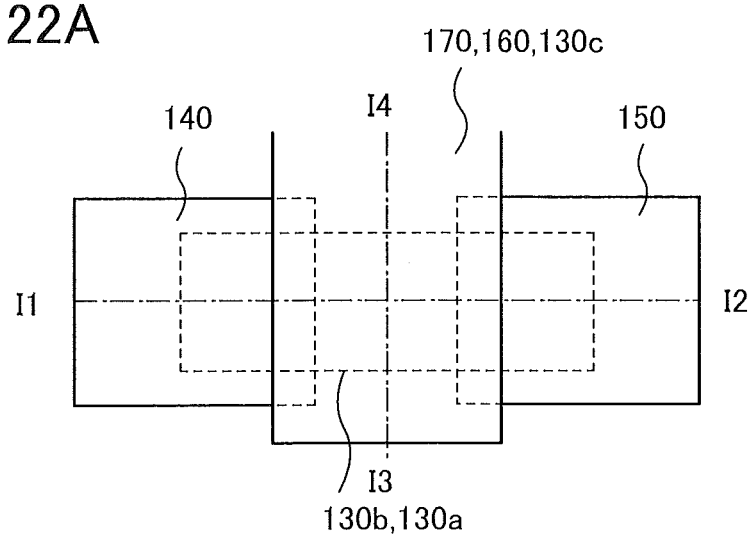
FIGS. 22A and 22B are a top view and a cross-sectional view illustrating a transistor.
Figure 22B:
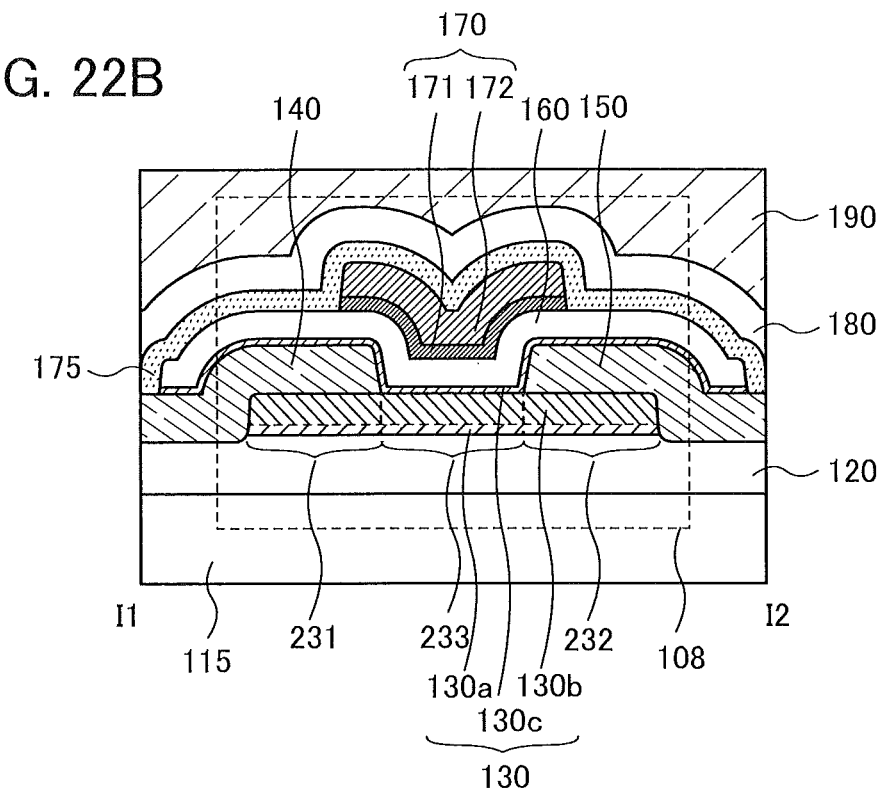
Figure 27B:
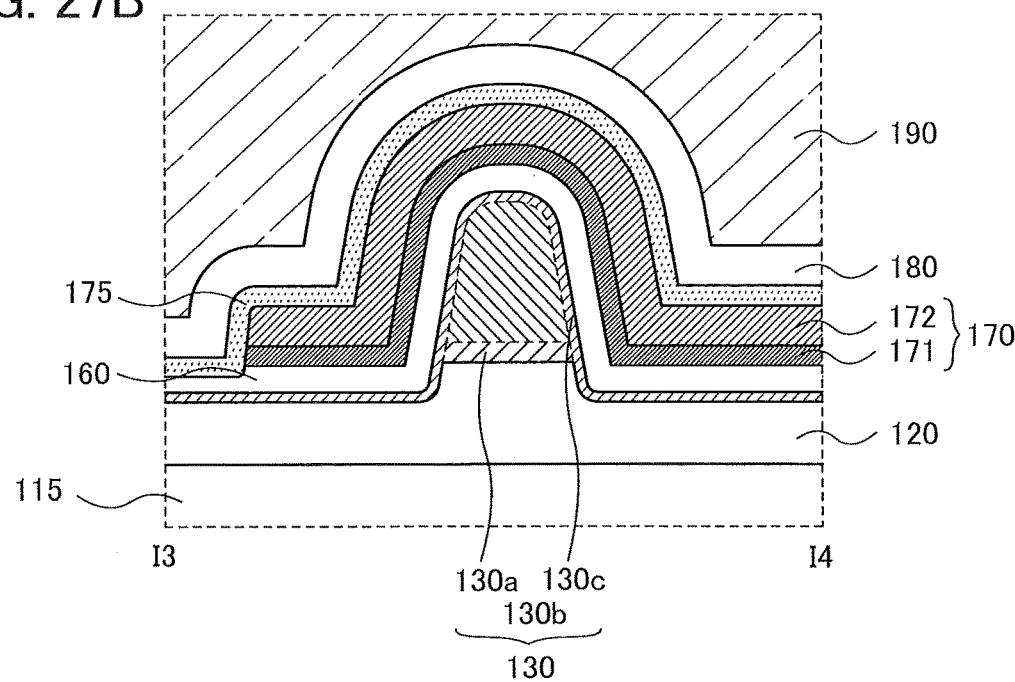
Figure 28A:
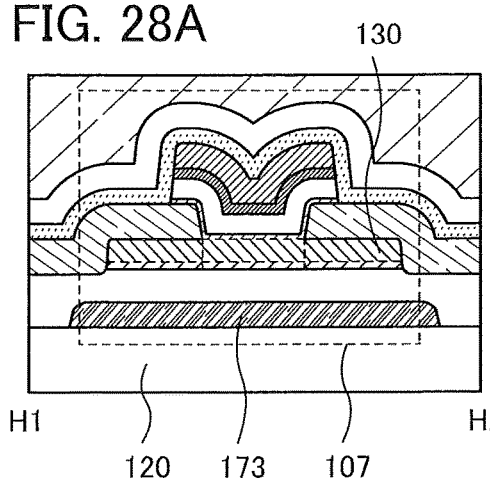
FIGS. 28A to 28F are each a cross-sectional view of a transistor in the channel length direction.
Figure 28B:
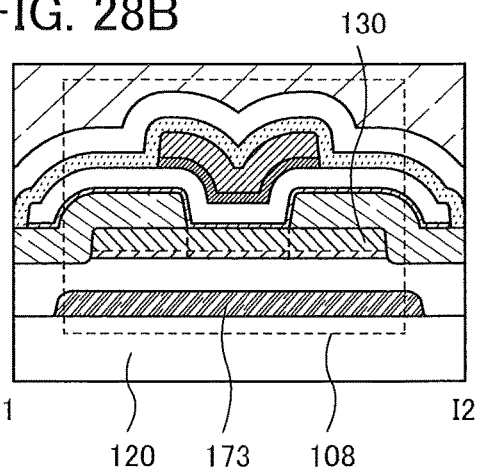
Figure 28C:
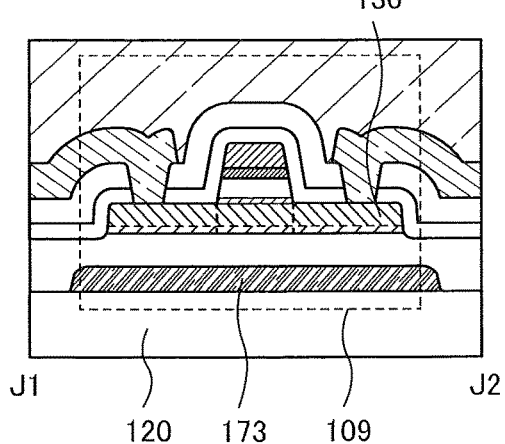
Figure 28D:
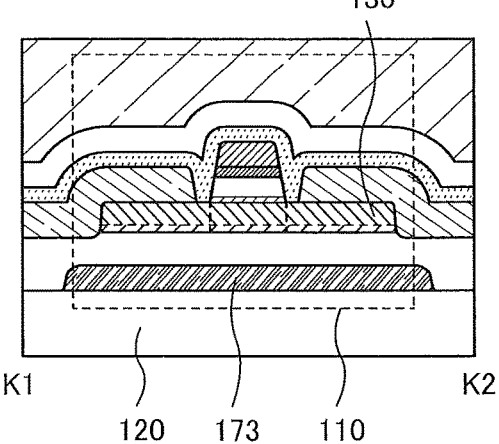
Figure 28E:
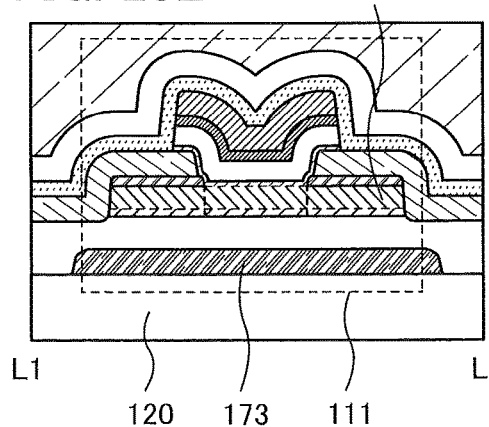
Figure 28F:
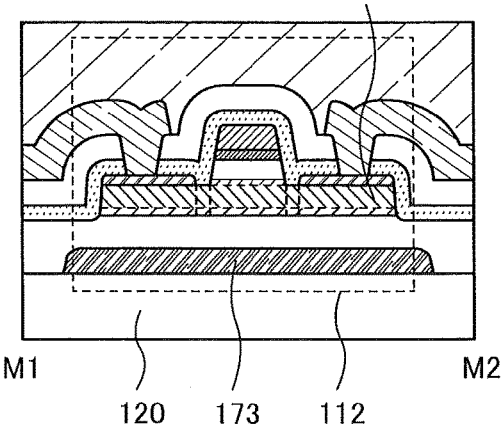

The transistor of one embodiment of the present invention may have a structure illustrated in FIGS. 22A and 22B. FIG. 22A is a top view of a transistor 108. A cross section in the direction of a dashed-dotted line 11-12 in FIG. 22A is illustrated in FIG. 22B. A cross section in the direction of a dashed-dotted line 13-14 in FIG. 22A is illustrated in FIG. 27B. In some cases, the direction of the dashed-dotted line 11-12 is referred to as a channel length direction, and the direction of the dashed-dotted line 13-14 is referred to as a channel width direction.

The transistor 108 has the same structure as the transistor 102 except that the oxide semiconductor layer 130 includes two layers (the oxide semiconductor layer 130a and the oxide semiconductor layer 130b) in the region 231 and the region 232, that the oxide semiconductor layer 130 includes three layers (the oxide semiconductor layer 130a, the oxide semiconductor layer 130b, and the oxide semiconductor layer 130c) in the region 233, and that part of the oxide semiconductor layer (the oxide semiconductor layer 130c) exists between the insulating layer 160 and the conductive layers 140 and 150.

Figure 23A:
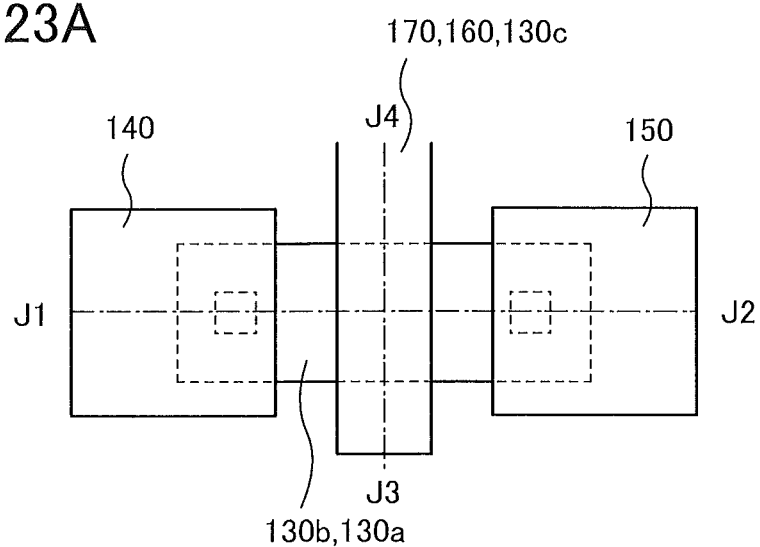
FIGS. 23A and 23B are a top view and a cross-sectional view illustrating a transistor.
Figure 23B:
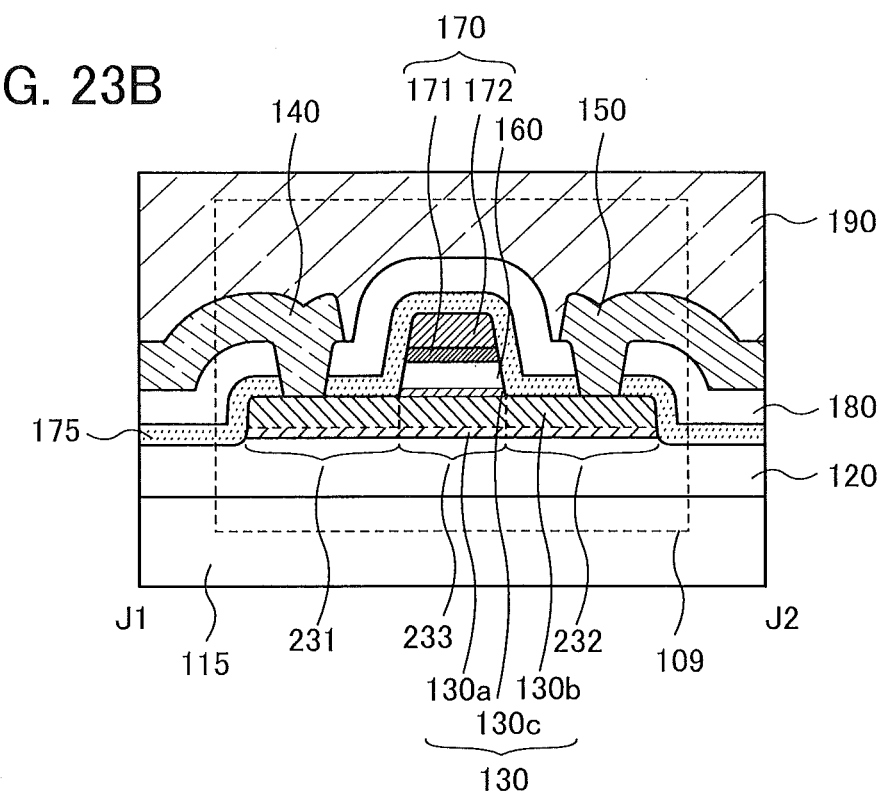

The transistor of one embodiment of the present invention may have a structure illustrated in FIGS. 23A and 23B. FIG. 23A is a top view of a transistor 109. A cross section in the direction of a dashed-dotted line J1-J2 in FIG. 23A is illustrated in FIG. 23B. A cross section in the direction of a dashed-dotted line J3-J4 in FIG. 23A is illustrated in FIG. 27A. In some cases, the direction of the dashed-dotted line J1-J2 is referred to as a channel length direction, and the direction of the dashed-dotted line J3-J4 is referred to as a channel width direction.

The transistor 109 includes the insulating layer 120 in contact with the substrate 115; a stack of the oxide semiconductor layer 130a and the oxide semiconductor layer 130b, in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layer 140 and the conductive layer 150 electrically connected to the stack through openings provided in the insulating layer 175 and the insulating layer 180. The transistor 109 may also include, for example, the insulating layer 190 (planarization film) in contact with the insulating layer 180, the conductive layer 140, and the conductive layer 150 as necessary.

The transistor 109 has the same structure as the transistor 103 except that the oxide semiconductor layer 130 includes two layers (the oxide semiconductor layer 130a and the oxide semiconductor layer 130b) in the region 231 and the region 232 and that the oxide semiconductor layer 130 includes three layers (the oxide semiconductor layer 130a, the oxide semiconductor layer 130b, and the oxide semiconductor layer 130c) in the region 233.

Figure 24A:
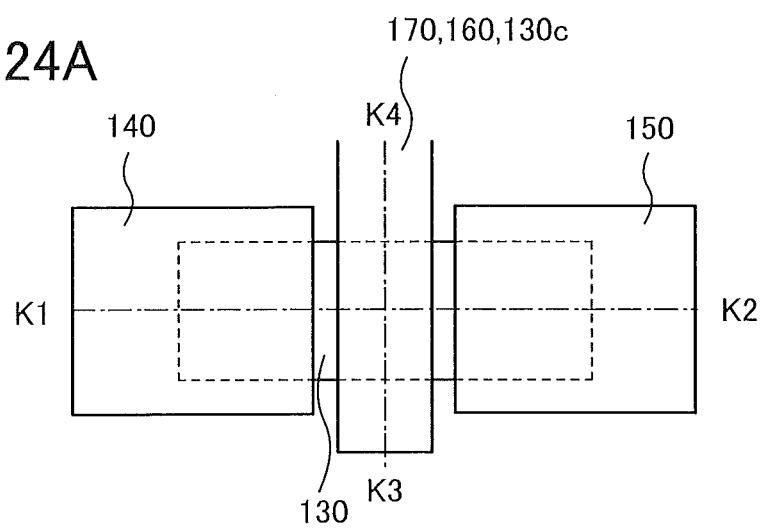
FIGS. 24A and 24B are a top view and a cross-sectional view illustrating a transistor.
Figure 24B:
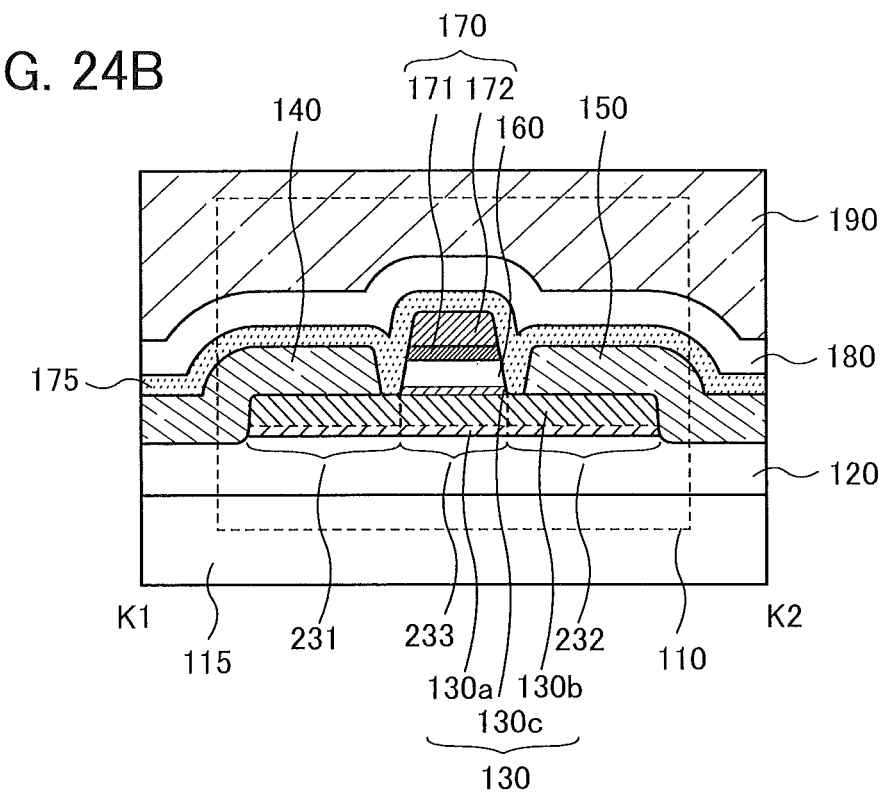

The transistor of one embodiment of the present invention may have a structure illustrated in FIGS. 24A and 24B. FIG. 24A is a top view of a transistor 110. A cross section in the direction of a dashed-dotted line K1-K2 in FIG. 24A is illustrated in FIG. 24B. A cross section in the direction of a dashed-dotted line K3-K4 in FIG. 24A is illustrated in FIG. 27A. In some cases, the direction of the dashed-dotted line K1-K2 is referred to as a channel length direction, and the direction of the dashed-dotted line K3-K4 is referred to as a channel width direction.

The transistor 110 has the same structure as the transistor 104 except that the oxide semiconductor layer 130 includes two layers (the oxide semiconductor layer 130a and the oxide semiconductor layer 130b) in the region 231 and region 232 and that the oxide semiconductor layer 130 includes three layers (the oxide semiconductor layer 130a, the oxide semiconductor layer 130b, and the oxide semiconductor layer 130c) in the region 233.

Figure 25A:
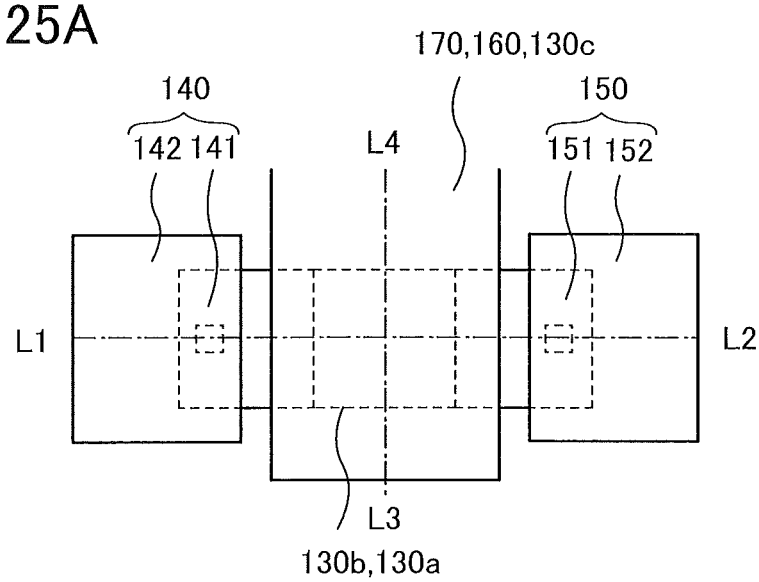
FIGS. 25A and 25B are a top view and a cross-sectional view illustrating a transistor.
Figure 25B:
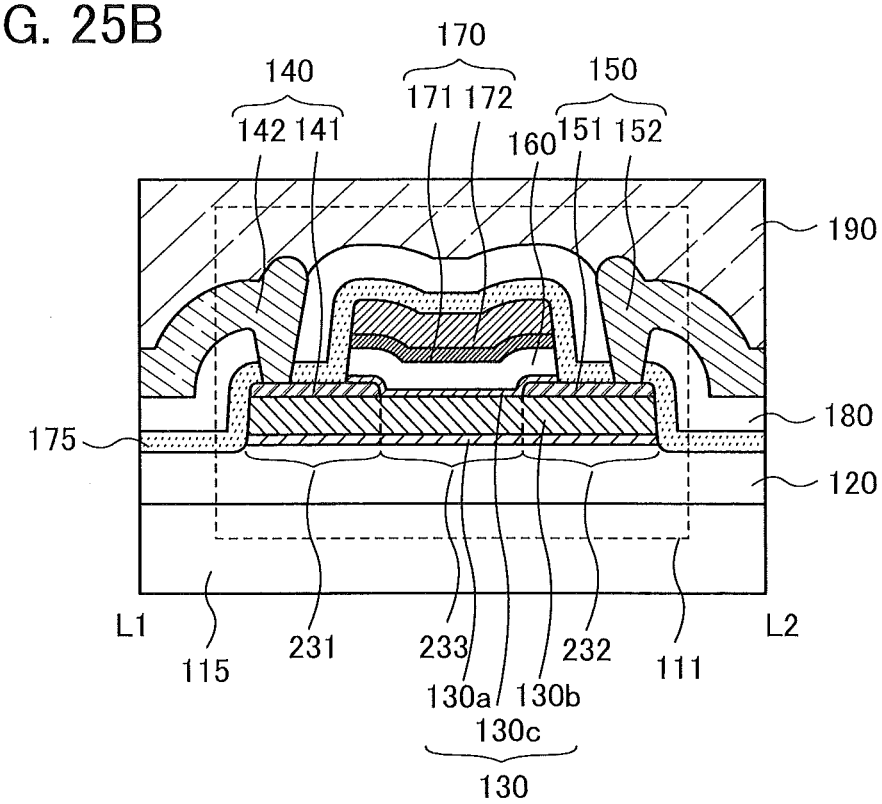

The transistor of one embodiment of the present invention may have a structure illustrated in FIGS. 25A and 25B. FIG. 25A is a top view of a transistor 111. A cross section in the direction of a dashed-dotted line L1-L2 in FIG. 25A is illustrated in FIG. 25B. A cross section in the direction of a dashed-dotted line L3-L4 in FIG. 25A is illustrated in FIG. 27A. In some cases, the direction of the dashed-dotted line L1-L2 is referred to as a channel length direction, and the direction of the dashed-dotted line L3-L4 is referred to as a channel width direction.

The transistor 111 includes the insulating layer 120 in contact with the substrate 115; a stack of the oxide semiconductor layer 130a and the oxide semiconductor layer 130b, in contact with the insulating layer 120; the conductive layer 141 and the conductive layer 151 electrically connected to the stack; the oxide semiconductor layer 130c in contact with the stack, the conductive layer 141, and the conductive layer 151; the insulating layer 160 in contact with the oxide semiconductor layer 130c; the conductive layer 170 in contact with the insulating layer 160; the insulating layer 175 in contact with the stack, the conductive layer 141, the conductive layer 151, the oxide semiconductor layer 130c, the insulating layer 160, and the conductive layer 170; the insulating layer 180 in contact with the insulating layer 175; and the conductive layer 142 and the conductive layer 152 electrically connected to the conductive layer 141 and the conductive layer 151, respectively, through openings provided in the insulating layer 175 and the insulating layer 180. The transistor 111 may also include, for example, the insulating layer 190 (planarization film) in contact with the insulating layer 180, the conductive layer 142, and the conductive layer 152 as necessary.

The transistor 111 has the same structure as the transistor 105 except that the oxide semiconductor layer 130 includes two layers (the oxide semiconductor layer 130a and the oxide semiconductor layer 130b) in the region 231 and the region 232, that the oxide semiconductor layer 130 includes three layers (the oxide semiconductor layer 130a, the oxide semiconductor layer 130b, and the oxide semiconductor layer 130c) in the region 233, and that part of the oxide semiconductor layer (the oxide semiconductor layer 130c) exists between the insulating layer 160 and the conductive layers 141 and 151.

Figure 26A:
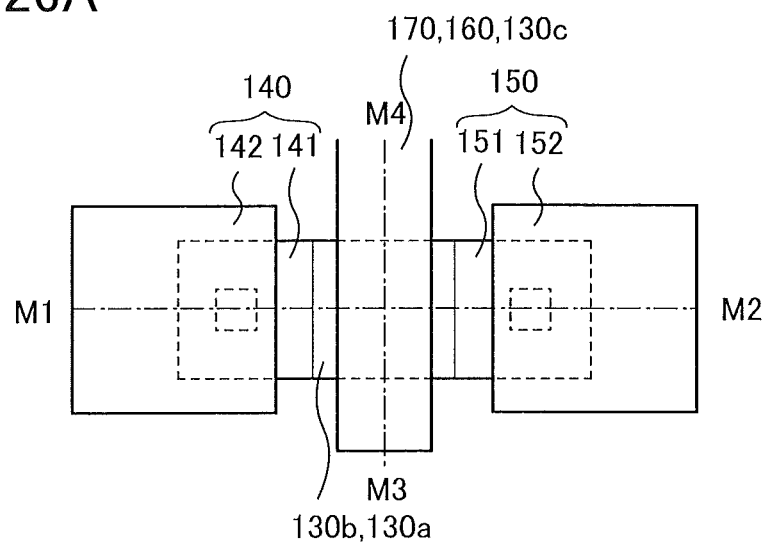
FIGS. 26A and 26B are a top view and a cross-sectional view illustrating a transistor.
Figure 26B:
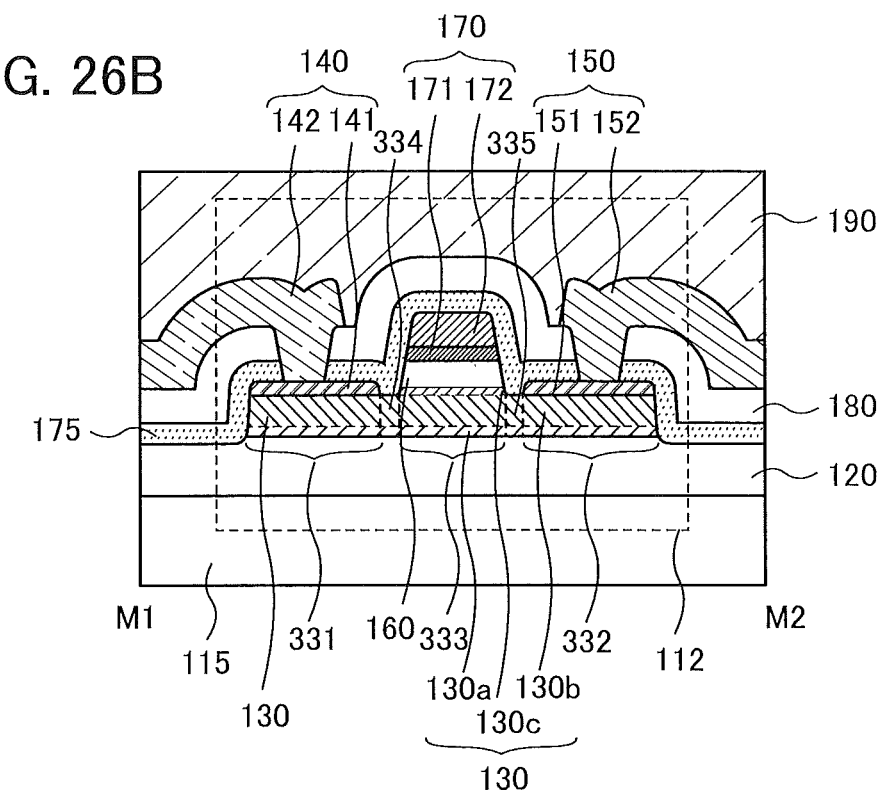

The transistor of one embodiment of the present invention may have a structure illustrated in FIGS. 26A and 26B. FIG. 26A is a top view of a transistor 112. A cross section in the direction of a dashed-dotted line M1-M2 in FIG. 26A is illustrated in FIG. 26B. A cross section in the direction of a dashed-dotted line M3-M4 in FIG. 26A is illustrated in FIG. 27A. In some cases, the direction of the dashed-dotted line M1-M2 is referred to as a channel length direction, and the direction of the dashed-dotted line M3-M4 is referred to as a channel width direction.

The transistor 112 has the same structure as the transistor 106 except that the oxide semiconductor layer 130 includes two layers (the oxide semiconductor layer 130a and the oxide semiconductor layer 130b) in the region 331, the region 332, the region 334, and the region 335 and that the oxide semiconductor layer 130 includes three layers (the oxide semiconductor layer 130a, the oxide semiconductor layer 130b, and the oxide semiconductor layer 130c) in the region 333.

Figure 29A:
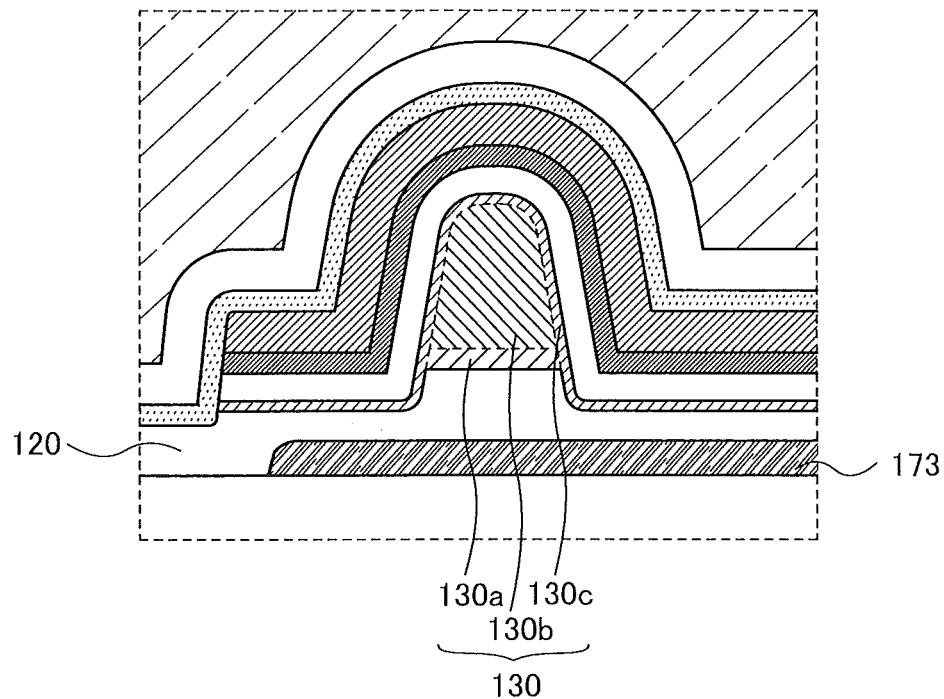
FIGS. 29A and 29B are cross-sectional views of transistors in the channel width direction.
Figure 29B:
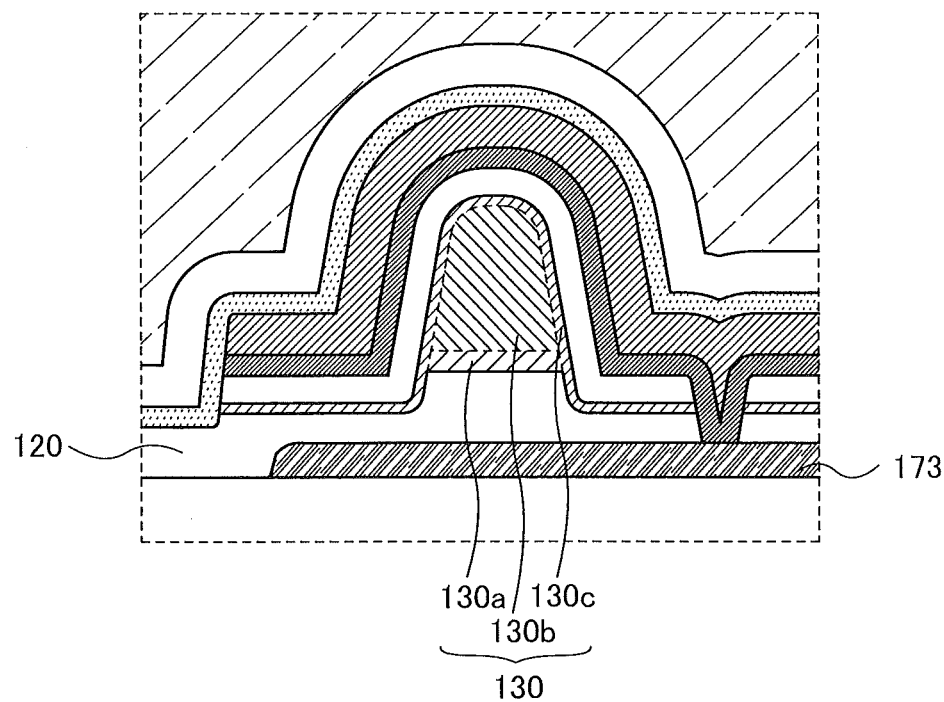

The transistor of one embodiment of the present invention may include the conductive layer 173 between the oxide semiconductor layer 130 and the substrate 115 as illustrated in the cross-sectional views in the channel length direction in FIGS. 28A to 28F and the cross-sectional views in the channel width direction in FIGS. 29A and 29B. When the conductive layer is used as a second gate electrode layer (back gate), the on-state current can be increased or the threshold voltage can be controlled. In the cross-sectional views in FIGS. 28A to 28F, the width of the conductive layer 173 may be shorter than that of the oxide semiconductor layer 130. Moreover, the width of the conductive layer 173 may be shorter than that of the conductive layer 170.

Figure 30A:
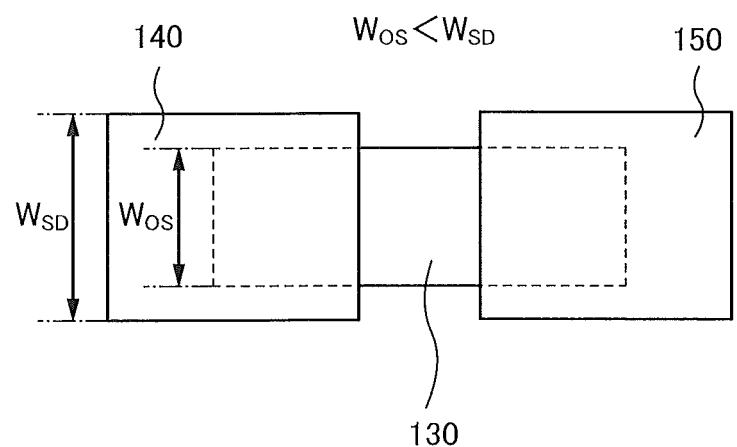
FIGS. 30A and 30B are top views illustrating transistors.
Figure 30B:
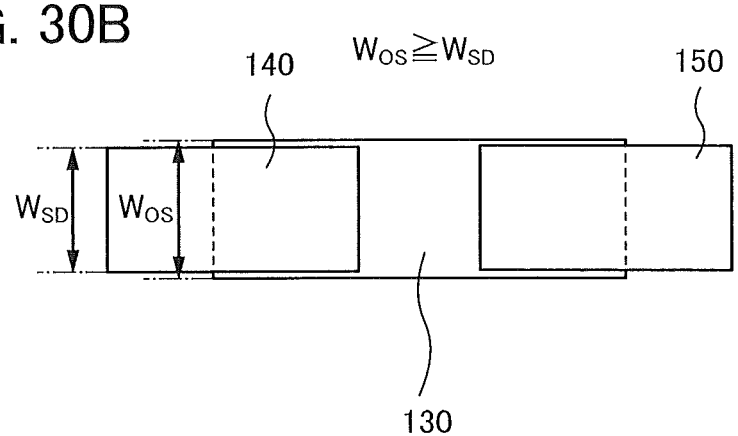

Furthermore, as shown in the top views in FIGS. 30A and 30B (showing only the oxide semiconductor layer 130, the conductive layer 140, and the conductive layer 150), the width ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer 130. When $W_{OS} \le W_{SD}$ ($W_{SD}$ is less than or equal to $W_{OS}$) is satisfied, a gate electric field is easily applied to the entire oxide semiconductor layer 130, so that electrical characteristics of the transistor can be improved.

In the transistor of one embodiment of the present invention (any of the transistors 101 to 112), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layer 130a and the oxide semiconductor layer 130b and the transistor including the oxide semiconductor layer 130a, the oxide semiconductor layer 130b, and the oxide semiconductor layer 130c, selecting appropriate materials for the two or three layers forming the oxide semiconductor layer 130 allows current to flow in the oxide semiconductor layer 130b. Since current flows in the oxide semiconductor layer 130b, the current is hardly influenced by interface scattering, leading to a high on-state current. Note that increasing the thickness of the oxide semiconductor layer 130b can increase the on-state current. The thickness of the oxide semiconductor layer 130b may be, for example, 100 nm to 200 nm.

A semiconductor device using a transistor with any of the above structures can have favorable electrical characteristics.

Note that in this specification, the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

The structure described in this embodiment can be used in appropriate combination with any of the structures described in the other embodiments.

Embodiment 3

In this embodiment, components of the transistors described in Embodiment 2 are described in detail.

The substrate 115 corresponds to the structure including the silicon substrate 40, the insulating layer 81, the insulating layer 82, and the insulating layer 83 in FIG. 1A. Note that only p-channel transistors are formed using the silicon substrate; accordingly, a silicon substrate with n⁻-type conductivity is preferably used. It is also possible to use an SOI substrate including an n⁻-type or i-type silicon layer. A surface of the silicon substrate where the transistor is formed preferably has a (110) plane orientation. Forming a p-channel transistor using a silicon substrate having the (110) plane on the surface can increase the mobility.

The insulating layer 120 corresponds to the insulating layer 84 in FIG. 1A. The insulating layer 120 can have a function of supplying oxygen to the oxide semiconductor layer 130 as well as a function of preventing diffusion of impurities from the substrate 115. For this reason, the insulating layer 120 is preferably an insulating film containing oxygen and further preferably, the insulating layer 120 is an insulating film containing oxygen in which the oxygen content is higher than that in the stoichiometric composition. For example, the insulating layer 120 is a film of which the amount of released oxygen when converted into oxygen atoms is $1.0 \times 10^{19}$ atoms/cm$^3$ or more in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C. In the case where the substrate 115 is provided with another device as described above, the insulating layer 120 also has a function as an interlayer insulating film. In that case, the insulating layer 120 is preferably subjected to planarization treatment such as chemical mechanical polishing (CMP) treatment so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film including silicon nitride, silicon nitride oxide, aluminum nitride, aluminum nitride oxide, or the like, or a mixed material of any of these. The insulating layer 120 may be a stack of any of the above materials.

In this embodiment, detailed description is given mainly on the case where the oxide semiconductor layer 130 of the transistor has a three-layer structure in which the oxide semiconductor layer 130a, the oxide semiconductor layer 130b, and the oxide semiconductor layer 130c are stacked in this order from the insulating layer 120 side.

Note that in the case where the oxide semiconductor layer 130 is a single layer, a layer corresponding to the oxide semiconductor layer 130b is used.

In the case where the oxide semiconductor layer 130 has a two-layer structure, a stack in which a layer corresponding to the oxide semiconductor layer 130a and a layer corresponding to the oxide semiconductor layer 130b are stacked in this order from the insulating layer 120 side is used. In such a case, the oxide semiconductor layer 130a and the oxide semiconductor layer 130b can be replaced with each other.

In the case where the oxide semiconductor layer 130 has a stacked-layer structure of four or more layers, for example, a structure in which another oxide semiconductor layer is stacked over the three-layer stack of the oxide semiconductor layer 130 described in this embodiment or a structure in which another oxide semiconductor layer is inserted in any one of the interfaces in the three-layer stack can be employed.

For the oxide semiconductor layer 130b, for example, an oxide semiconductor whose electron affinity (an energy difference between a vacuum level and the conduction band minimum) is higher than those of the oxide semiconductor layer 130a and the oxide semiconductor layer 130c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layer 130a and the oxide semiconductor layer 130c each contain one or more kinds of metal elements contained in the oxide semiconductor layer 130b. For example, the oxide semiconductor layer 130a and the oxide semiconductor layer 130c are preferably formed using an oxide semiconductor whose conduction band minimum is closer to a vacuum level than that of the oxide semiconductor layer 130b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 170, a channel is formed in the oxide semiconductor layer 130b whose conduction band minimum is the lowest in the oxide semiconductor layer 130.

Further, since the oxide semiconductor layer 130a contains one or more kinds of metal elements contained in the oxide semiconductor layer 130b, an interface state is unlikely to be formed at the interface between the oxide semiconductor layer 130b and the oxide semiconductor layer 130a, compared with the interface between the oxide semiconductor layer 130b and the insulating layer 120 on the assumption that the oxide semiconductor layer 130b is in contact with the insulating layer 120. The interface state sometimes forms a channel; therefore, the threshold voltage of the transistor is changed in some cases. Thus, with the oxide semiconductor layer 130a, fluctuations in electrical characteristics of the transistor, such as a threshold voltage, can be reduced. Further, the reliability of the transistor can be improved.

Furthermore, since the oxide semiconductor layer 130c contains one or more kinds of metal elements contained in the oxide semiconductor layer 130b, scattering of carriers is unlikely to occur at the interface between the oxide semiconductor layer 130b and the oxide semiconductor layer 130c, compared with the interface between the oxide semiconductor layer 130b and the gate insulating film (insulating layer 160) on the assumption that the oxide semiconductor layer 130b is in contact with the gate insulating film. Thus, with the oxide semiconductor layer 130c, the field-effect mobility of the transistor can be increased.

For the oxide semiconductor layer 130a and the oxide semiconductor layer 130c, for example, a material containing Al, Ti, Ga, Ge, Y, Zr, Sn, La, Ce, or Hf with a higher atomic ratio than that used for the oxide semiconductor layer 130b can be used. Specifically, an atomic ratio of any of the above metal elements in the oxide semiconductor layer 130a and the oxide semiconductor layer 130c is 1.5 times or more, preferably 2 times or more, further preferably 3 times or more as much as that in the oxide semiconductor layer 130b. Any of the above metal elements is strongly bonded to oxygen and thus has a function of suppressing generation of an oxygen vacancy in the oxide semiconductor layer 130a and the oxide semiconductor layer 130c. That is, an oxygen vacancy is less likely to be generated in the oxide semiconductor layer 130a and the oxide semiconductor layer 130c than in the oxide semiconductor layer 130b.

An oxide semiconductor that can be used for each of the oxide semiconductor layers 130a, 130b, and 130c preferably contains at least indium (In) or zinc (Zn). Both In and Zn are preferably contained. In order to reduce fluctuations in electrical characteristics of the transistor including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, "In—Ga—Zn oxide" means an oxide containing In, Ga, and Zn as its main components. The In—Ga—Zn oxide may contain another metal element in addition to In, Ga, and Zn. Note that in this specification, a film containing the In—Ga—Zn oxide is also referred to as an IGZO film.

A material represented by $InMO_3(ZnO)_m$ (m>0 is satisfied, and m is not an integer) may be used. Note that M represents one or more metal elements selected from Ga, Y, Zr, La, Ce, and Nd. Alternatively, a material represented by $In_2SnO_5(ZnO)_n$ (n>0, n is an integer) may be used.

Note that when each of the oxide semiconductor layer 130a, the oxide semiconductor layer 130b, and the oxide semiconductor layer 130c is an In-M-Zn oxide containing at least indium, zinc, and M (M is a metal such as Al, Ti, Ga, Ge, Y, Zr, Sn, La, Ce, or Hf), and when the oxide semiconductor layer 130a has an atomic ratio of In to M and Zn which is $x_1:y_1:z_1$, the oxide semiconductor layer 130b has an atomic ratio of In to M and Zn which is $x_2:y_2:z_2$, and the oxide semiconductor layer 130c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when $y_2$ is greater than or equal to $x_2$ in the oxide semiconductor layer 130b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layer 130a and the oxide semiconductor layer 130c are preferably less than 50 atomic % and greater than or equal to 50 atomic %, respectively, further preferably less than 25 atomic % and greater than or equal to 75 atomic %, respectively. In the case where Zn and O are not taken into consideration, the proportion of In and the proportion of M in the oxide semiconductor layer 130b are preferably greater than or equal to 25 atomic % and less than 75 atomic %, respectively, further preferably greater than or equal to 34 atomic % and less than 66 atomic %, respectively.

The indium content in the oxide semiconductor layer 130b is preferably higher than those in the oxide semiconductor layers 130a and 130c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of M has higher mobility than an oxide having a composition in which the proportion of In is equal to or lower than that of M. Thus, with the use of an oxide having a high content of indium for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm, further preferably greater than or equal to 5 nm and less than or equal to 25 nm. The thickness of the oxide semiconductor layer 130b is greater than or equal to 3 nm and less than or equal to 200 nm, preferably greater than or equal to 10 nm and less than or equal to 150 nm, further preferably greater than or equal to 15 nm and less than or equal to 100 nm. The thickness of the oxide semiconductor layer 130c is greater than or equal to 1 nm and less than or equal to 50 nm, preferably greater than or equal to 2 nm and less than or equal to 30 nm, further preferably greater than or equal to 3 nm and less than or equal to 15 nm. In addition, the oxide semiconductor layer 130b is preferably thicker than the oxide semiconductor layer 130a and the oxide semiconductor layer 130c.

Note that in order that a transistor in which an oxide semiconductor layer serves as a channel have stable electrical characteristics, it is effective to reduce the concentration of impurities in the oxide semiconductor layer to make the oxide semiconductor layer intrinsic (i-type) or substantially intrinsic. The term "substantially intrinsic" refers to the state where an oxide semiconductor layer has a carrier density lower than $1\times10^{17}/cm^3$, preferably lower than $1\times10^{15}/cm^3$, further preferably lower than $1\times10^{13}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density. In addition, silicon in the oxide semiconductor layer forms an impurity level. The impurity level serves as a trap and might cause deterioration of electrical characteristics of the transistor. Accordingly, in the oxide semiconductor layer 130a, the oxide semiconductor layer 130b, and the oxide semiconductor layer 130c and at interfaces between these layers, the impurity concentration is preferably reduced.

In order to make the oxide semiconductor layer intrinsic or substantially intrinsic, in secondary ion mass spectrometry (SIMS), for example, the concentration of silicon at a certain depth of the oxide semiconductor layer or in a region of the oxide semiconductor layer is lower than $1\times10^{19}$ atoms/cm$^3$, preferably lower than $5\times10^{18}$ atoms/cm$^3$, further preferably lower than $1\times10^{18}$ atoms/cm$^3$. Further, the concentration of hydrogen at a certain depth of the oxide semiconductor layer or in a region of the oxide semiconductor layer is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Further, the concentration of nitrogen at a certain depth of the oxide semiconductor layer or in a region of the oxide semiconductor layer is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer may be lower than $1\times10^{19}$ atoms/cm$^3$, preferably lower than $5\times10^{18}$ atoms/cm$^3$, further preferably lower than $1\times10^{18}$ atoms/cm$^3$. Further, the concentration of carbon at a certain depth of the oxide semiconductor layer or in a region of the oxide semiconductor layer may be lower than $1\times10^{19}$ atoms/cm$^3$, preferably lower than $5\times10^{18}$ atoms/cm$^3$, further preferably lower than $1\times10^{18}$ atoms/cm$^3$, for example.

A transistor in which a highly purified oxide semiconductor film is used for a channel formation region as described above has an extremely low off-state current. For example, in the case where the voltage between the source and the drain is set to approximately 0.1 V, 5 V, or 10 V, the off-state current standardized on the channel width of the transistor can be as low as several yoctoamperes per micrometer to several zeptoamperes per micrometer.

Note that as the gate insulating film of the transistor, an insulating film containing silicon is used in many cases; thus, it is preferable that, as in the transistor of one embodiment of the present invention, a region of the oxide semiconductor layer, which serves as a channel, not be in contact with the gate insulating film for the above-described reason. In the case where a channel is formed at the interface between the gate insulating film and the oxide semiconductor layer, scattering of carriers occurs at the interface, whereby the field-effect mobility of the transistor is reduced in some cases. Also from the view of the above, it is preferable that the region of the oxide semiconductor layer, which serves as a channel, be separated from the gate insulating film.

Accordingly, with the oxide semiconductor layer 130 having a stacked-layer structure including the oxide semiconductor layer 130a, the oxide semiconductor layer 130b, and the oxide semiconductor layer 130c, a channel can be faulted in the oxide semiconductor layer 130b; thus, the transistor can have a high field-effect mobility and stable electrical characteristics.

In a band structure, the conduction band minimums of the oxide semiconductor layer 130a, the oxide semiconductor layer 130b, and the oxide semiconductor layer 130c are continuous. This can be understood also from the fact that the compositions of the oxide semiconductor layer 130a, the oxide semiconductor layer 130b, and the oxide semiconductor layer 130c are close to one another and oxygen is easily diffused among the oxide semiconductor layer 130a, the oxide semiconductor layer 130b, and the oxide semiconductor layer 130c. Thus, the oxide semiconductor layer 130a, the oxide semiconductor layer 130b, and the oxide semiconductor layer 130c have a continuous physical property although they have different compositions and form a stack. In the drawings, interfaces between the oxide semiconductor layers of the stack are indicated by dotted lines.

The oxide semiconductor layer 130 in which layers containing the same main components are stacked is formed to have not only a simple stacked-layer structure of the layers but also a continuous energy band (here, in particular, a well structure having a U shape in which the conduction band minimums are continuous (U-shape well)). In other words, the stacked-layer structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layer 130a and the oxide semiconductor layer 130c, and an In—Ga—Zn oxide whose atomic ratio of In to Ga and Zn is 1:1:1, 2:1:3, 5:5:6, 3:1:2, or 4:2:4.1 can be used for the oxide semiconductor layer 130b. In each of the oxide semiconductor layers 130a, 130b, and 130c, the proportion of each atom in the atomic ratio varies within a range of ±40% as an error.

The oxide semiconductor layer 130b of the oxide semiconductor layer 130 serves as a well, so that a channel is formed in the oxide semiconductor layer 130b in a transistor including the oxide semiconductor layer 130. Note that since the conduction band minimums are continuous, the oxide semiconductor layer 130 can also be referred to as a U-shaped well. Further, a channel formed to have such a structure can also be referred to as a buried channel.

Note that trap levels due to impurities or defects might be formed in the vicinity of the interface between an insulating layer such as a silicon oxide film and each of the oxide semiconductor layer 130a and the oxide semiconductor layer 130c. The oxide semiconductor layer 130b can be distanced away from the trap levels owing to existence of the oxide semiconductor layer 130a and the oxide semiconductor layer 130c.

However, when the energy differences between the conduction band minimum of the oxide semiconductor layer 130b and the conduction band minimum of each of the oxide semiconductor layer 130a and the oxide semiconductor layer 130c are small, an electron in the oxide semiconductor layer 130b might reach the trap level by passing over the energy differences. When the electron is trapped in the trap level, a negative charge is generated at the interface with the insulating layer, whereby the threshold voltage of the transistor is shifted in the positive direction.

Thus, to reduce fluctuations in the threshold voltage of the transistor, energy differences of at least certain values between the conduction band minimum of the oxide semiconductor layer 130b and the conduction band minimum of each of the oxide semiconductor layer 130a and the oxide semiconductor layer 130c are necessary. Each of the energy differences is preferably greater than or equal to 0.1 eV, further preferably greater than or equal to 0.15 eV.

The oxide semiconductor layer 130a, the oxide semiconductor layer 130b, and the oxide semiconductor layer 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point and thus allows subsequent process temperatures to be relatively high. It is also possible to use a stack of any of the above materials and Cu or an alloy such as Cu—Mn, which has low resistance. Note that in the transistors 105, 106, 111, and 112, for example, it is possible to use W for the conductive layer 141 and the conductive layer 151 and use a stack of Ti and Al for the conductive layer 142 and the conductive layer 152.

The above materials are capable of extracting oxygen from an oxide semiconductor film. Therefore, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, whereby the region is markedly changed to an n-type region. Accordingly, the n-type region can serve as a source or a drain of the transistor.

In the case where W is used for the conductive layer 140 and the conductive layer 150, the conductive layer 140 and the conductive layer 150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layer 140 and the conductive layer 150 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain lanthanum (La), nitrogen, or zirconium (Zr) as an impurity.

An example of a stacked-layer structure of the insulating layer 160 will be described. The insulating layer 160 includes, for example, oxygen, nitrogen, silicon, or hafnium Specifically, the insulating layer 160 preferably includes hafnium oxide and silicon oxide or silicon oxynitride.

Hafnium oxide and aluminum oxide have higher dielectric constant than silicon oxide and silicon oxynitride. Therefore, by using hafnium oxide or aluminum oxide, a physical thickness can be made larger than an equivalent oxide thickness; thus, even in the case where the equivalent oxide thickness is less than or equal to 10 nm or less than or equal to 5 nm, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

For the insulating layer 120 and the insulating layer 160 in contact with the oxide semiconductor layer 130, a film that releases less nitrogen oxide is preferably used. In the case where the oxide semiconductor is in contact with an insulating layer that releases a large amount of nitrogen oxide, the density of states due to nitrogen oxide in the energy gap of the oxide semiconductor becomes high in some cases. For the insulating layer 120 and the insulating layer 160, for example, an oxide insulating layer such as a silicon oxynitride film or an aluminum oxynitride film that releases less nitrogen oxide can be used.

Note that a silicon oxynitride film that releases less nitrogen oxide is a film of which the amount of released ammonia is larger than the amount of released nitrogen oxide in TDS analysis; the amount of released ammonia is typically greater than or equal to $1\times10^{28}$ molecules/cm$^3$ and less than or equal to $5\times10^{19}$ molecules/cm$^3$. Note that the temperature of the film surface in the TDS analysis is preferably higher than or equal to 50° C. and lower than or equal to 650° C., or higher than or equal to 50° C. and lower than or equal to 550° C.

By using the above oxide insulating layer for the insulating layer 120 and the insulating layer 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, W, or the like can be used. It is also possible to use an alloy or a conductive nitride of any of these materials. It is also possible to use a stack of a plurality of materials selected from these materials, alloys of these materials, and conductive nitrides of these materials. Typically, tungsten, a stack of tungsten and titanium nitride, a stack of tungsten and tantalum nitride, or the like can be used. It is also possible to use Cu or an alloy such as Cu—Mn, which has low resistance, or a stack of any of the above materials and Cu or an alloy such as Cu—Mn. In this embodiment, tantalum nitride is used for the conductive layer 171 and tungsten is used for the conductive layer 172 to form the conductive layer 170.

As the insulating layer 175, a silicon nitride film, an aluminum nitride film, or the like containing hydrogen can be used. In the transistors 103, 104, 106, 109, 110, and 112 described in Embodiment 2, using an insulating film containing hydrogen as the insulating layer 175 allows the oxide semiconductor layer to be partly changed to n-type. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 2. The aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture, which cause variations in the electrical characteristics of the transistor, into the oxide semiconductor layer 130, preventing release of oxygen, which is a main component of the oxide semiconductor layer 130, from the oxide semiconductor layer, and preventing unnecessary release of oxygen from the insulating layer 120. Further, oxygen contained in the aluminum oxide film can be diffused into the oxide semiconductor layer.

Further, the insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with the oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. A decrease in channel width causes a reduction in on-state current.

In the transistors 107 to 112 of embodiments of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor of one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in the side surface direction in addition to the perpendicular direction. In other words, a gate electric field is applied to the entire channel formation layer and an effective channel width is increased, leading to a further increase in the on-state current.

Furthermore, in the transistor of one embodiment of the present invention in which the oxide semiconductor layer 130 has a two-layer structure or a three-layer structure, since the oxide semiconductor layer 130b where a channel is formed is provided over the oxide semiconductor layer 130a, an effect of making an interface state less likely to be formed is obtained. In the transistor of one embodiment of the present invention in which the oxide semiconductor layer 130 has a three-layer structure, since the oxide semiconductor layer 130b is positioned at the middle of the three-layer structure, an effect of eliminating the influence of an impurity that enters from upper and lower layers on the oxide semiconductor layer 130b is obtained as well. Therefore, the transistor can achieve not only the increase in the on-state current of the transistor but also stabilization of the threshold voltage and a reduction in the S value (subthreshold value). Thus, Icut (current when gate voltage VG is 0 V) can be reduced and power consumption can be reduced. Further, since the threshold voltage of the transistor becomes stable, long-term reliability of the semiconductor device can be improved. In addition, the transistor of one embodiment of the present invention is suitable for a highly integrated semiconductor device because deterioration of electrical characteristics due to miniaturization is reduced.

The structure described in this embodiment can be used in appropriate combination with any of the structures described in the other embodiments.

Embodiment 4

In this embodiment, methods for manufacturing the transistors 101, 107, and 111 described in Embodiment 2 are described.

First, an example of a method for manufacturing a silicon transistor included in the substrate 115 is described. An n⁻-type single crystal silicon substrate is used as a silicon substrate, and an element formation region isolated with an insulating layer (also referred to as a field oxide film) is formed in the surface. The element formation region can be formed by local oxidation of silicon (LOCOS), shallow trench isolation (STI), or the like.

Here, the substrate is not limited to the single crystal silicon substrate. A silicon on insulator (SOI) substrate or the like can be used as well.

Next, a gate insulating film is formed so as to cover the element formation region. For example, a silicon oxide film is formed by oxidation of a surface of the element formation region by heat treatment. Furthermore, after the silicon oxide film is formed, a surface of the silicon oxide film may be nitrided by nitriding treatment.

Next, a conductive film is formed so as to cover the gate insulating film. The conductive film can be formed using an element selected from tantalum (Ta), tungsten (W), titanium (Ti), molybdenum (Mo), aluminum (Al), copper (Cu), chromium (Cr), niobium (Nb), and the like, or an alloy material or a compound material containing such an element as a main component. Alternatively, a metal nitride film obtained by nitridation of any of these elements can be used. Alternatively, a semiconductor material typified by polycrystalline silicon doped with an impurity element such as phosphorus can be used.

Then, the conductive film is selectively etched, whereby a gate electrode layer is formed over the gate insulating film.

Next, an insulating film such as a silicon oxide film or a silicon nitride film is formed to cover the gate electrode layer and etch back is performed, whereby sidewalls are foinied on side surfaces of the gate electrode layer.

Next, a resist mask is selectively formed so as to cover regions except the element formation region, and an impurity element is added with the use of the resist mask and the gate electrode layer as masks, whereby pt-type impurity regions are formed. Here, in order to form a p-channel transistor, an impurity element imparting p-type conductivity such as boron (B) or gallium (Ga) can be used as the impurity element.

Through the above steps, a p-channel transistor including an active region in the silicon substrate is completed. Note that a passivation film such as a silicon nitride film or an aluminum oxide film is preferably formed over the transistor.

Next, an interlayer insulating film is formed over the silicon substrate where the transistor is formed, and contact plugs and wirings are formed. In addition, as described in Embodiment 1, an insulating layer made of aluminum oxide or the like for preventing diffusion of hydrogen is formed. The substrate 115 includes the silicon substrate where the transistor is formed and the interlayer insulating film and the like formed over the silicon substrate.

A method for manufacturing the transistor 101 is described with reference to FIGS. 31A to 31C and FIGS. 32A to 32C. A cross section of the transistor in the channel length direction is shown on the left side, and a cross section of the transistor in the channel width direction is shown on the right side. The cross-sectional views in the channel width direction are enlarged views; therefore, components on the left side and those on the right side differ in apparent thickness.

The case where the oxide semiconductor layer 130 has a three-layer structure of the oxide semiconductor layer 130*a*, the oxide semiconductor layer 130*b*, and the oxide semiconductor layer 130*c* is described as an example. In the case where the oxide semiconductor layer 130 has a two-layer structure, the oxide semiconductor layer 130*a* and the oxide semiconductor layer 130*b* are used. In the case where the oxide semiconductor layer 130 has a single-layer structure, the oxide semiconductor layer 130*b* is used.

First, the insulating layer 120 is formed over the substrate 115. Embodiment 3 can be referred to for description of the kinds of the substrate 115 and a material used for the insulating layer 120. The insulating layer 120 can be formed by a sputtering method, a CVD method, a molecular beam epitaxy (MBE) method, or the like.

Oxygen may be added to the insulating layer 120 by an ion implantation method, an ion doping method, a plasma immersion ion implantation method, plasma treatment, or the like. Adding oxygen enables the insulating layer 120 to supply oxygen much easily to the oxide semiconductor layer 130.

In the case where a surface of the substrate 115 is made of an insulator and there is no influence of impurity diffusion to the oxide semiconductor layer 130 to be formed later, the insulating layer 120 is not necessarily provided.

Figure 31A:
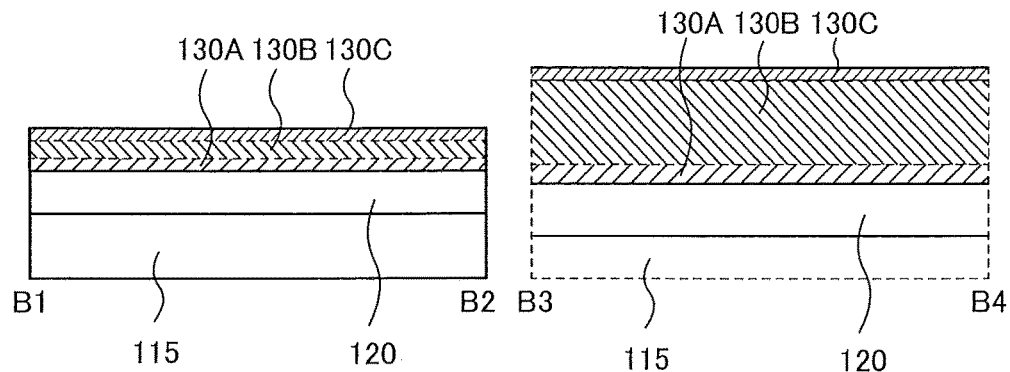
FIGS. 31A to 31C illustrate a method for manufacturing a transistor.

Next, an oxide semiconductor film 130A to be the oxide semiconductor layer 130*a*, an oxide semiconductor film 130B to be the oxide semiconductor layer 130*b*, and an oxide semiconductor film 130C to be the oxide semiconductor layer 130*c* are formed over the insulating layer 120 by a sputtering method, a CVD method, an MBE method, or the like (see FIG. 31A).

In the case where the oxide semiconductor layer 130 has a stacked-layer structure, oxide semiconductor films are preferably formed successively without exposure to the air with the use of a multi-chamber deposition apparatus (e.g., a sputtering apparatus) including a load lock chamber. It is preferable that each chamber of the sputtering apparatus be able to be evacuated to a high vacuum (approximately $5 \times 10^{-7}$ Pa to $1 \times 10^{-4}$ Pa) by an adsorption vacuum evacuation pump such as a cryopump and that the chamber be able to heat a substrate over which a film is to be deposited to 100° C. or higher, preferably 500° C. or higher, so that water and the like acting as impurities of an oxide semiconductor are removed as much as possible. Alternatively, a combination of a turbo molecular pump and a cold trap is preferably used to prevent back-flow of a gas containing a carbon component, moisture, or the like from an exhaust system into the chamber. Alternatively, a combination of a turbo molecular pump and a cryopump may be used as an exhaust system.

Not only high vacuum evacuation of the chamber but also high purity of a sputtering gas is necessary to obtain a highly purified intrinsic oxide semiconductor. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor film can be prevented as much as possible.

For the oxide semiconductor film 130A, the oxide semiconductor film 130B, and the oxide semiconductor film 130C, any of the materials described in Embodiment 3 can be used. For example, an In—Ga—Zn oxide whose atomic ratio of In to Ga and Zn is 1:3:6, 1:3:4, 1:3:3, or 1:3:2 can be used for the oxide semiconductor film 130A, an In—Ga—Zn oxide whose atomic ratio of In to Ga and Zn is 1:1:1, 3:1:2, 5:5:6, or 4:2:4.1 can be used for the oxide semiconductor film 130B, and an In—Ga—Zn oxide whose atomic ratio of In to Ga and Zn is 1:3:6, 1:3:4, 1:3:3, or 1:3:2 can be used for the oxide semiconductor film 130C. For the oxide semiconductor film 130A and the oxide semiconductor film 130C, an oxide semiconductor like gallium oxide may be used. In the case where a sputtering method is used for deposition, the above material can be used as a target. In each of the oxide semiconductor films 130A, 130B, and 130C, the proportion of each atom in the atomic ratio varies within a range of ±40% as an error. For example, the atomic ratio of In to Ga and Zn of a film that is formed by sputtering using a material whose atomic ratio of In to Ga and Zn is 4:2:4.1 as a target might be 4:2:3.

Note that as described in detail in Embodiment 3, a material that has an electron affinity higher than that of the oxide semiconductor film 130A and that of the oxide semiconductor film 130C is used for the oxide semiconductor film 130B.

Note that the oxide semiconductor films are preferably formed by a sputtering method. As a sputtering method, an RF sputtering method, a DC sputtering method, an AC sputtering method, or the like can be used.

After the oxide semiconductor film 130C is formed, first heat treatment may be performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate released oxygen. The first heat treatment can increase the crystallinity of the oxide semiconductor film 130A, the oxide semiconductor film 130B, and the oxide semiconductor film 130C and remove impurities such as water and hydrogen from the insulating layer 120, the oxide semiconductor film 130A, the oxide semiconductor film 130B, and the oxide semiconductor film 130C. Note that the first heat treatment may be performed after etching for forming the oxide semiconductor layer 130a, the oxide semiconductor layer 130b, and the oxide semiconductor layer 130c described later.

Next, a conductive layer is formed over the oxide semiconductor film 130C. The conductive layer can be, for example, formed by the following method.

First, a first conductive film is formed over the oxide semiconductor film 130C. As the first conductive film, a single layer or a stacked layer can be formed using a material selected from Al, Cr, Cu, Ta, Ti, Mo, W, Ni, Mn, Nd, and Sc and alloys of any of these metal materials.

Next, a negative resist film is formed over the first conductive film and the resist film is exposed to light by electron beam exposure, liquid immersion exposure, or EUV exposure and developed, so that a first resist mask is formed. An organic coating film is preferably formed as an adherence agent between the first conductive film and the resist film. Alternatively, the first resist mask may be formed by nanoimprint lithography.

Then, the first conductive film is selectively etched using the first resist mask and the first resist mask is subjected to ashing; thus, the conductive layer is formed.

Figure 31B:
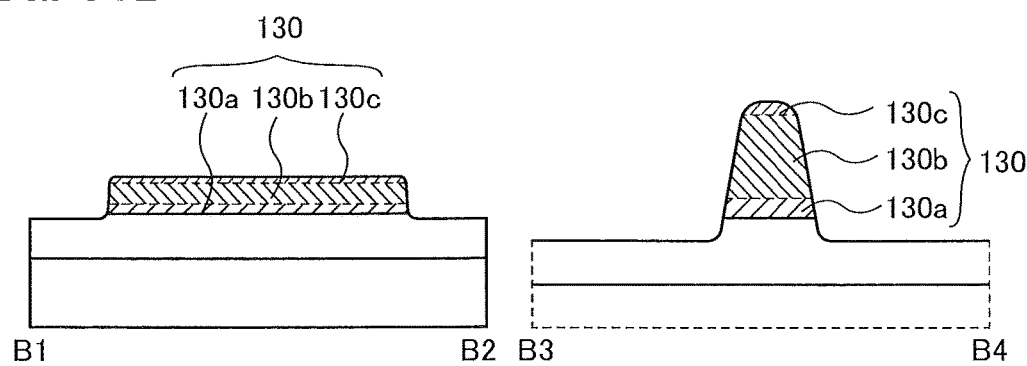
Figure 31C:
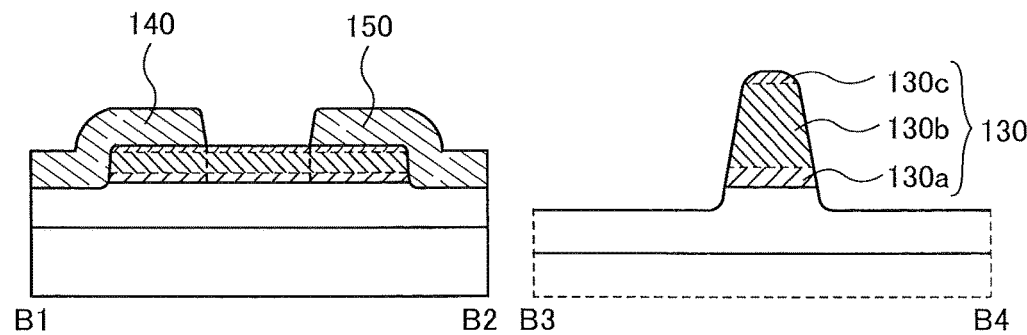

Next, the oxide semiconductor film 130A, the oxide semiconductor film 130B, and the oxide semiconductor film 130C are selectively etched using the conductive layer as a hard mask and the conductive layer is removed; thus, the oxide semiconductor layer 130 including a stack of the oxide semiconductor layer 130a, the oxide semiconductor layer 130b, and the oxide semiconductor layer 130c is formed (see FIG. 31B). It is also possible to form the oxide semiconductor layer 130 using the first resist mask, without forming the conductive layer. Here, oxygen ions may be implanted into the oxide semiconductor layer 130.

Next, a second conductive film is formed to cover the oxide semiconductor layer 130. The second conductive film can be formed using a material that can be used for the conductive layer 140 and the conductive layer 150 described in Embodiment 3. A sputtering method, a CVD method, an MBE method, or the like can be used for the formation of the second conductive film.

Then, a second resist mask is formed over portions to be a source region and a drain region. Then, part of the second conductive film is etched, whereby the conductive layer 140 and the conductive layer 150 are formed (see FIG. 31C).

Next, an insulating film 160A is formed over the oxide semiconductor layer 130, the conductive layer 140, and the conductive layer 150. The insulating film 160A can be formed using a material that can be used for the insulating layer 160 described in Embodiment 3. A sputtering method, a CVD method, an MBE method, or the like can be used for the formation of the insulating film 160A.

After that, second heat treatment may be performed. The second heat treatment can be performed in a condition similar to that of the first heat treatment. The second heat treatment can make oxygen diffuse from the insulating layer 120 into the entire oxide semiconductor layer 130. Note that it is possible to obtain this effect by third heat treatment, without performing the second heat treatment.

Then, a third conductive film 171A and a fourth conductive film 172A to be the conductive layer 170 are formed over the insulating film 160A. The third conductive film 171A and the fourth conductive film 172A can be formed using materials that can be used for the conductive layer 171 and the conductive layer 172 described in Embodiment 3. A sputtering method, a CVD method, an MBE method, or the like can be used for the formation of the third conductive film 171A and the fourth conductive film 172A.

Figure 32A:
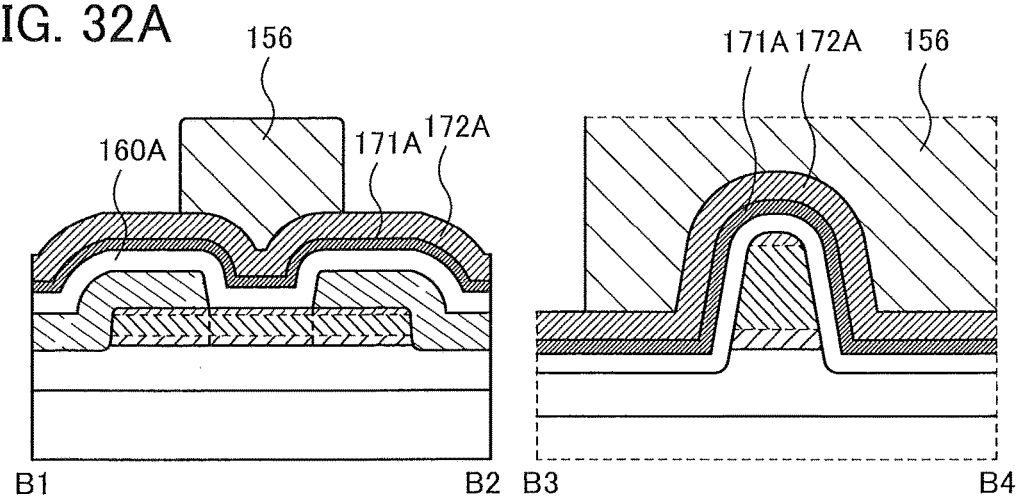
FIGS. 32A to 32C illustrate a method for manufacturing a transistor.
Figure 32B:
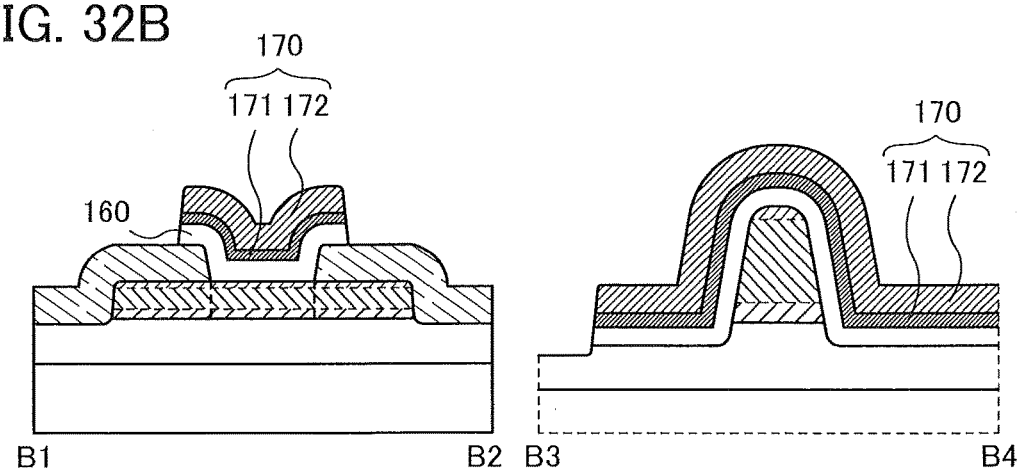

Next, a third resist mask 156 is formed over the fourth conductive film 172A (see FIG. 32A). The third conductive film 171A, the fourth conductive film 172A, and the insulating film 160A are selectively etched using the resist mask, whereby the conductive layer 170 including the conductive layer 171 and the conductive layer 172 and the insulating layer 160 are formed (see FIG. 32B). Note that if the insulating film 160A is not etched, the transistor 102 can be manufactured.

After that, the insulating layer 175 is formed over the oxide semiconductor layer 130, the conductive layer 140, the conductive layer 150, the insulating layer 160, and the conductive layer 170. Embodiment 3 can be referred to for description of a material used for the insulating layer 175. In the transistor 101, an aluminum oxide film is preferably used. The insulating layer 175 can be formed by a sputtering method, a CVD method, an MBE method, or the like.

Figure 32C:
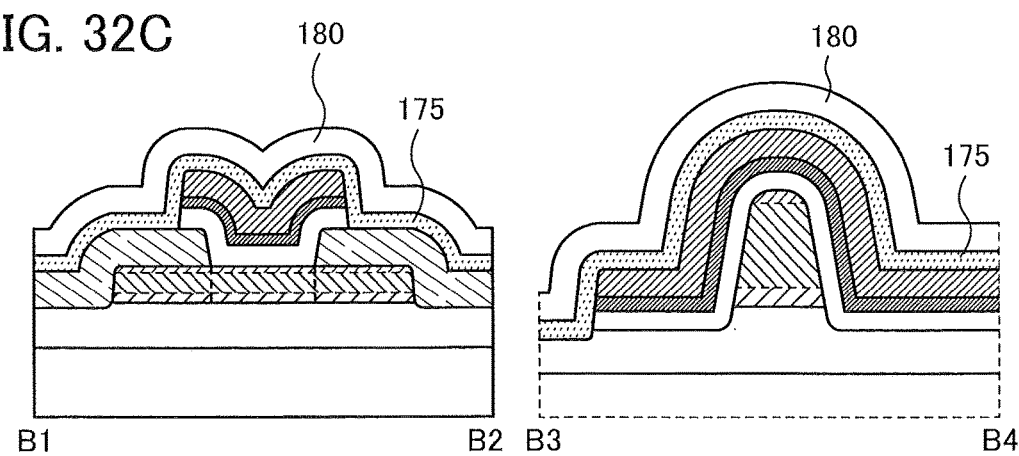

Next, the insulating layer 180 is formed over the insulating layer 175 (see FIG. 32C). Embodiment 3 can be referred to for description of a material used for the insulating layer 180. The insulating layer 180 can be formed by a sputtering method, a CVD method, an MBE method, or the like.

Oxygen may be added to the insulating layer 175 and/or the insulating layer 180 by an ion implantation method, an ion doping method, a plasma immersion ion implantation method, plasma treatment, or the like. Adding oxygen enables the insulating layer 175 and/or the insulating layer 180 to supply oxygen much easily to the oxide semiconductor layer 130.

Next, third heat treatment may be performed. The third heat treatment can be performed in a condition similar to that of the first heat treatment. By the third heat treatment, excess oxygen is easily released from the insulating layer 120, the insulating layer 175, and the insulating layer 180, so that oxygen vacancies in the oxide semiconductor layer 130 can be reduced.

Next, a method for manufacturing the transistor 107 is described. Note that detailed description of steps similar to those for manufacturing the transistor 101 described above is omitted.

Figure 33A:
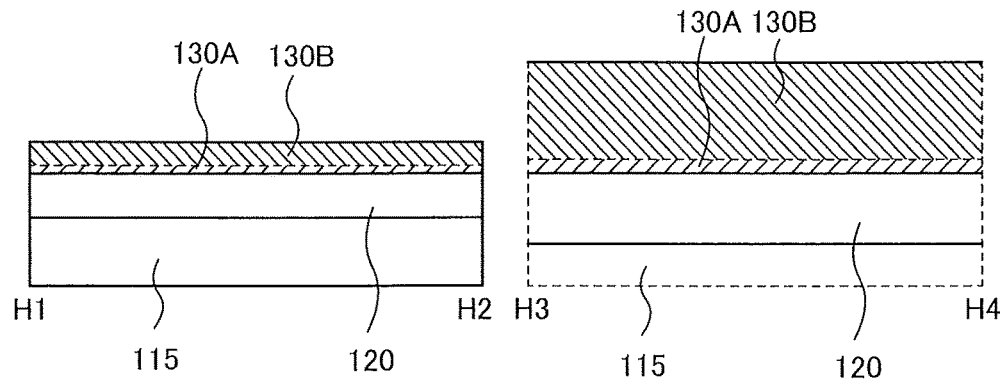
FIGS. 33A to 33C illustrate a method for manufacturing a transistor.

The insulating layer 120 is formed over the substrate 115, and the oxide semiconductor film 130A to be the oxide semiconductor layer 130a and the oxide semiconductor film 130B to be the oxide semiconductor layer 130b are formed over the insulating layer 120 by a sputtering method, a CVD method, an MBE method, or the like (see FIG. 33A).

Figure 33B:
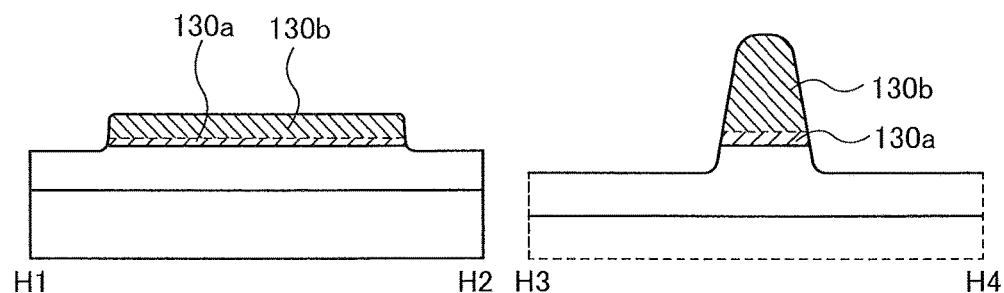

After that, a first conductive film is formed over the oxide semiconductor film 130B, and a conductive layer is formed using a first resist mask by a method similar to the above. Then, the oxide semiconductor film 130A and the oxide semiconductor film 130B are selectively etched using the conductive layer as a hard mask and the conductive layer is removed; thus, a stack of the oxide semiconductor layer 130a and the oxide semiconductor layer 130b is formed (see FIG. 33B). It is also possible to form the stack using the first resist mask, without forming the hard mask. Here, oxygen ions may be implanted into the oxide semiconductor layer 130a and the oxide semiconductor layer 130b.

Figure 33C:
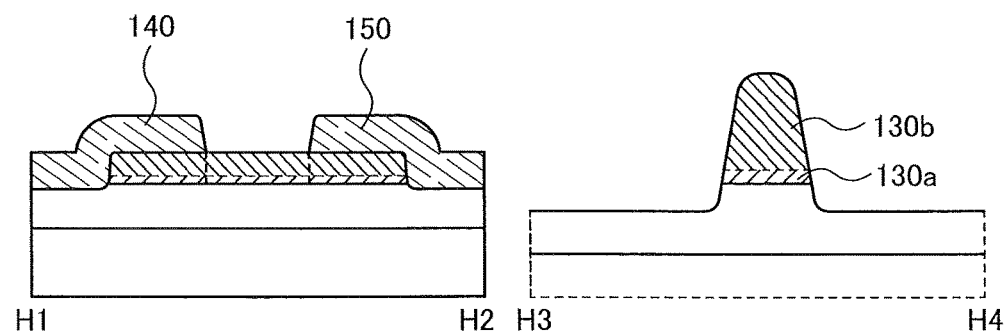

Next, a second conductive film is formed to cover the stack. Then, a second resist mask is formed over portions to be a source region and a drain region, and part of the second conductive film is etched using the second resist mask, whereby the conductive layer 140 and the conductive layer 150 are formed (see FIG. 33C).

After that, the oxide semiconductor film 130C to be the oxide semiconductor layer 130c is formed over the stack of the oxide semiconductor layer 130a and the oxide semiconductor layer 130b, the conductive layer 140, and the conductive layer 150. Furthermore, the insulating film 160A, the third conductive film 171A, and the fourth conductive film 172A are formed over the oxide semiconductor film 130C.

Figure 34A:
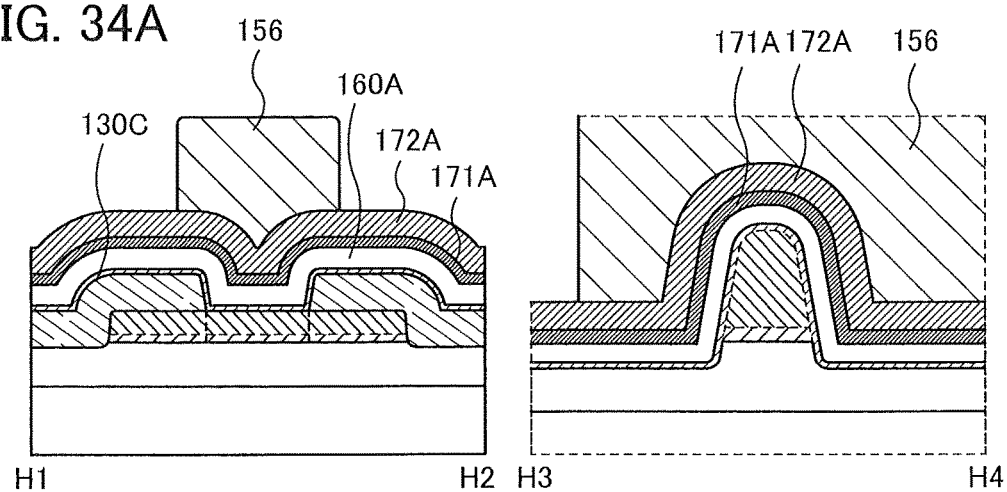
FIGS. 34A to 34C illustrate a method for manufacturing a transistor.
Figure 34B:
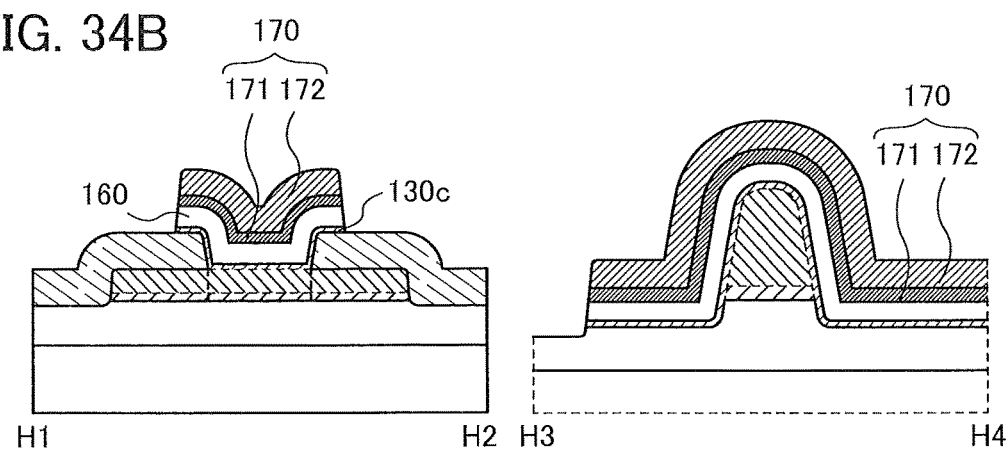

Then, the third resist mask 156 is formed over the fourth conductive film 172A (see FIG. 34A). The third conductive film 171A, the fourth conductive film 172A, the insulating film 160A, and the oxide semiconductor film 130C are selectively etched using the resist mask, whereby the conductive layer 170 including the conductive layer 171 and the conductive layer 172, the insulating layer 160, and the oxide semiconductor layer 130c are formed (see FIG. 34B). Note that if the insulating film 160A and the oxide semiconductor film 130C are etched using a fourth resist mask, the transistor 108 can be manufactured.

Figure 34C:
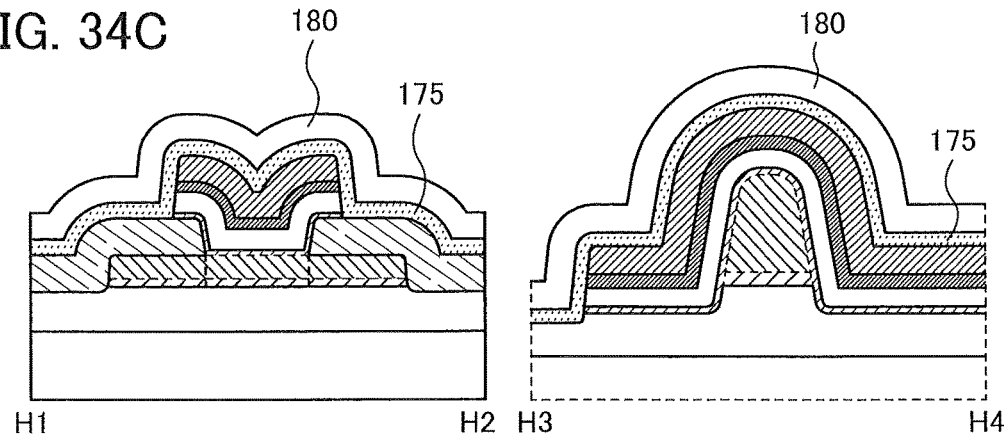

Next, the insulating layer 175 and the insulating layer 180 are formed over the insulating layer 120, the oxide semiconductor layer 130 (the oxide semiconductor layer 130a, the oxide semiconductor layer 130b, and the oxide semiconductor layer 130c), the conductive layer 140, the conductive layer 150, the insulating layer 160, and the conductive layer 170 (see FIG. 34C).

Through the above steps, the transistor 107 can be manufactured.

Next, a method for manufacturing the transistor 111 is described. Note that detailed description of steps similar to those for manufacturing the transistor 101 described above is omitted.

Figure 35A:
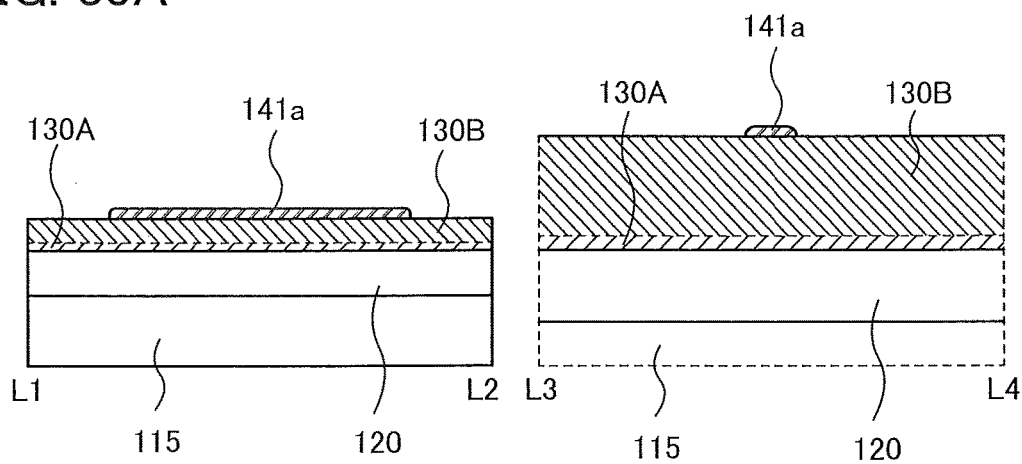
FIGS. 35A to 35C illustrate a method for manufacturing a transistor.

The insulating layer 120 is formed over the substrate 115, and the oxide semiconductor film 130A to be the oxide semiconductor layer 130a and the oxide semiconductor film 130B to be the oxide semiconductor layer 130b are formed over the insulating layer 120 by a sputtering method, a CVD method, an MBE method, or the like. Then, a first conductive film is formed over the oxide semiconductor film 130B, and a conductive layer 141a is formed using a first resist mask (see FIG. 35A).

Figure 35B:
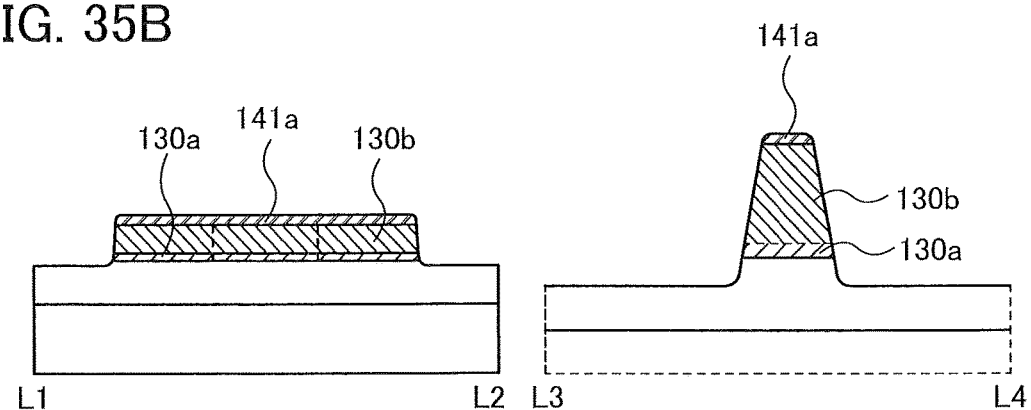

Then, the oxide semiconductor film 130A and the oxide semiconductor film 130B are selectively etched using the conductive layer 141a as a hard mask, whereby a stack of the oxide semiconductor layer 130a, the oxide semiconductor layer 130b, and the conductive layer 141a is formed (see FIG. 35B). Here, oxygen ions may be implanted into the oxide semiconductor layer 130a and the oxide semiconductor layer 130b.

Figure 35C:
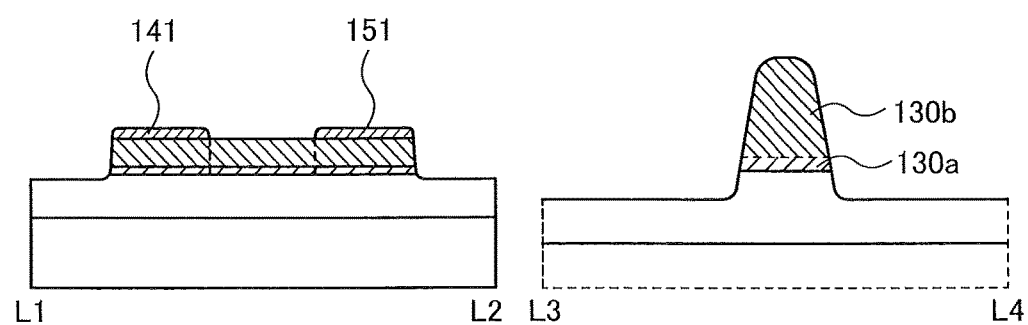

Then, a second resist mask is formed over portions to be a source region and a drain region, and part of the conductive layer 141a is etched using the second resist mask, whereby the conductive layer 141 and the conductive layer 151 are formed (see FIG. 35C).

After that, the oxide semiconductor film 130C to be the oxide semiconductor layer 130c is formed over the stack of the oxide semiconductor layer 130a and the oxide semiconductor layer 130b, the conductive layer 141, and the conductive layer 151. Furthermore, the insulating film 160A, the third conductive film 171A, and the fourth conductive film 172A are formed over the oxide semiconductor film 130C.

Figure 36A:
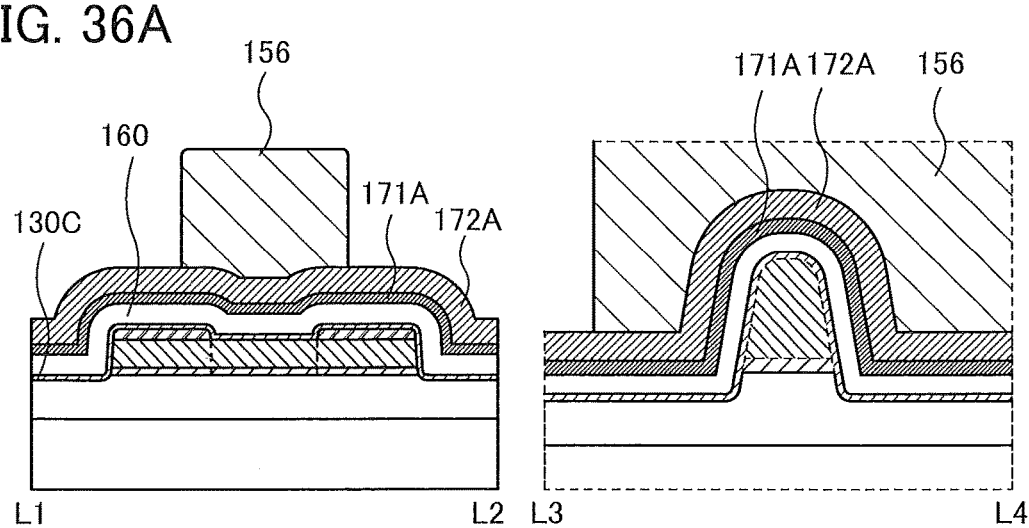
FIGS. 36A to 36C illustrate a method for manufacturing a transistor.
Figure 36B:
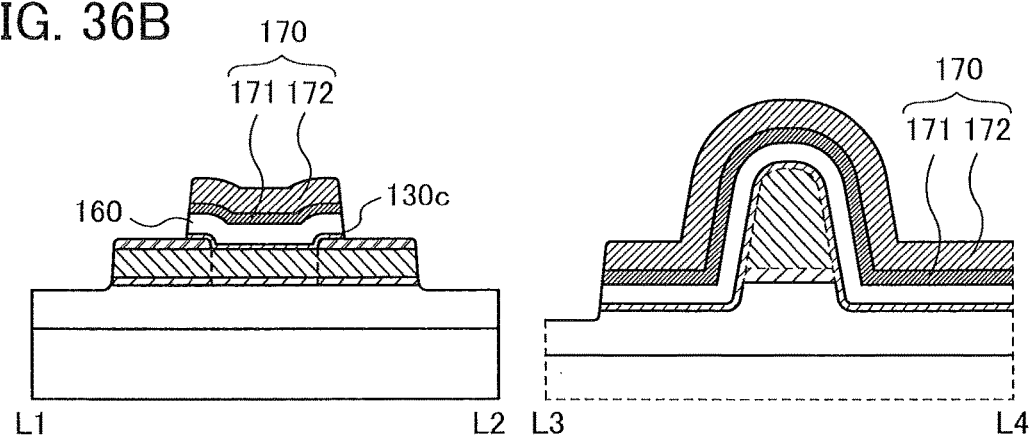

Then, the third resist mask 156 is formed over the fourth conductive film 172A (see FIG. 36A). The third conductive film 171A, the fourth conductive film 172A, the insulating film 160A, and the oxide semiconductor film 130C are selectively etched using the resist mask, whereby the conductive layer 170 including the conductive layer 171 and the conductive layer 172, the insulating layer 160, and the oxide semiconductor layer 130c are formed (see FIG. 36B).

Next, the insulating layer 175 and the insulating layer 180 are formed over the insulating layer 120, the oxide semiconductor layer 130 (the oxide semiconductor layer 130a, the oxide semiconductor layer 130b, and the oxide semiconductor layer 130c), the conductive layer 141, the conductive layer 151, the insulating layer 160, and the conductive layer 170.

Figure 36C:
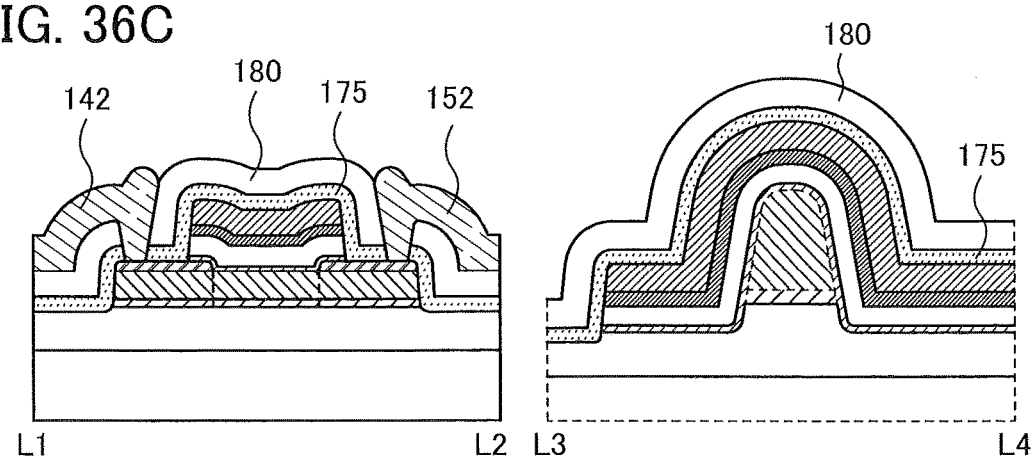

Next, openings reaching the conductive layer 141 and the conductive layer 151 are provided in the insulating layer 175 and the insulating layer 180, and a fifth conductive film is formed to cover the openings. Then, a fourth resist mask is provided over the fifth conductive film and the fifth conductive film is selectively etched using the resist mask, whereby the conductive layer 142 and the conductive layer 152 are formed (see FIG. 36C).

Through the above steps, the transistor 111 can be manufactured.

Although the variety of films such as the metal films, the semiconductor films, and the inorganic insulating films which are described in this embodiment typically can be formed by a sputtering method or a plasma CVD method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the metal film, the semiconductor film, and the inorganic insulating film which have been disclosed in the embodiments can be formed by a thermal CVD method such as a MOCVD method or an ALD method. For example, in the case where an In—Ga—Zn—O film is formed, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source material gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

The structure described in this embodiment can be used in appropriate combination with any of the structures described in the other embodiments.

Embodiment 5

<Structure of Oxide Semiconductor>

A structure of an oxide semiconductor is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor is classified into, for example, a non-single-crystal oxide semiconductor and a single crystal oxide semiconductor. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 43A:
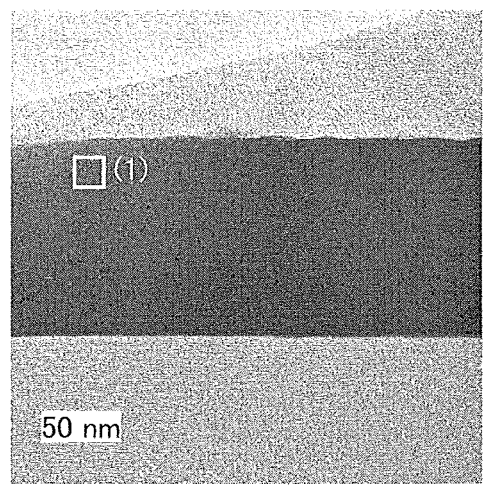
FIGS. 43A to 43D are Cs-corrected high-resolution TEM images of a cross section of a CAAC-OS and a cross-sectional schematic view of a CAAC-OS.

FIG. 43A shows an example of a high-resolution TEM image of a cross section of the CAAC-OS which is obtained from a direction substantially parallel to the sample surface. Here, the TEM image is obtained with a spherical aberration corrector function. The high-resolution TEM image obtained with a spherical aberration corrector function is particularly referred to as a Cs-corrected high-resolution TEM image in the following description. Note that the Cs-corrected high-resolution TEM image can be obtained with, for example, an atomic resolution analytical electron microscope JEM-ARM200F manufactured by JEOL Ltd.

Figure 43B:
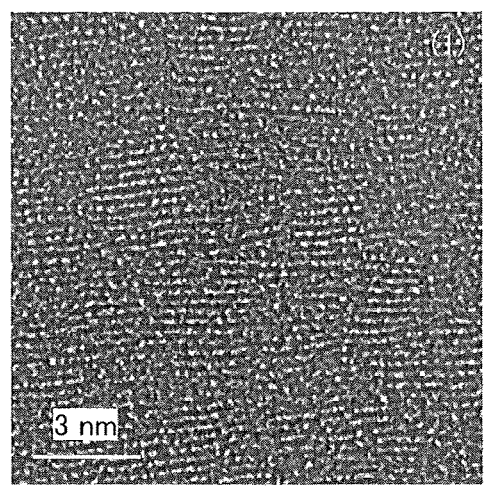

FIG. 43B is an enlarged Cs-corrected high-resolution TEM image of a region (1) in FIG. 43A. FIG. 43B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 43C:
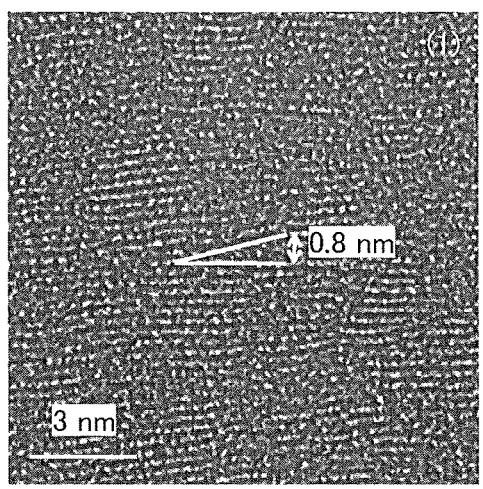

As shown in FIG. 43B, the CAAC-OS has a characteristic atomic arrangement. The characteristic atomic arrangement is denoted by an auxiliary line in FIG. 43C. FIGS. 43B and 43C prove that the size of a pellet is approximately 1 nm to 3 nm, and the size of a space caused by tilt of the pellets is approximately 0.8 nm. Therefore, the pellet can also be referred to as a nanocrystal (nc).

Figure 43D:
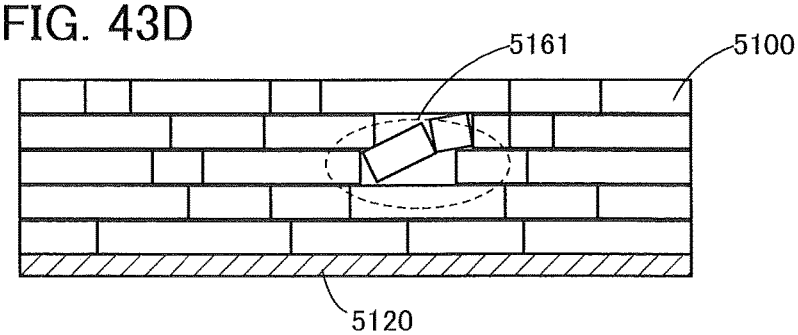

Here, according to the Cs-corrected high-resolution TEM images, the schematic arrangement of pellets 5100 of a CAAC-OS over a substrate 5120 is illustrated by such a structure in which bricks or blocks are stacked (see FIG. 43D). The part in which the pellets are tilted as observed in FIG. 43C corresponds to a region 5161 shown in FIG. 43D.

For example, as shown in FIG. 44A, a Cs-corrected high-resolution TEM image of a plane of the CAAC-OS obtained from a direction substantially perpendicular to the sample surface is observed. FIGS. 44B, 44C, and 44D are enlarged Cs-corrected high-resolution TEM images of regions (1), (2), and (3) in FIG. 44A, respectively. FIGS. 44B, 44C, and 44D indicate that metal atoms are arranged in a triangular, quadrangular, or hexagonal configuration in a pellet. However, there is no regularity of arrangement of metal atoms between different pellets.

Figure 45A:
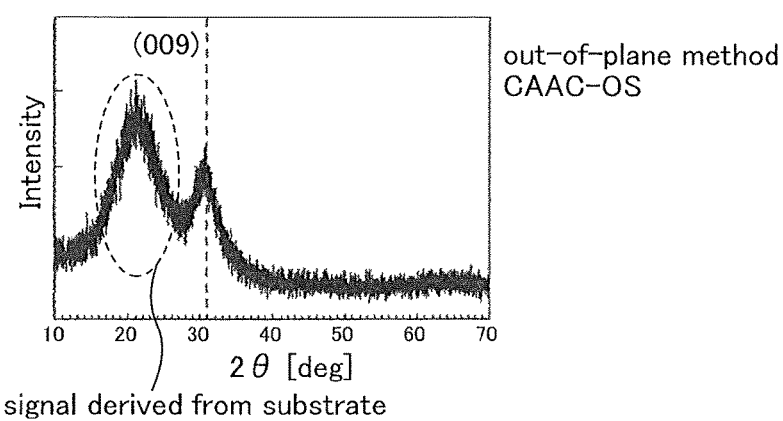
FIGS. 45A to 45C show structural analysis of a CAAC-OS and a single crystal oxide semiconductor by XRD.

For example, when the structure of a CAAC-OS including an $InGaZnO_4$ crystal is analyzed by an out-of-plane method using an X-ray diffraction (XRD) apparatus, a peak appears at a diffraction angle (2θ) of around 31° as shown in FIG. 45A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS including an $InGaZnO_4$ crystal by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS, a peak appear when 2θ is around 31° and that a peak not appear when 2θ is around 36°.

Figure 45B:
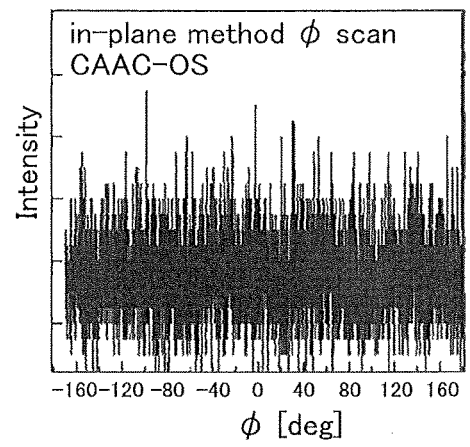
Figure 45C:
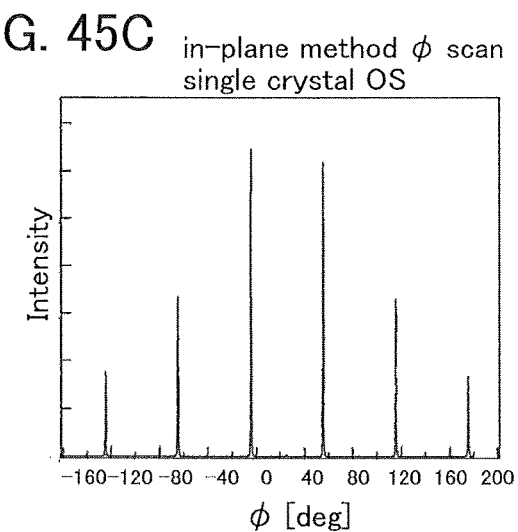

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 45B, a peak is not clearly observed. In contrast, in the case of a single crystal oxide semiconductor of $InGaZnO_4$, when φ scan is performed with 2θ fixed at around 56°, as shown in FIG. 45C, six peaks which are derived from crystal planes equivalent to the (110) plane are observed. Accordingly, the structural analysis using XRD shows that the directions of a-axes and b-axes are different in the CAAC-OS.

Figure 46A:
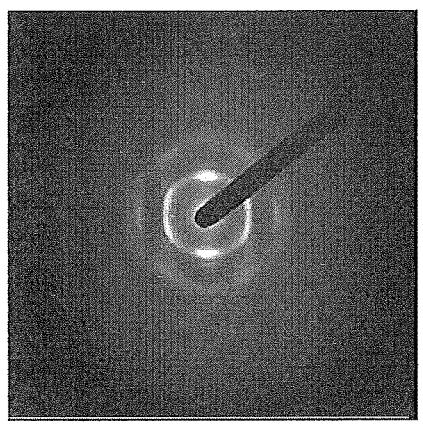
FIGS. 46A and 46B show electron diffraction patterns of a CAAC-OS.
Figure 46B:
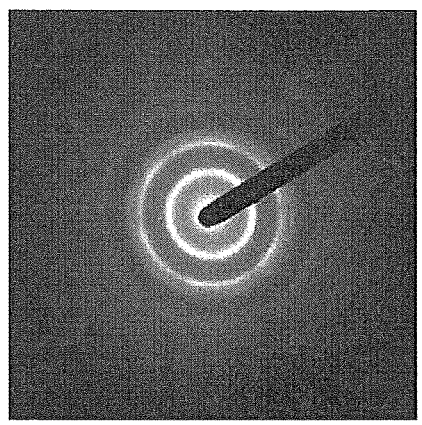

Next, FIG. 46A shows a diffraction pattern (also referred to as a selected-area transmission electron diffraction pattern) obtained in such a manner that an electron beam with a probe diameter of 300 nm is incident on an In—Ga—Zn oxide that is a CAAC-OS in a direction parallel to the sample surface. As shown in FIG. 46A, for example, spots derived from the (009) plane of an $InGaZnO_4$ crystal are observed. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 46B shows a diffraction pattern obtained in such a manner that an electron beam with a probe diameter of 300 nm is incident on the same sample in a direction perpendicular to the sample surface. As shown in FIG. 46B, a ring-like diffraction pattern is observed. Thus, the electron diffraction also indicates that the a-axes and b-axes of the pellets included in the CAAC-OS do not have regular alignment. The first ring in FIG. 46B is considered to be derived from the (010) plane, the (100) plane, and the like of the $InGaZnO_4$ crystal. The second ring in FIG. 46B is considered to be derived from the (110) plane and the like.

Since the c-axes of the pellets (nanocrystals) are aligned in a direction substantially perpendicular to the formation surface or the top surface in the above manner, the CAAC-OS can also be referred to as an oxide semiconductor including c-axis aligned nanocrystals (CANC).

The CAAC-OS is an oxide semiconductor with a low impurity concentration. The impurity means an element other than the main components of the oxide semiconductor, such as hydrogen, carbon, silicon, or a transition metal element. An element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

Additionally, the impurity contained in the oxide semiconductor might serve as a carrier trap or a carrier generation source.

Moreover, the CAAC-OS is an oxide semiconductor having a low density of defect states. For example, oxygen vacancies in the oxide semiconductor serve as carrier traps or serve as carrier generation sources when hydrogen is captured therein.

In a transistor using the CAAC-OS, change in electrical characteristics due to irradiation with visible light or ultraviolet light is small.

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

Note that an oxide semiconductor may have a structure having physical properties intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

A difference in effect of electron irradiation between structures of an oxide semiconductor is described below.

An a-like OS, an nc-OS, and a CAAC-OS are prepared. Each of the samples is an In—Ga—Zn oxide.

First, a high-resolution cross-sectional TEM image of each sample is obtained. The high-resolution cross-sectional TEM images show that all the samples have crystal parts.

Figure 47:
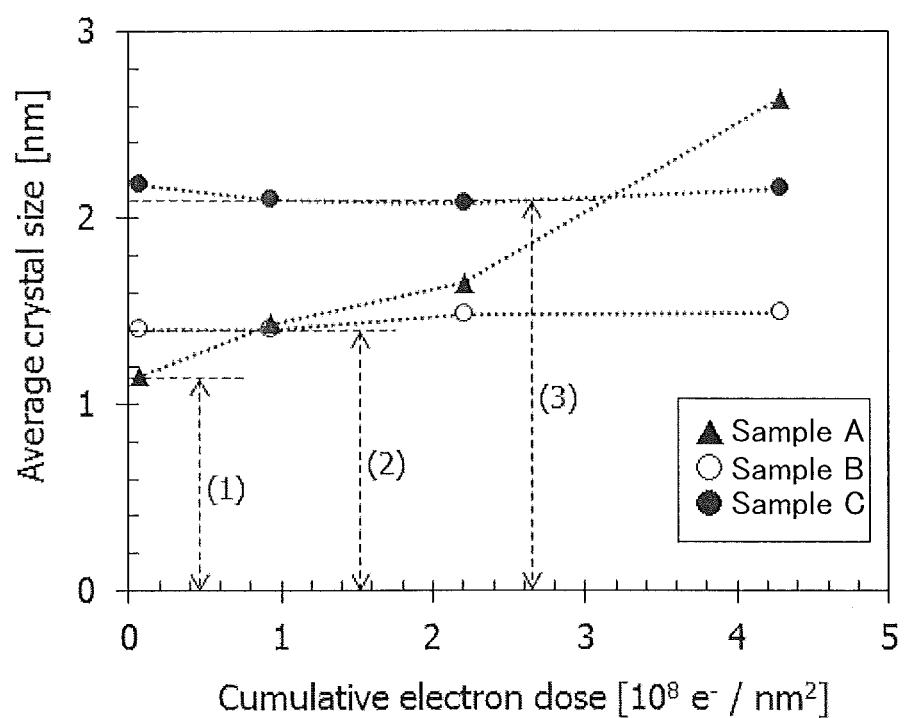
FIG. 47 shows a change in crystal part of an In—Ga—Zn oxide induced by electron irradiation.

Then, the size of the crystal part of each sample is measured. FIG. 47 shows the change in the average size of crystal parts (at 22 points to 45 points) in each sample. FIG. 47 indicates that the crystal part size in the a-like OS increases with an increase in the cumulative electron dose. Specifically, as shown by (1) in FIG. 47, a crystal part of approximately 1.2 nm at the start of TEM observation (the crystal part is also referred to as an initial nucleus) grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$ regardless of the cumulative electron dose. Specifically, as shown by (2) in FIG. 47, the average crystal size is approximately 1.4 nm regardless of the observation time by TEM. Furthermore, as shown by (3) in FIG. 47, the average crystal size is approximately 2.1 nm regardless of the observation time by TEM.

In this manner, growth of the crystal part occurs due to the crystallization of the a-like OS, which is induced by a slight amount of electron beam employed in the TEM observation. In contrast, in the nc-OS and the CAAC-OS that have good quality, crystallization hardly occurs by a slight amount of electron beam used for TEM observation.

Note that the crystal part size in the a-like OS and the nc-OS can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

Furthermore, the density of an oxide semiconductor varies depending on the structure in some cases. For example, when the composition of an oxide semiconductor is determined, the structure of the oxide semiconductor can be expected by comparing the density of the oxide semiconductor with the density of a single crystal oxide semiconductor having the same composition as the oxide semiconductor. For example, the density of the a-like OS is higher than or equal to 78.6% and lower than 92.3% of the density of the single crystal oxide semiconductor having the same composition. For example, the density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

Specific examples of the above description are given. For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Note that an oxide semiconductor may be a stacked film including two or more films of an amorphous oxide semiconductor, an a-like OS, a microcrystalline oxide semiconductor, and a CAAC-OS, for example.

An oxide semiconductor having a low impurity concentration and a low density of defect states (a small number of oxygen vacancies) can have low carrier density. Therefore, such an oxide semiconductor is referred to as a highly purified intrinsic or substantially highly purified intrinsic oxide semiconductor. A CAAC-OS and an nc-OS have a low impurity concentration and a low density of defect states as compared to an a-like OS and an amorphous oxide semiconductor. That is, a CAAC-OS and an nc-OS are likely to be highly purified intrinsic or substantially highly purified intrinsic oxide semiconductors. Thus, a transistor including a CAAC-OS or an nc-OS rarely has negative threshold voltage (is rarely normally on). The highly purified intrinsic or substantially highly purified intrinsic oxide semiconductor has few carrier traps. Therefore, a transistor including a CAAC-OS or an nc-OS has small variation in electrical characteristics and high reliability. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics.

<Deposition Model>

Examples of deposition models of a CAAC-OS and an nc-OS are described below.

Figure 48A:
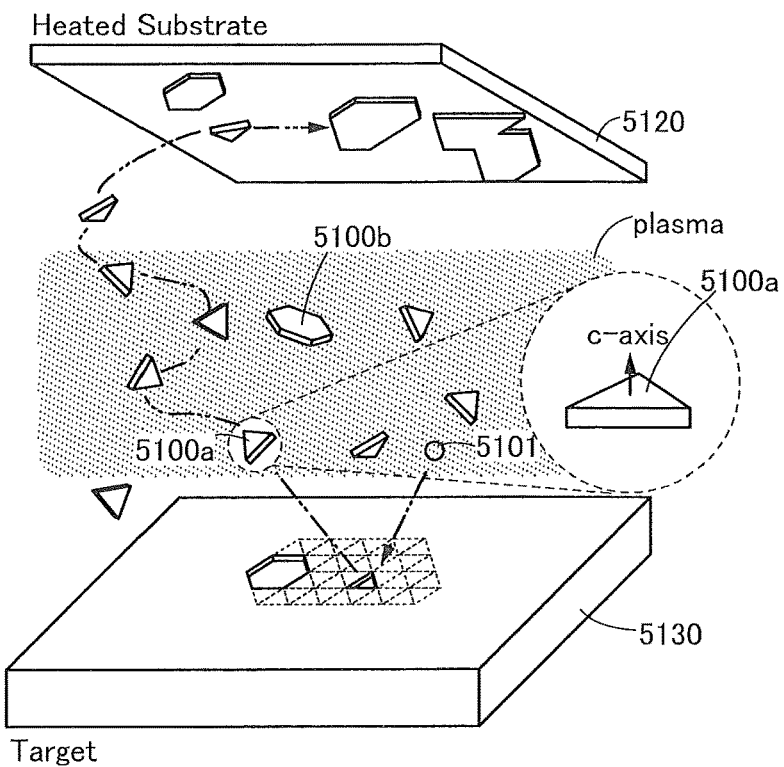
FIGS. 48A and 48B are schematic views showing deposition models of a CAAC-OS and an nc-OS.

FIG. 48A is a schematic view of the inside of a deposition chamber where a CAAC-OS is deposited by a sputtering method.

A target 5130 is attached to a backing plate. A plurality of magnets is provided to face the target 5130 with the backing plate positioned therebetween. The plurality of magnets generates a magnetic field. A sputtering method in which the disposition rate is increased by utilizing a magnetic field of magnets is referred to as a magnetron sputtering method.

The target 5130 has a polycrystalline structure in which a cleavage plane exists in at least one crystal grain.

Figure 49A:
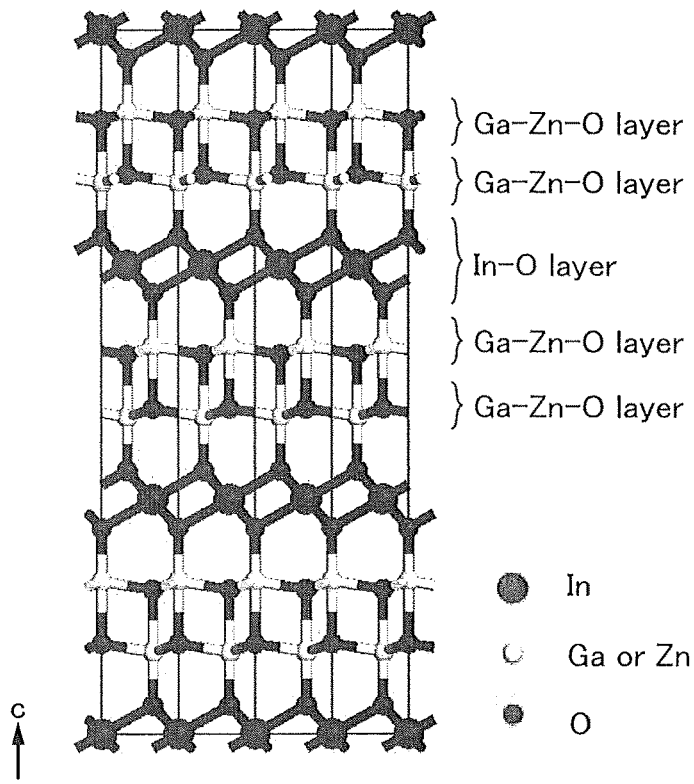
FIGS. 49A to 49C show an InGaZnO$_4$ crystal and a pellet.

A cleavage plane of the target 5130 including an In—Ga—Zn oxide is described as an example. FIG. 49A shows a structure of an $InGaZnO_4$ crystal included in the target 5130. Note that FIG. 49A shows a structure of the case where the $InGaZnO_4$ crystal is observed from a direction parallel to the b-axis when the c-axis is in an upward direction.

FIG. 49A indicates that oxygen atoms in a Ga—Zn—O layer are positioned close to those in an adjacent Ga—Zn—O layer. The oxygen atoms have negative charge, whereby the two Ga—Zn—O layers repel each other. As a result, the $InGaZnO_4$ crystal has a cleavage plane between the two adjacent Ga—Zn—O layers.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation (O$^+$) and an argon cation (Ar$^+$).

The ion 5101 is accelerated toward the target 5130 side by an electric field, and then collides with the target 5130. At this time, a pellet 5100*a* and a pellet 5100*b* which are flat-plate-like (pellet-like) sputtered particles are separated and sputtered from the cleavage plane. Note that structures of the pellet 5100*a* and the pellet 5100*b* may be distorted by an impact of collision of the ion 5101.

The pellet 5100*a* is a flat-plate-like (pellet-like) sputtered particle having a triangle plane, e.g., regular triangle plane. The pellet 5100*b* is a flat-plate-like (pellet-like) sputtered particle having a hexagon plane, e.g., regular hexagon plane. Note that flat-plate-like (pellet-like) sputtered particles such as the pellet 5100*a* and the pellet 5100*b* are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 49B:
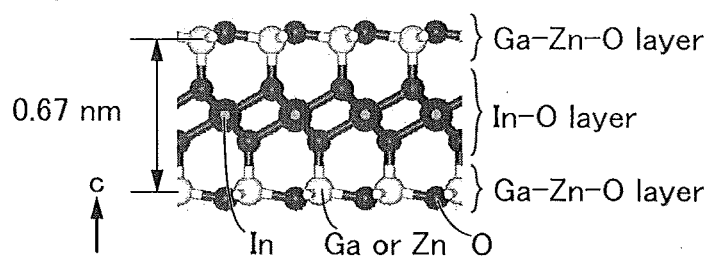
Figure 49C:
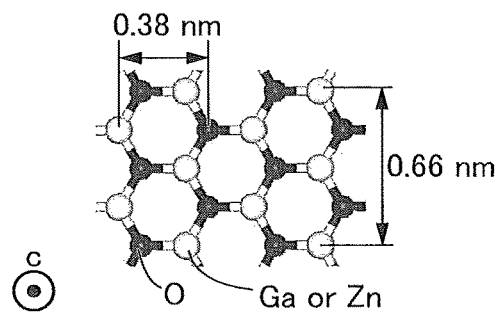

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 47. For example, in the case where the ion 5101 collides with the target 5130 including an In—Ga—Zn oxide, the pellet 5100 that includes three layers of a Ga—Zn—O layer, an In—O layer, and a Ga—Zn—O layer as shown in FIG. 49B is ejected. Note that FIG. 49C shows the structure of the pellet 5100 observed from a direction parallel to the c-axis. Therefore, the pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. The pellet 5100 includes an oxygen atom on its side surface, and the oxygen atom may be negatively charged. In this manner, when the side surfaces are charged with the same polarity, charges repel each other, and accordingly, the pellet 5100 can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 47 corresponds to the amount of growth in plasma. Here, in the case where the temperature of the substrate 5120 is at around room temperature, the pellet 5100 does not grow anymore; thus, an nc-OS is formed (see FIG. 48B). An nc-OS can be deposited when the substrate 5120 has a large size because a temperature at which the deposition of an nc-OS is carried out is approximately room temperature. Note that in order that the pellet 5100 grows in plasma, it is effective to increase deposition power in sputtering. High deposition power can stabilize the structure of the pellet 5100.

Figure 48B:
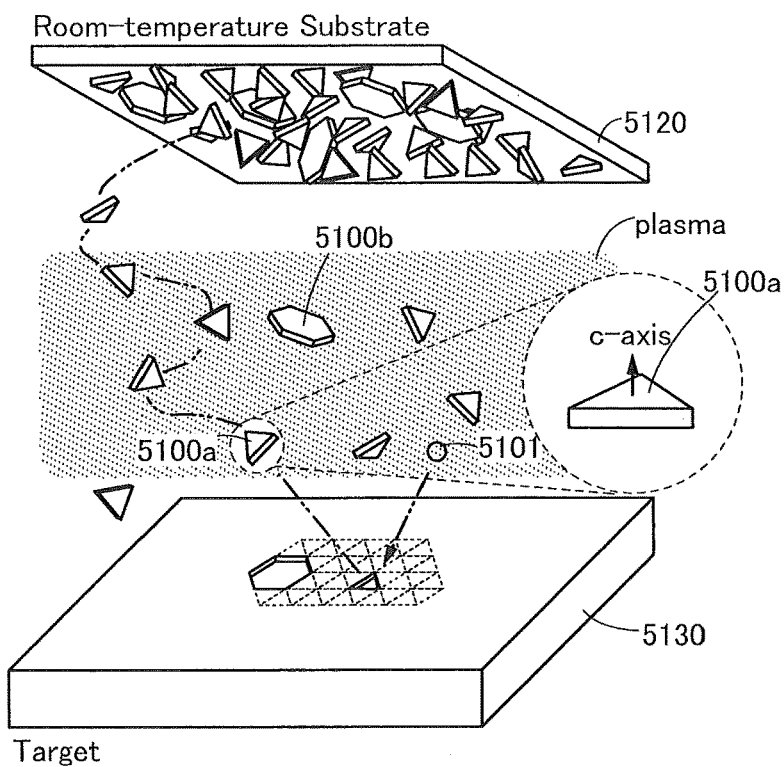

As shown in FIGS. 48A and 48B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to increase a force applied to the pellet 5100, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 48A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist therebetween. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target is sputtered with an ion, in addition to the pellets, zinc oxide or the like may be ejected. The zinc oxide is lighter than the pellet and thus reaches the top surface of the substrate 5120 before the pellet. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 50A to 50D are cross-sectional schematic views.

Figure 50A:
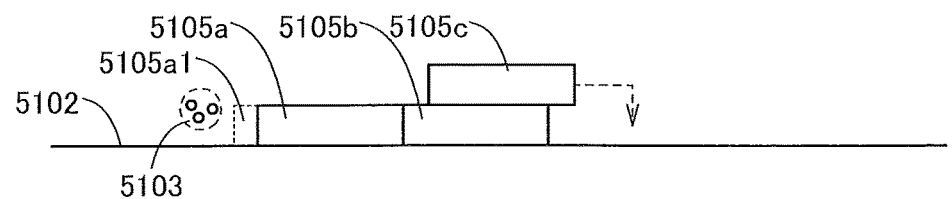
FIGS. 50A to 50D are schematic views showing a deposition model of a CAAC-OS.

As illustrated in FIG. 50A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 ejected from the target together with the zinc oxide is crystallized by heating of the substrate 5120 to form a region 5105a1 on another side surface of the pellet 5105a. Note that the plurality of particles 5103 may contain oxygen, zinc, indium, gallium, or the like.

Figure 50B:
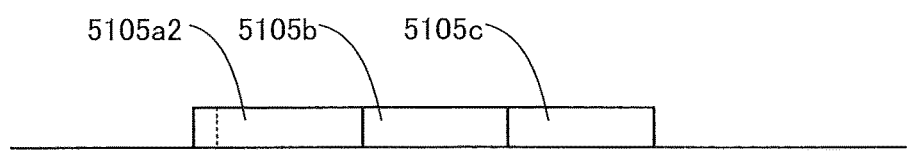

Then, as illustrated in FIG. 50B, the region 5105a1 grows to part of the pellet 5105a to form a pellet 5105a2. In addition, a side surface of the pellet 5105c is in contact with another side surface of the pellet 5105b.

Figure 50C:
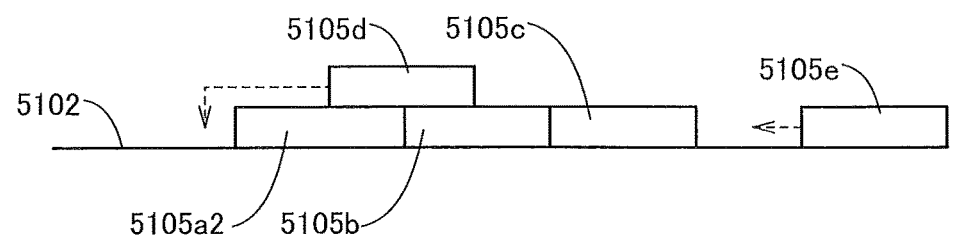

Next, as illustrated in FIG. 50C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 50D:
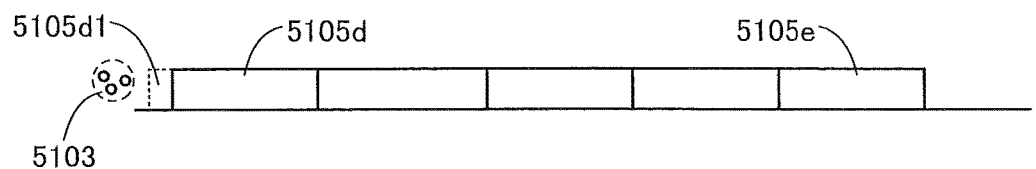

Then, as illustrated in FIG. 50D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 ejected from the target together with the zinc oxide is crystallized by heating of the substrate 5120 to form a region 5105d1 on another side surface of the pellet 5105d.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 47 corresponds to the amount of growth after deposition.

When spaces between pellets 5100 are extremely small, the pellets may form a large pellet. The large pellet has a single crystal structure. For example, the size of the large pellet may be greater than or equal to 10 nm and less than or equal to 200 nm, greater than or equal to 15 nm and less than or equal to 100 nm, or greater than or equal to 20 nm and less than or equal to 50 nm, when seen from the above. Therefore, when a channel formation region of a transistor is smaller than the large pellet, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure, which is different from film deposition by epitaxial growth. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between the pellets 5100 in the CAAC-OS in some cases. Note that owing to intermolecular force, the pellets 5100 are arranged so that a gap between the pellets is as small as possible even on the unevenness surface. Therefore, even when the formation surface has unevenness, a CAAC-OS with high crystallinity can be obtained.

As a result, laser crystallization is not needed for formation of a CAAC-OS, and a uniform film can be formed even over a large-sized glass substrate or the like.

Since a CAAC-OS is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

The structure described in this embodiment can be used in appropriate combination with any of the structures described in the other embodiments.

Embodiment 6

In this embodiment, a CPU that includes the memory device described in the above embodiment is described.

Figure 37:
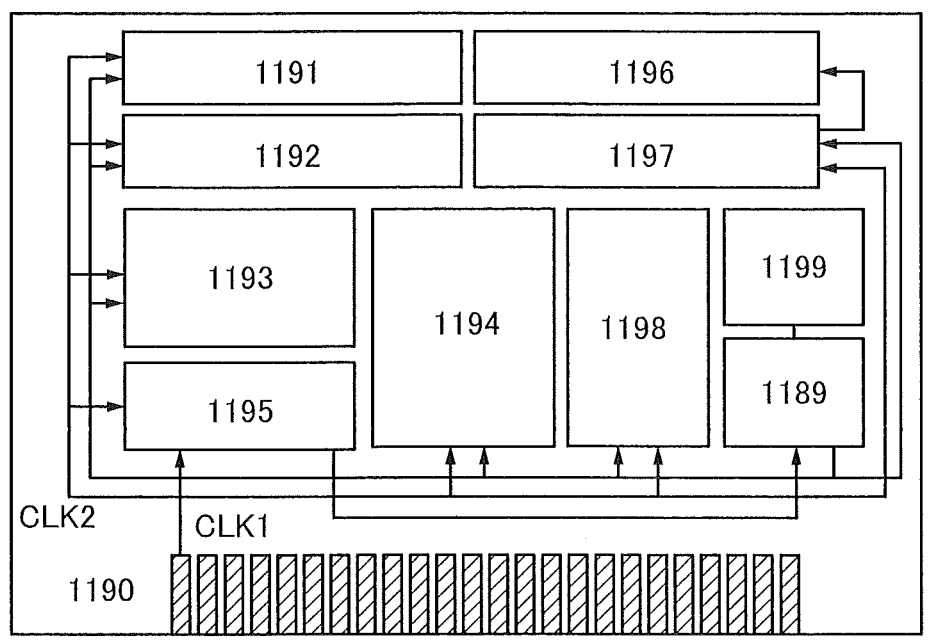
FIG. 37 illustrates a structure example of a CPU.

FIG. 37 is a block diagram illustrating a configuration example of a CPU at least partly including any of the transistors described in the above embodiments as a component.

The CPU illustrated in FIG. 37 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 37 is just an example in which the configuration is simplified, and an actual CPU may have a variety of configurations depending on the application. For example, the CPU may have the following configuration: a structure including the CPU illustrated in FIG. 37 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 37, a memory cell is provided in the register 1196. For the memory cell of the register 1196, any of the transistors described in the above embodiments can be used.

In the CPU illustrated in FIG. 37, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 38:
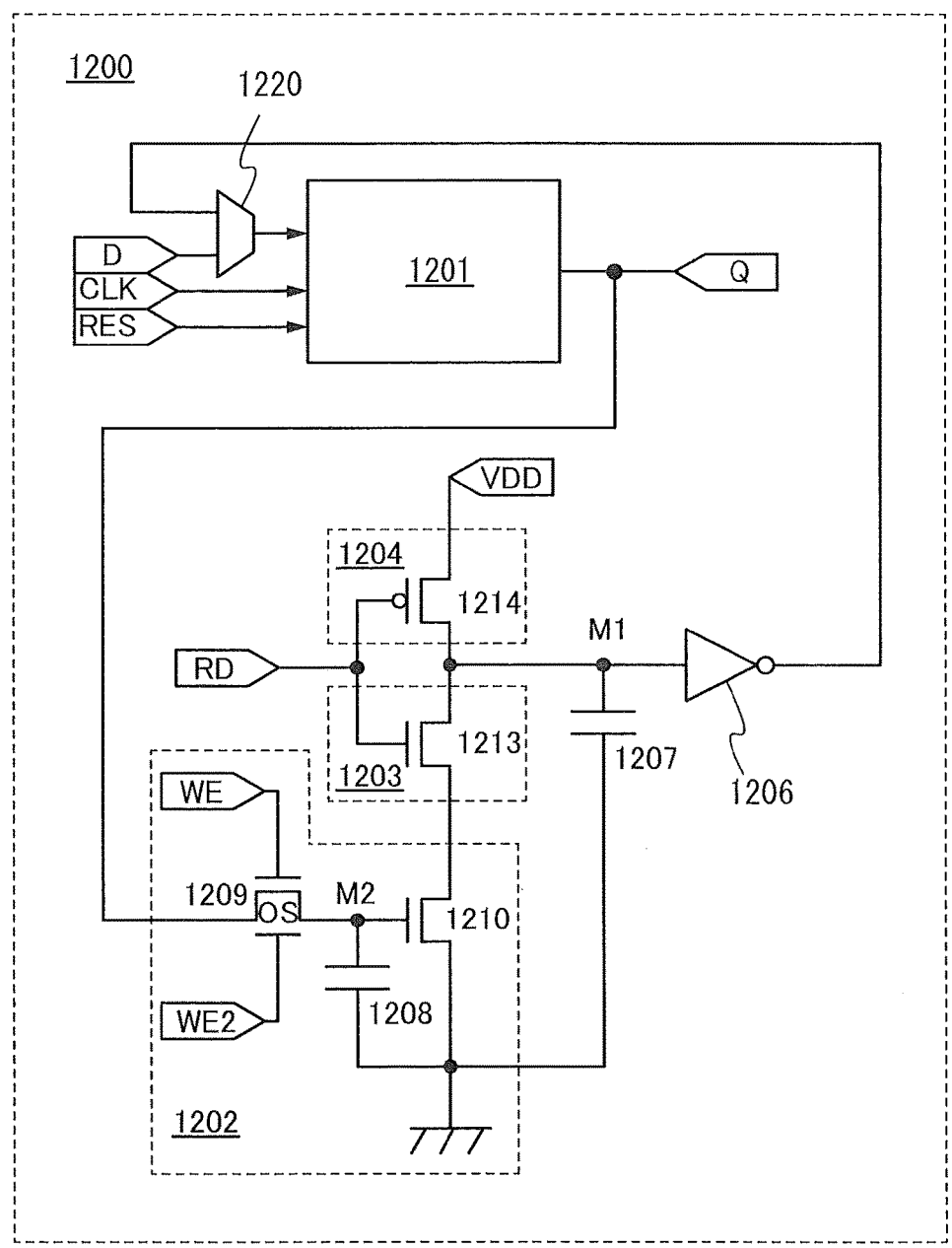
FIG. 38 is a circuit diagram of a memory element.

FIG. 38 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a first gate of the transistor 1209. For example, the first gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

Note that the transistor 1209 in FIG. 38 has a structure with a second gate (second gate electrode; back gate). The control signal WE can be input to the first gate and the control signal WE2 can be input to the second gate. The control signal WE2 is a signal having a constant potential. As the constant potential, for example, a ground potential GND or a potential lower than a source potential of the transistor 1209 is selected. The control signal WE2 is a potential signal for controlling the threshold voltage of the transistor 1209, and/cut of the transistor 1209 can be further reduced. The control signal WE2 may be a signal having the same potential as that of the control signal WE. Note that as the transistor 1209, a transistor without a second gate may be used.

A signal corresponding to data held in the circuit 1201 is input to the other of the source and the drain of the transistor 1209. FIG. 38 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 38, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is held, the signal output from the second terminal of the switch 1203 (the other of the source and the drain of the transistor 1213) can be input to the node.

In FIG. 38, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor layer. Further alternatively, in the memory element 1200, a transistor in which a channel is formed in an oxide semiconductor layer can be included besides the transistor 1209, and a transistor in which a channel is formed in a layer or the substrate 1190 including a semiconductor other than an oxide semiconductor can be used for the rest of the transistors.

As the circuit 1201 in FIG. 38, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can hold data stored in the circuit 1201 by the capacitor 1208 which is provided in the circuit 1202.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 1209, a signal held in the capacitor 1208 is held for a long time also in a period during which the power supply voltage is not supplied to the memory element 1200. The memory element 1200 can accordingly hold the stored content (data) also in a period during which the supply of the power supply voltage is stopped.

Since the above-described memory element performs pre-charge operation with the switch 1203 and the switch 1204, the time required for the circuit 1201 to hold original data again after the supply of the power supply voltage is restarted can be shortened.

In the circuit 1202, a signal held by the capacitor 1208 is input to the gate of the transistor 1210. Therefore, after supply of the power supply voltage to the memory element 1200 is restarted, the signal held by the capacitor 1208 can be converted into the one corresponding to the state (the on state or the off state) of the transistor 1210 to be read from the circuit 1202. Consequently, an original signal can be accurately read even when a potential corresponding to the signal held by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency identification (RF-ID).

This embodiment can be combined with any of the other embodiments in this specification as appropriate.

Embodiment 7

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 39A to 39F illustrate specific examples of these electronic devices.

Figure 39A:
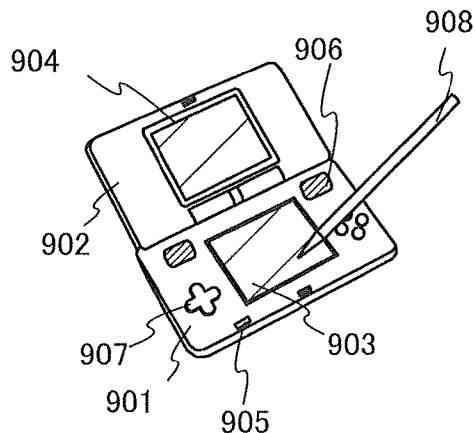
FIGS. 39A to 39F each illustrate an electronic device.

FIG. 39A illustrates a portable game console including a housing 901, a housing 902, a display portion 903, a display portion 904, a microphone 905, a speaker 906, an operation key 907, a stylus 908, and the like. Although the portable game machine in FIG. 39A has the two display portions 903 and 904, the number of display portions included in a portable game machine is not limited to this.

Figure 39B:
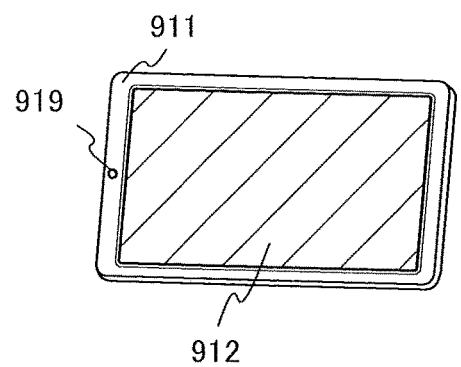

FIG. 39B illustrates a portable data terminal, which includes a first housing 911, a display portion 912, a camera 919, and the like. A touch panel function of the display portion 912 enables input of information.

Figure 39C:
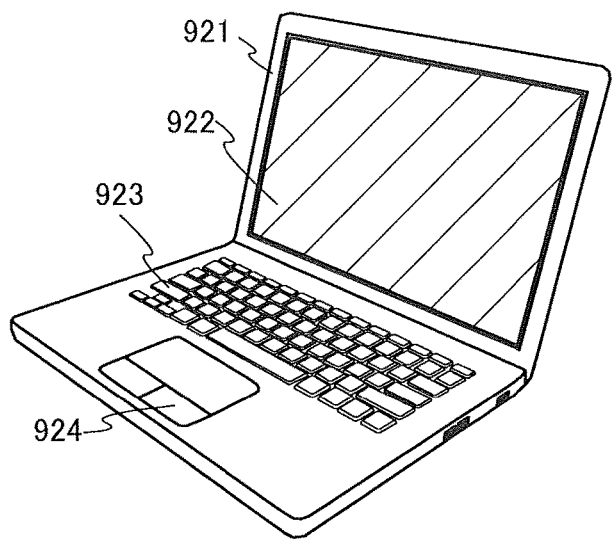

FIG. 39C illustrates a laptop personal computer, which includes a housing 921, a display portion 922, a keyboard 923, a pointing device 924, and the like.

Figure 39D:
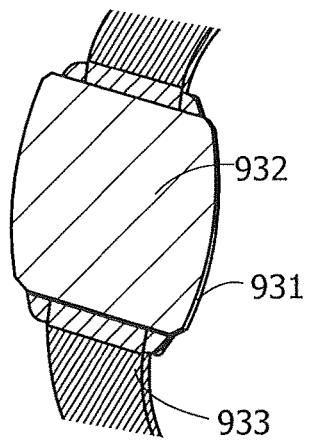

FIG. 39D illustrates a wrist-watch-type information terminal, which includes a housing 931, a display portion 932, a wristband 933, and the like. The display portion 932 may be a touch panel.

Figure 39E:
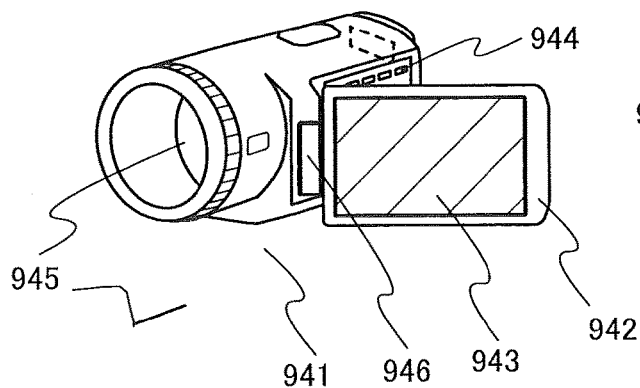

FIG. 39E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 39F:
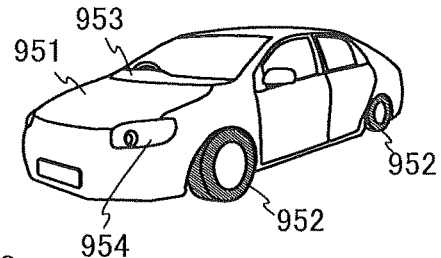

FIG. 39F illustrates an ordinary vehicle including a car body 951, wheels 952, a dashboard 953, lights 954, and the like.

The structure described in this embodiment can be used in appropriate combination with any of the structures described in the other embodiments.

EXPLANATION OF REFERENCE

20: opening, 21: contact hole, 22: contact hole, 23: contact hole, 24: contact hole, 25: contact hole, 32: source electrode layer, 33: drain electrode layer, 40: silicon substrate, 51: transistor, 52: transistor, 53: transistor, 54: transistor, 55: capacitor, 61: contact plug, 62: contact plug, 63: contact plug, 64: contact plug, 65: contact plug, 66: contact plug, 71: wiring, 72: wiring, 73: wiring, 75: wiring, 76: wiring, 77: wiring, 78: wiring, 79: wiring, 81: insulating layer, 82: insulating layer, 83: insulating layer, 84: insulating layer, 85: insulating layer, 86: insulating layer, 87: insulating layer, 90: inverter circuit, 91: circuit, 101: transistor, 102: transistor, 103: transistor, 104: transistor, 105: transistor, 106: transistor, 107: transistor, 108: transistor, 109: transistor, 110: transistor, 111: transistor, 112: transistor, 115: substrate, 120: insulating layer, 130: oxide semiconductor layer, 130a: oxide semiconductor layer, 130A: oxide semiconductor film, 130b: oxide semiconductor layer, 130B: oxide semiconductor film, 130c: oxide semiconductor layer, 130C: oxide semiconductor film, 140: conductive layer, 141: conductive layer, 141a: conductive layer, 142: conductive layer, 150: conductive layer, 151: conductive layer, 152: conductive layer, 156: resist mask, 160: insulating layer, 160A: insulating film, 170: conductive layer, 171: conductive layer, 171A: conductive film, 172: conductive layer, 172A: conductive film, 173: conductive layer, 175: insulating layer, 180: insulating layer, 190: insulating layer, 231: region, 232: region, 233: region, 331: region, 332: region, 333: region, 334: region, 335: region, 901: housing, 902: housing, 903: display portion, 904: display portion, 905: microphone, 906: speaker, 907: operation key, 908: stylus, 911: housing, 912: display portion, 919: camera, 921: housing, 922: display portion, 923: keyboard, 924: pointing device, 931: housing, 932: display portion, 933: wristband, 941: housing, 942: housing, 943: display portion, 944: operation key, 945: lens, 946: joint, 951: car body, 952: wheel, 953: dashboard, 954: light, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 5100: pellet, 5100a: pellet, 5100b: pellet, 5101: ion, 5102: zinc oxide layer, 5103: particle, 5105a: pellet, 5105a1: region, 5105a2: pellet, 5105b: pellet, 5105c: pellet, 5105d: pellet, 5105d1: region, 5105e: pellet, 5120: substrate, 5130: target, 5161: region.

This application is based on Japanese Patent Application serial no. 2014-112744 filed with Japan Patent Office on May 30, 2014, the entire contents of which are hereby incorporated by reference.

The invention claimed is:

1. A semiconductor device comprising:
 a single crystal silicon substrate;
 a first transistor comprising a channel formation region in the single crystal silicon substrate, a source region and a drain region in the single crystal silicon substrate with the channel formation region located therebetween, and a gate electrode over the channel formation region;
 a second transistor over the first transistor, the second transistor comprising an oxide semiconductor layer including a channel formation region, a source electrode, and a drain electrode, wherein the source electrode and the drain electrode are in contact with the oxide semiconductor layer; and
 a contact plug penetrating one of the source electrode and the drain electrode of the second transistor and being directly connected to a part of the first transistor,
 wherein the part of the first transistor and the one of the source electrode and the drain electrode of the second transistor overlap with each other.

2. The semiconductor device according to claim 1, wherein the source electrode and the drain electrode of the second transistor cover ends of the oxide semiconductor layer of the second transistor.

3. The semiconductor device according to claim 1, wherein the part is one of the source region and the drain region of the first transistor.

4. The semiconductor device according to claim 1, wherein the part is the gate electrode of the first transistor.

5. The semiconductor device according to claim 1, further comprising:
 a first insulating layer between the first transistor and the second transistor; and
 a second insulating layer over the second transistor,
 wherein the contact plug penetrates the first insulating layer, the one of the source electrode and the drain electrode of the second transistor, and the second insulating layer so as to reach the part of the first transistor.

6. The semiconductor device according to claim 5, wherein in a depth direction from the second insulating layer to the first insulating layer, a diameter of the contact plug changes to a smaller value at an interface between the second insulating layer and the one of the source electrode and the drain electrode of the second transistor.

7. The semiconductor device according to claim 1, wherein the contact plug penetrates the oxide semiconductor layer of the second transistor.

8. The semiconductor device according to claim 1, wherein the semiconductor device includes an inverter circuit comprising the first transistor and the second transistor.

9. The semiconductor device according to claim 1, wherein the second transistor further comprises a first gate electrode under the oxide semiconductor layer and a second gate electrode over the oxide semiconductor layer.

10. The semiconductor device according to claim 1, wherein the first transistor is a p-channel transistor.

11. A semiconductor device comprising:
a single crystal silicon substrate;
a first transistor comprising a channel formation region in the single crystal silicon substrate, a source region and a drain region in the single crystal silicon substrate with the channel formation region located therebetween, and a gate electrode over the channel formation region;
a second transistor over the first transistor, the second transistor including an active layer comprising an oxide semiconductor, a source electrode, and a drain electrode; and
a contact plug penetrating one of the source electrode and the drain electrode of the second transistor and being directly connected to one of the source region and the drain region of the first transistor,
wherein the one of the source region and the drain region of the first transistor is overlapped with the one of the source electrode and the drain electrode of the second transistor.

12. The semiconductor device according to claim 11, wherein the source electrode and the drain electrode of the second transistor cover ends of the active layer of the second transistor.

13. The semiconductor device according to claim 11, further comprising:
a first insulating layer between the first transistor and the second transistor; and
a second insulating layer over the second transistor,
wherein the contact plug penetrates the first insulating layer, the one of the source electrode and the drain electrode of the second transistor, and the second insulating layer so as to reach the one of the source region and the drain region of the first transistor.

14. The semiconductor device according to claim 13, wherein in a depth direction from the second insulating layer to the first insulating layer, a diameter of the contact plug changes to a smaller value at an interface between the second insulating layer and the one of the source electrode and the drain electrode of the second transistor.

15. The semiconductor device according to claim 11, wherein the contact plug penetrates the active layer of the second transistor.

16. The semiconductor device according to claim 11, wherein the semiconductor device includes an inverter circuit comprising the first transistor and the second transistor.

17. The semiconductor device according to claim 11, wherein the second transistor further comprises a first gate electrode under the active layer and a second gate electrode over the active layer.

18. The semiconductor device according to claim 11, wherein the first transistor is a p-channel transistor.

19. A semiconductor device comprising:
a single crystal silicon substrate;
a first transistor comprising a channel formation region in the single crystal silicon substrate, a source region and a drain region in the single crystal silicon substrate with the channel formation region located therebetween, and a gate electrode over the channel formation region;
a second transistor over the first transistor, the second transistor including an active layer comprising an oxide semiconductor, a source electrode, and a drain electrode; and
a contact plug penetrating one of the source electrode and the drain electrode of the second transistor and being directly connected to the gate electrode of the first transistor,
wherein the one of the source electrode and the drain electrode of the second transistor overlaps with the gate electrode and one of the source region and the drain region of the first transistor.

20. The semiconductor device according to claim 19, wherein the source electrode and the drain electrode of the second transistor cover ends of the active layer of the second transistor.

21. The semiconductor device according to claim 19, further comprising:
a first insulating layer between the first transistor and the second transistor; and
a second insulating layer over the second transistor,
wherein the contact plug penetrates the first insulating layer, the one of the source electrode and the drain electrode of the second transistor, and the second insulating layer so as to reach the one of the source region and the drain region of the first transistor.

22. The semiconductor device according to claim 21, wherein in a depth direction from the second insulating layer to the first insulating layer, a diameter of the contact plug changes to a smaller value at an interface between the second insulating layer and the one of the source electrode and the drain electrode of the second transistor.

23. The semiconductor device according to claim 19, wherein the contact plug penetrates the active layer of the second transistor.

24. The semiconductor device according to claim 19, wherein the semiconductor device includes an inverter circuit comprising the first transistor and the second transistor.

25. The semiconductor device according to claim 19, wherein the second transistor further comprises a first gate electrode under the active layer and a second gate electrode over the active layer.

26. The semiconductor device according to claim 19, wherein the first transistor is a p-channel transistor.

* * * * *